United States Patent
Nolet et al.

(10) Patent No.: US 12,100,647 B2
(45) Date of Patent: Sep. 24, 2024

(54) ELECTRICALLY CONDUCTIVE VIAS AND METHODS FOR PRODUCING SAME

(71) Applicant: SAMTEC, INC., New Albany, IN (US)

(72) Inventors: Alan D. Nolet, Hillsborough, CA (US); Andrew Haynes Liotta, Cambridge, MA (US); Troy Benton Holland, Idaho Falls, ID (US); Thomas Jacob Hammann, Prospect, KY (US); Heidi Bates, Colorado Springs, CO (US); Daniel Goia, Flemington, NJ (US); Vishwas Vinayak Hardikar, San Diego, CA (US); Ajeet Kumar, Piscataway, NJ (US); Daniel Long, El Dorado Hills, CA (US); Nicole McGraw, Colorado Springs, CO (US); Lauren Savawn Moen, Colorado Springs, CO (US); Adam Owens, Louisville, KY (US)

(73) Assignee: SAMTEC, INC., New Albany, IN (US)

( * ) Notice: Subject to any disclaimer, the term of this patent is extended or adjusted under 35 U.S.C. 154(b) by 232 days.

(21) Appl. No.: 17/765,365

(22) PCT Filed: Sep. 30, 2020

(86) PCT No.: PCT/US2020/053363
§ 371 (c)(1),
(2) Date: Mar. 30, 2022

(87) PCT Pub. No.: WO2021/067330
PCT Pub. Date: Apr. 8, 2021

(65) Prior Publication Data
US 2023/0005834 A1    Jan. 5, 2023

Related U.S. Application Data

(60) Provisional application No. 62/908,496, filed on Sep. 30, 2019, provisional application No. 62/923,737, (Continued)

(51) Int. Cl.
*H01L 23/15* (2006.01)
*H01L 21/48* (2006.01)
(Continued)

(52) U.S. Cl.
CPC ...... *H01L 23/49866* (2013.01); *H01L 21/486* (2013.01); *H01L 23/15* (2013.01);
(Continued)

(58) Field of Classification Search
CPC . H01L 23/49866; H01L 21/486; H01L 23/15; H01L 23/49827; H05K 1/0306; H05K 1/115
(Continued)

(56) References Cited

U.S. PATENT DOCUMENTS 3,561,110 A    2/1971    Feulner et al.
4,368,106 A *  1/1983    Anthony ............... H01L 21/486
                                                     205/125
(Continued)

FOREIGN PATENT DOCUMENTS

CN    1645560 A    7/2005
CN    1853262      10/2006
(Continued)

OTHER PUBLICATIONS

Nomura et al., "Application of I-structure though-glass interconnect filled with submicron gold particles to a hermetic sealing device", Journal of Micromechanics and Microengineering, 2016, 26, 105018, 7 pages.
(Continued)

*Primary Examiner* — Timothy J Thompson
*Assistant Examiner* — Michael F McAllister
(74) *Attorney, Agent, or Firm* — BakerHostetler

(57) ABSTRACT

An electrical component is provided by metallizing holes that extend through a glass substrate. The electrical component can be fabricated by forcing a suspension of electrically conductive particles suspended in a liquid medium through the holes. The suspension can be forced into the holes under
(Continued)

an air pressure differential such as a pressure differential force, a centrifugal force, or an electrostatic force. The liquid medium in the holes can be dried, and the particles can be sintered. The particles can further be packed in the hole. Alternatively or additionally, the particles can be pressed against the outer surfaces of the substrate to produce buttons.

22 Claims, 21 Drawing Sheets

Related U.S. Application Data filed on Oct. 21, 2019, provisional application No. 63/038,496, filed on Jun. 12, 2020.

(51) Int. Cl.
- *H01L 23/498* (2006.01)
- *H05K 1/03* (2006.01)
- *H05K 1/11* (2006.01)

(52) U.S. Cl.
CPC ..... *H01L 23/49827* (2013.01); *H05K 1/0306* (2013.01); *H05K 1/115* (2013.01)

(58) Field of Classification Search
USPC ........................................................ 174/258
See application file for complete search history.

(56) References Cited

U.S. PATENT DOCUMENTS

| | | | |
|---|---|---|---|
| 4,544,577 A | 10/1985 | May | |
| 4,663,215 A | 5/1987 | Dubuisson et al. | |
| 4,954,313 A | 9/1990 | Lynch | |
| 5,029,242 A * | 7/1991 | Sammet | C03C 14/004 |
| | | | 174/257 |
| 5,260,519 A * | 11/1993 | Knickerbocker | H01L 21/486 |
| | | | 174/262 |
| 5,269,880 A | 12/1993 | Jolly et al. | |
| 5,281,684 A | 1/1994 | Moore et al. | |
| 5,514,451 A | 5/1996 | Kumar et al. | |
| 5,707,575 A * | 1/1998 | Litt | H01L 21/486 |
| | | | 264/259 |
| 5,785,879 A * | 7/1998 | Kawamura | H01L 23/49883 |
| | | | 257/E23.173 |
| 5,891,283 A | 4/1999 | Tani et al. | |
| 6,376,158 B1 * | 4/2002 | Jones | H01L 21/486 |
| | | | 430/311 |
| 6,515,237 B2 | 2/2003 | Kikuchi et al. | |
| 6,743,395 B2 | 6/2004 | Fukunaga et al. | |
| 6,852,627 B2 | 2/2005 | Sinha et al. | |
| 7,084,073 B2 | 8/2006 | Lee et al. | |
| 7,452,568 B2 | 11/2008 | Hougham et al. | |
| 7,471,384 B2 | 12/2008 | Nomaru et al. | |
| 7,569,421 B2 | 8/2009 | Do et al. | |
| 7,902,638 B2 | 3/2011 | Do et al. | |
| 7,960,841 B2 | 6/2011 | Do et al. | |
| 8,298,151 B2 | 10/2012 | Riobo et al. | |
| 8,338,957 B2 | 12/2012 | Nilsson | |
| 8,411,459 B2 | 4/2013 | Yu et al. | |
| 8,431,431 B2 | 4/2013 | Kosenko et al. | |
| 8,486,823 B2 | 7/2013 | Chiou et al. | |
| 8,492,878 B2 | 7/2013 | Farooq et al. | |
| 8,552,564 B2 | 10/2013 | Roy et al. | |
| 8,580,647 B2 | 11/2013 | Yen et al. | |
| 8,584,354 B2 | 11/2013 | Cornejo et al. | |
| 8,716,131 B2 | 5/2014 | Chen et al. | |
| 8,871,641 B2 | 10/2014 | Nilsson | |
| 8,928,151 B2 | 1/2015 | Roy et al. | |
| 8,940,627 B2 * | 1/2015 | Blanchard | H01L 25/50 |
| | | | 438/597 |
| 9,012,324 B2 | 4/2015 | Chen et al. | |
| 9,059,161 B2 * | 6/2015 | Andry | H01L 23/15 |
| 9,111,902 B2 | 8/2015 | Savastiouk et al. | |
| 9,130,016 B2 | 9/2015 | Urruti | |
| 9,184,064 B1 | 11/2015 | Mobley et al. | |
| 9,184,135 B1 * | 11/2015 | Mobley | H05K 1/09 |
| 9,215,801 B2 * | 12/2015 | Takahashi | H05K 3/0094 |
| 9,236,274 B1 * | 1/2016 | Mobley | C03C 17/06 |
| 9,337,060 B1 * | 5/2016 | Mobley | H05K 3/4038 |
| 9,374,892 B1 | 6/2016 | Mobley et al. | |
| 9,691,634 B2 | 6/2017 | Koelling | |
| 9,832,867 B2 | 11/2017 | Day et al. | |
| RE47,624 E | 10/2019 | Tang et al. | |
| 10,593,562 B2 | 3/2020 | Koelling et al. | |
| 10,727,084 B2 | 7/2020 | Koelling et al. | |
| 11,107,702 B2 | 8/2021 | Koelling et al. | |
| 2001/0033891 A1 | 10/2001 | Ami et al. | |
| 2003/0017687 A1 | 1/2003 | Hembree | |
| 2003/0105211 A1 | 6/2003 | Tsui et al. | |
| 2004/0119593 A1 | 6/2004 | Kuhns | |
| 2004/0217455 A1 * | 11/2004 | Shiono | H05K 3/426 |
| | | | 257/E23.069 |
| 2005/0054201 A1 | 3/2005 | Ramachandrarao et al. | |
| 2005/0064707 A1 | 3/2005 | Sinha | |
| 2005/0133903 A1 | 6/2005 | Palanduz | |
| 2005/0148164 A1 | 7/2005 | Casey et al. | |
| 2005/0200027 A1 | 9/2005 | Sinha et al. | |
| 2006/0255480 A1 | 11/2006 | Casey et al. | |
| 2007/0032078 A1 | 2/2007 | Casey et al. | |
| 2007/0060970 A1 | 3/2007 | Burdon et al. | |
| 2007/0113952 A1 | 5/2007 | Nair et al. | |
| 2007/0221404 A1 | 9/2007 | Das et al. | |
| 2007/0251088 A1 | 11/2007 | Susaki et al. | |
| 2008/0272465 A1 | 11/2008 | Do et al. | |
| 2009/0083977 A1 | 4/2009 | Hanke et al. | |
| 2010/0136358 A1 * | 6/2010 | Goia | C23C 26/00 |
| | | | 75/370 |
| 2011/0147071 A1 | 6/2011 | Maijala et al. | |
| 2011/0204521 A1 | 8/2011 | Wu et al. | |
| 2012/0091401 A1 | 4/2012 | Hotta | |
| 2012/0131958 A1 | 5/2012 | Shimoi et al. | |
| 2012/0235969 A1 | 9/2012 | Burns et al. | |
| 2012/0267774 A1 | 10/2012 | Ewe et al. | |
| 2012/0286416 A1 | 11/2012 | Sato et al. | |
| 2012/0313198 A1 | 12/2012 | Ittel et al. | |
| 2012/0314384 A1 * | 12/2012 | Woychik | B23K 35/24 |
| | | | 361/752 |
| 2013/0029092 A1 * | 1/2013 | Wakioka | H01L 23/15 |
| | | | 428/188 |
| 2013/0034687 A1 | 2/2013 | Koike et al. | |
| 2013/0034688 A1 | 2/2013 | Koike et al. | |
| 2013/0050226 A1 | 2/2013 | Shenoy et al. | |
| 2013/0105211 A1 | 5/2013 | Mobley | |
| 2013/0119555 A1 * | 5/2013 | Sundaram | H01L 23/15 |
| | | | 257/774 |
| 2013/0186675 A1 | 7/2013 | Takahashi et al. | |
| 2013/0277844 A1 | 10/2013 | Chiou et al. | |
| 2013/0293482 A1 | 11/2013 | Burns et al. | |
| 2013/0313687 A1 | 11/2013 | Bonkohara et al. | |
| 2013/0328214 A1 | 12/2013 | Takano | |
| 2014/0009898 A1 * | 1/2014 | Yamamoto | H01L 23/49827 |
| | | | 174/266 |
| 2014/0070148 A1 | 3/2014 | Kim et al. | |
| 2014/0104284 A1 | 4/2014 | Shenoy et al. | |
| 2014/0104288 A1 | 4/2014 | Shenoy et al. | |
| 2014/0110153 A1 | 4/2014 | Kashiwagi et al. | |
| 2014/0138846 A1 * | 5/2014 | Blanchard | H01L 21/288 |
| | | | 257/774 |
| 2014/0201994 A1 * | 7/2014 | Woychik | H01L 21/76898 |
| | | | 29/852 |
| 2014/0203448 A1 * | 7/2014 | Song | H01L 23/5384 |
| | | | 257/774 |
| 2014/0220239 A1 | 8/2014 | Labranche | |
| 2014/0306350 A1 | 10/2014 | Urruti | |
| 2014/0315345 A1 * | 10/2014 | Petkie | H10N 10/17 |
| | | | 438/54 |
| 2014/0332067 A1 | 11/2014 | Graddy et al. | |
| 2015/0014170 A1 | 1/2015 | Naisby et al. | |
| 2015/0076711 A1 * | 3/2015 | Blanchard | H01L 23/49827 |
| | | | 257/774 |

(56) References Cited

U.S. PATENT DOCUMENTS

| | | |
|---|---|---|
| 2015/0181766 A1 | 6/2015 | Lu et al. |
| 2015/0194546 A1 | 7/2015 | Sun |
| 2016/0059359 A1 | 3/2016 | Krueger et al. |
| 2016/0128201 A1 | 5/2016 | Ciufo et al. |
| 2016/0163890 A1 | 6/2016 | Yeh et al. |
| 2016/0163891 A1 | 6/2016 | Yeh et al. |
| 2016/0163892 A1 | 6/2016 | Yeh et al. |
| 2016/0163893 A1 | 6/2016 | Yeh et al. |
| 2016/0163894 A1 | 6/2016 | Yeh et al. |
| 2016/0163895 A1 | 6/2016 | Yeh et al. |
| 2016/0181217 A1 | 6/2016 | Prack |
| 2016/0218056 A1 | 7/2016 | Lu et al. |
| 2016/0218095 A1 | 7/2016 | Sugizaki |
| 2016/0293451 A1 | 10/2016 | Koelling |
| 2016/0347643 A1 | 12/2016 | Yamauchi et al. |
| 2017/0250132 A1 * | 8/2017 | Mohammed ...... H01L 23/53223 |
| 2018/0144951 A1 | 5/2018 | Koelling et al. |
| 2018/0344245 A1 | 12/2018 | Knickerbocker et al. |
| 2019/0239353 A1 | 8/2019 | Jayaraman |
| 2019/0304877 A1 | 10/2019 | Mobley et al. |
| 2019/0322572 A1 | 10/2019 | Mobley et al. |
| 2019/0326130 A1 | 10/2019 | Mobley et al. |

FOREIGN PATENT DOCUMENTS

| | | |
|---|---|---|
| CN | 101176203 A | 5/2008 |
| CN | 102412197 A | 4/2012 |
| CN | 102453374 A | 5/2012 |
| CN | 102870167 A | 1/2013 |
| CN | 102915949 X | 2/2013 |
| CN | 103262174 A | 8/2013 |
| CN | 103430240 A | 12/2013 |
| CN | 102017818 B | 7/2014 |
| CN | 104332447 A | 2/2015 |
| CN | 105679406 A | 6/2016 |
| CN | 106683738 A | 5/2017 |
| EP | 1419990 A2 | 5/2004 |
| JP | 06-021655 A | 1/1994 |
| JP | 06-188561 A | 7/1994 |
| JP | 2006-147971 A | 6/2006 |
| JP | 2010-221573 A | 10/2010 |
| JP | 2011-178642 A | 9/2011 |
| JP | 2013-165265 A | 8/2013 |
| JP | 5554838 B2 | 7/2014 |
| JP | 2014-207452 A | 10/2014 |
| JP | 2018-163986 A | 10/2018 |
| KR | 10-1168719 B1 | 7/2012 |
| SU | 1621192 A1 | 1/1991 |
| TW | 200524102 A | 7/2005 |
| TW | 200739610 A | 10/2007 |
| TW | 201317622 A | 5/2013 |
| TW | 201344844 A | 11/2013 |
| TW | 201511037 A | 3/2015 |
| TW | 201627368 A | 8/2016 |
| WO | 88/05959 A1 | 8/1988 |
| WO | 2009/153728 A1 | 12/2009 |
| WO | 2011/090215 A1 | 7/2011 |
| WO | 2012/061304 A1 | 5/2012 |
| WO | 2012/078335 A2 | 6/2012 |
| WO | 2012/125481 A2 | 9/2012 |
| WO | 2013/033124 A1 | 3/2013 |
| WO | 2013/138452 A1 | 9/2013 |
| WO | 2014/038326 A1 | 3/2014 |
| WO | 2014/062310 A2 | 4/2014 |
| WO | 2014/062311 A2 | 4/2014 |
| WO | 2016/051781 A1 | 4/2016 |
| WO | 2016/161434 A1 | 10/2016 |
| WO | 2018/094162 A1 | 5/2018 |

OTHER PUBLICATIONS

Toshinori, "Developments of Sub-micron Au Particle Bonding", Tanaka Kikinzoku Kogyo K.K., 2-73, Shinmachi, Hiratsuka, Kanagawa 254-0076, Japan, Feb. 22, 2016, 19 pages.

Zhou et al., Mechanics Modelling and Numerical Simulation of Metal Power Forming Process, published Feb. 28, 2011, pp. 221.

\* cited by examiner

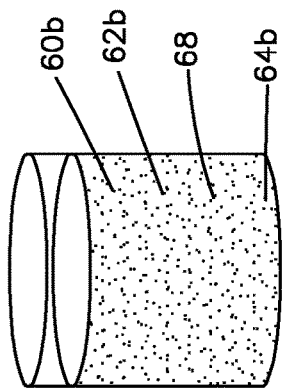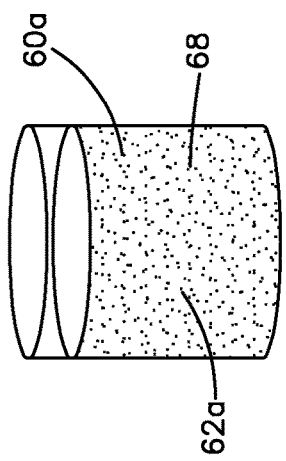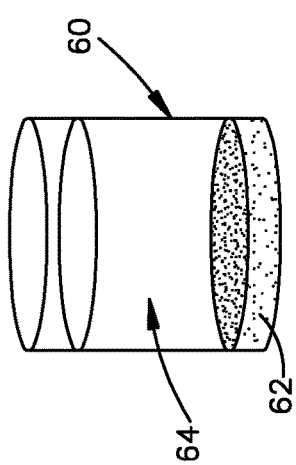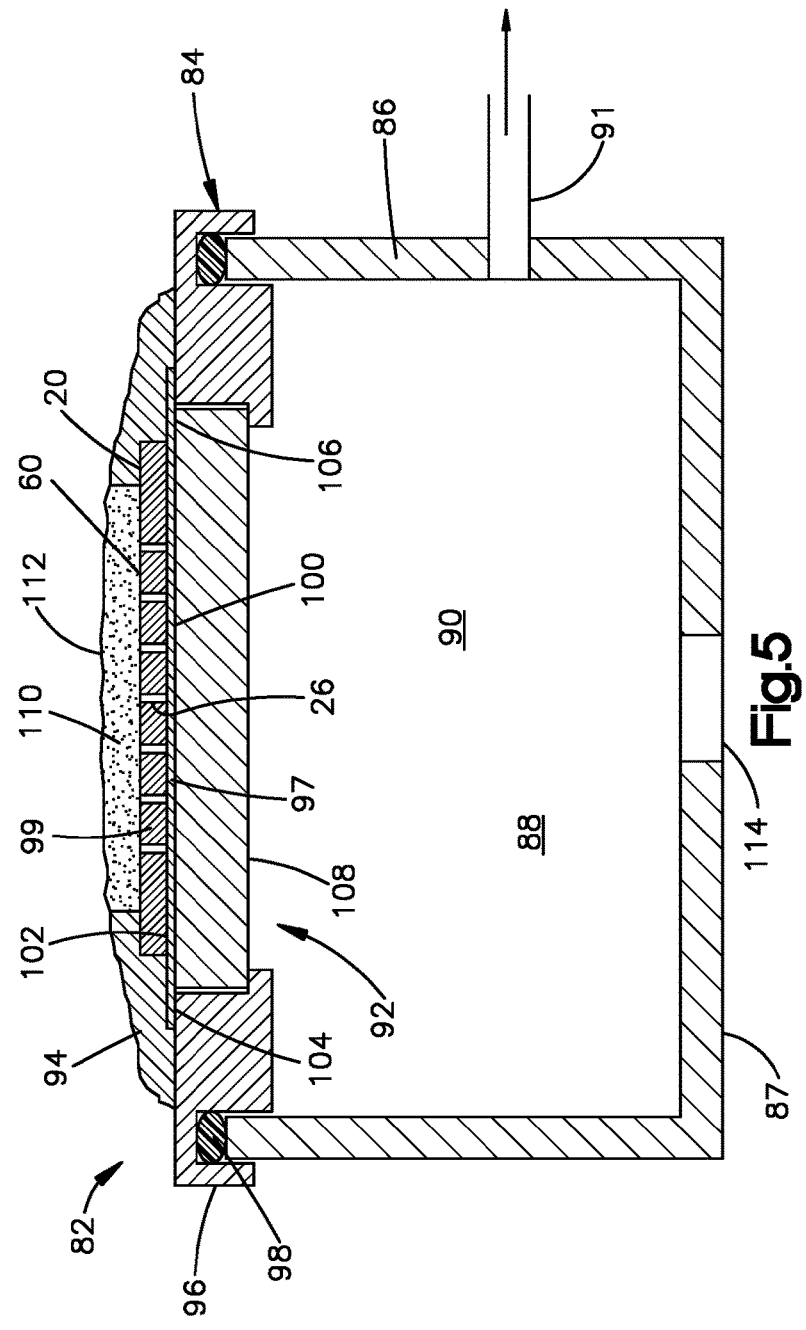

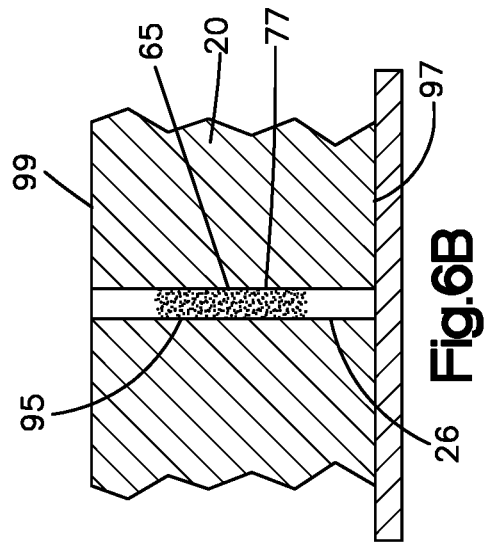
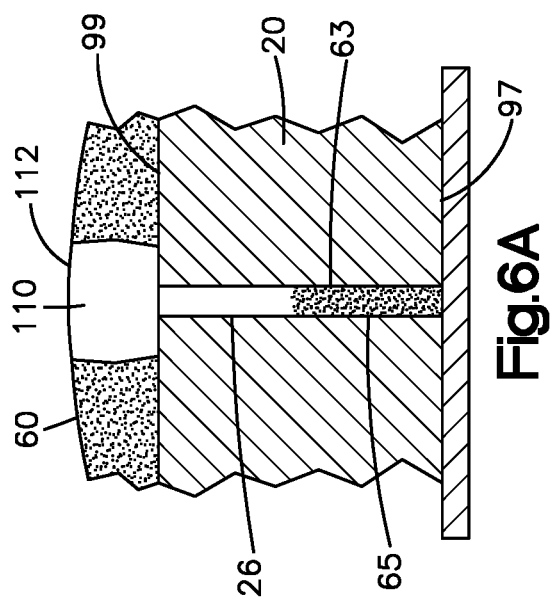
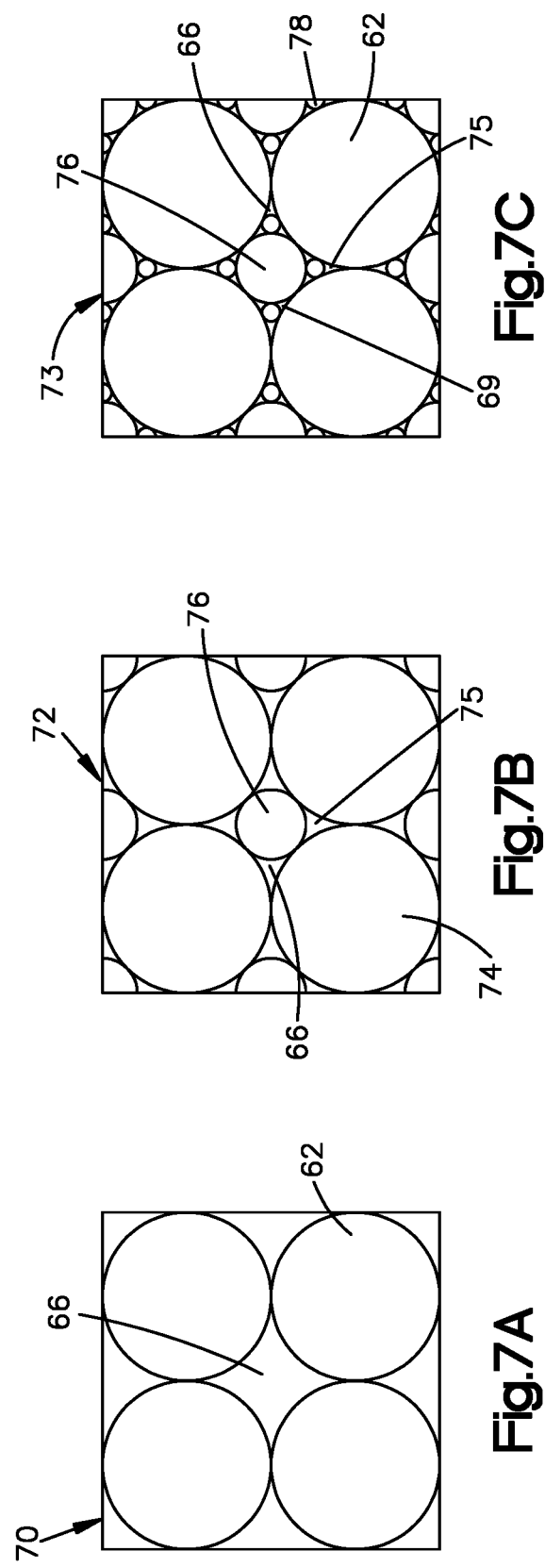

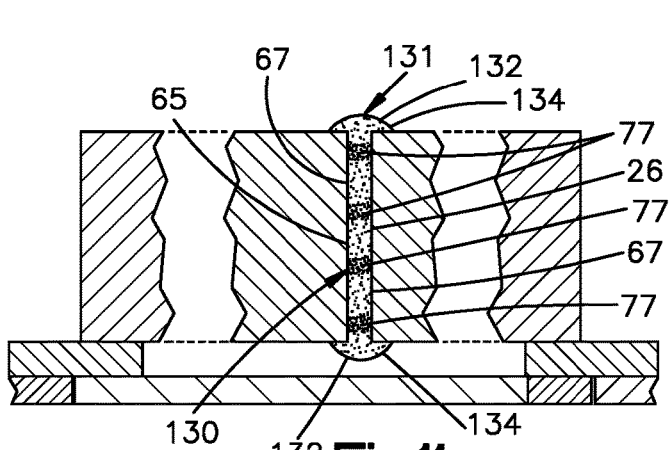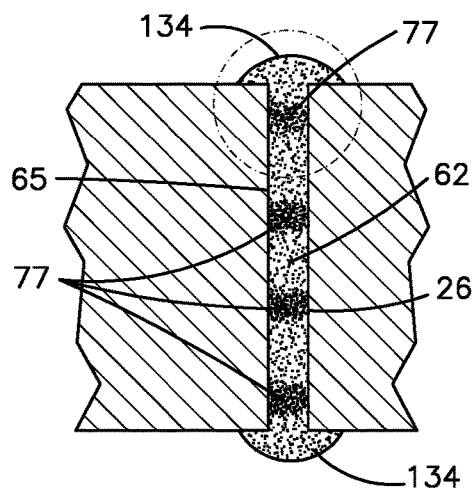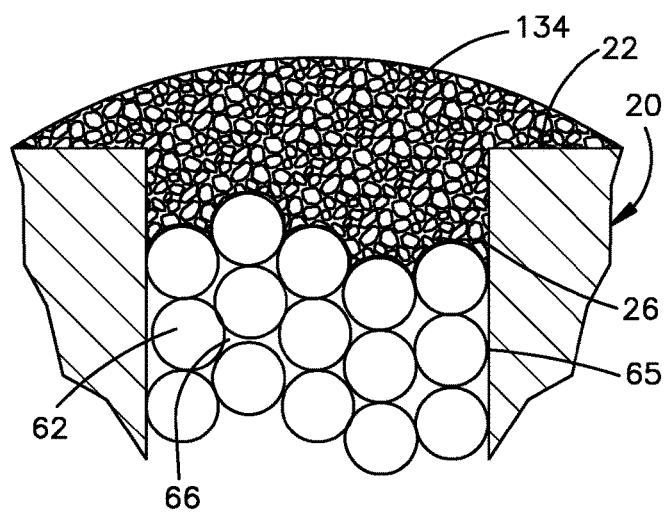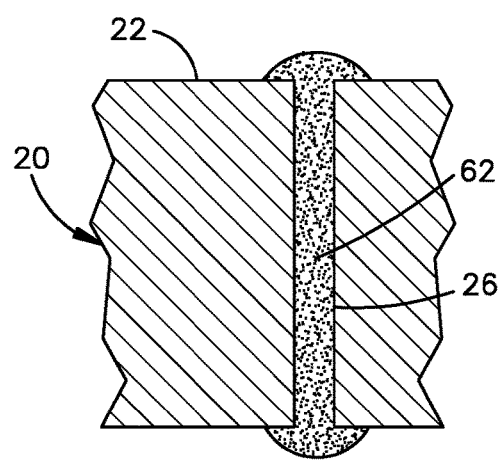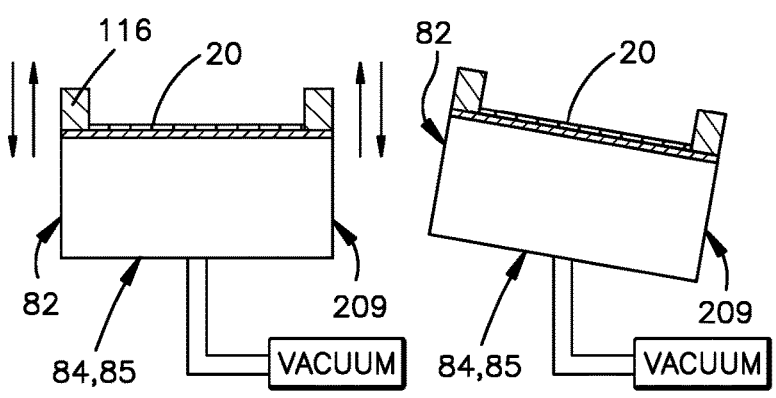

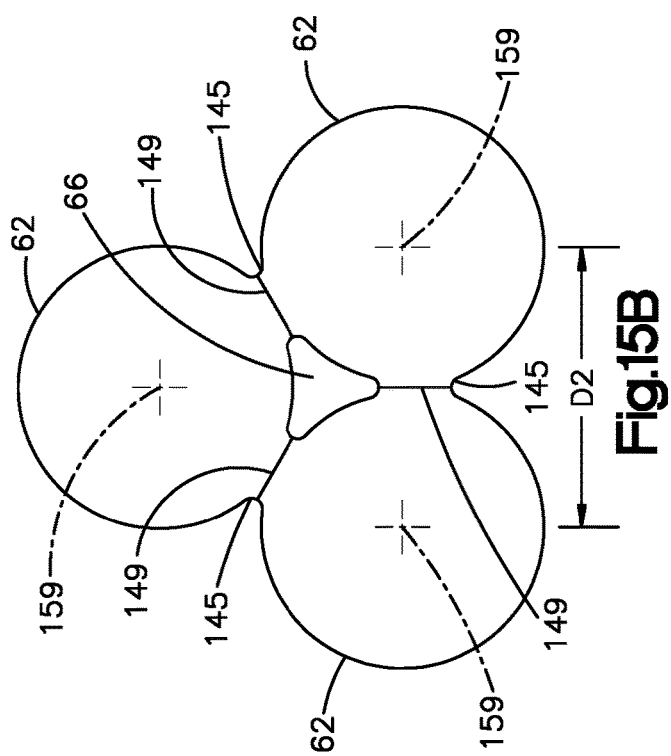
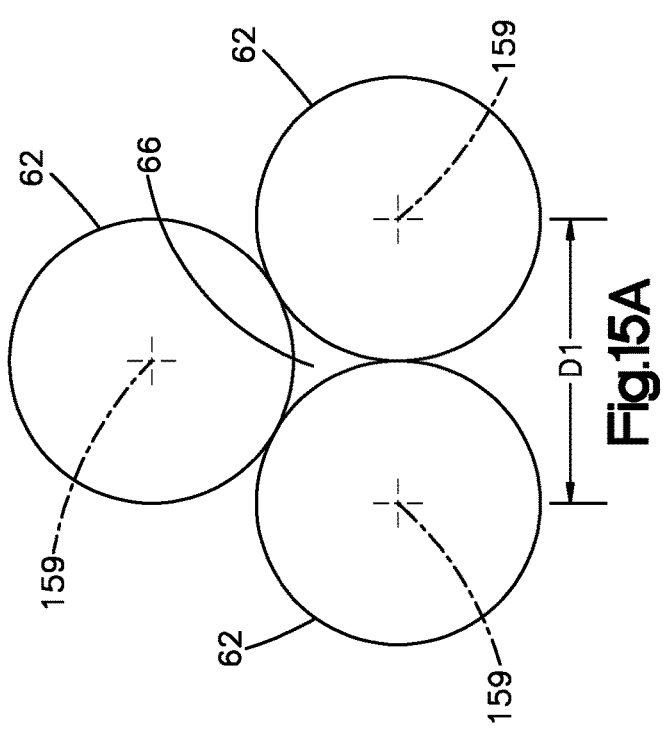
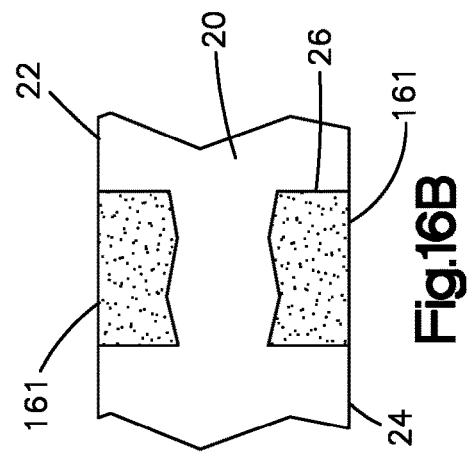
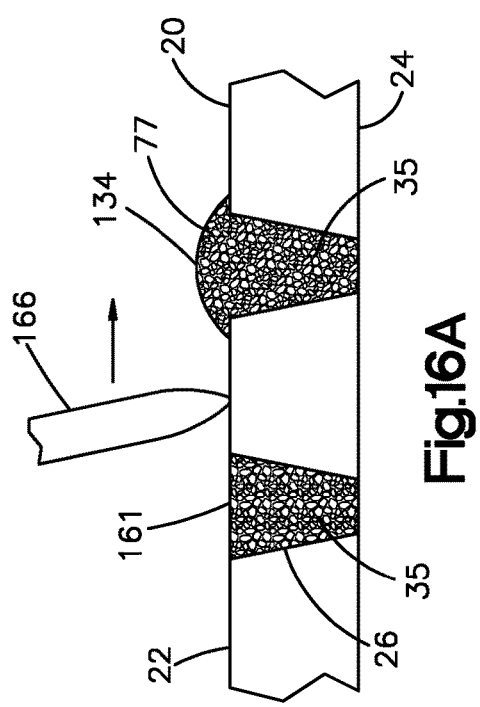

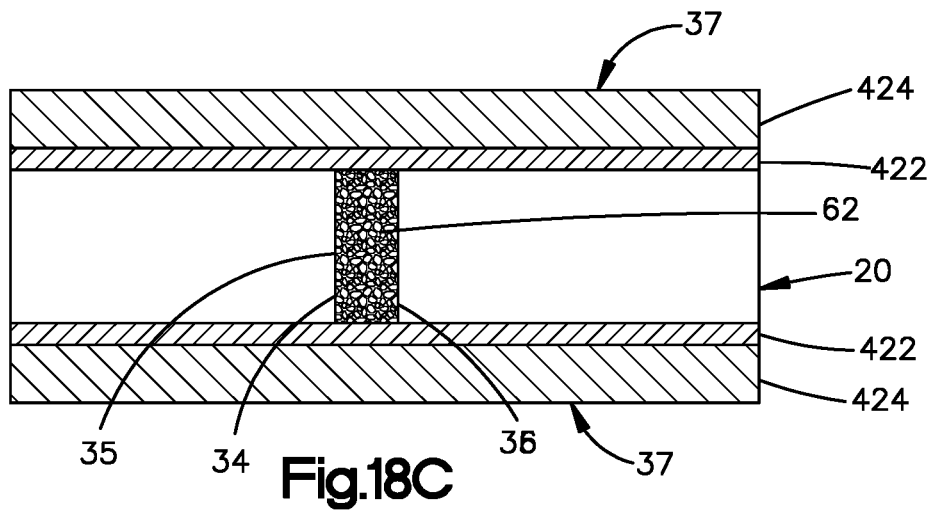
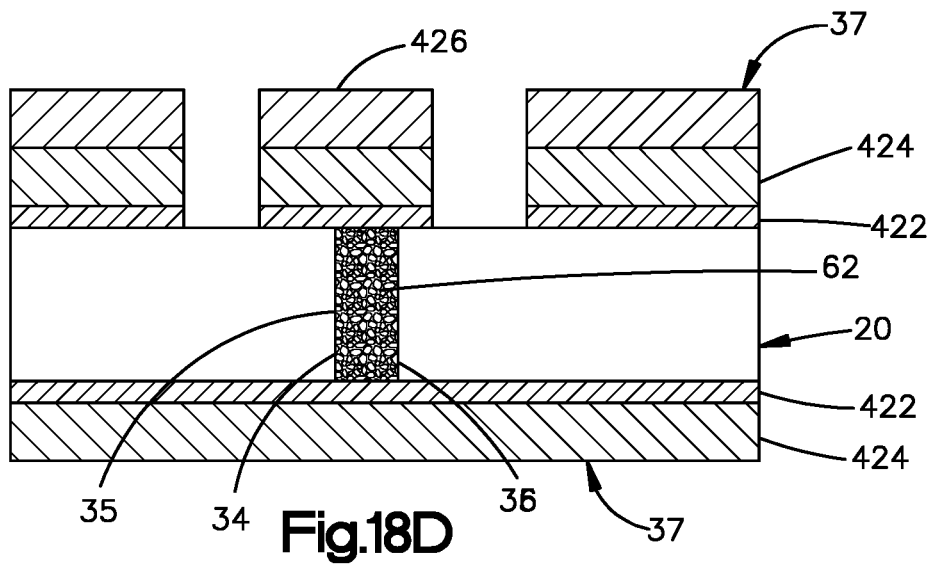
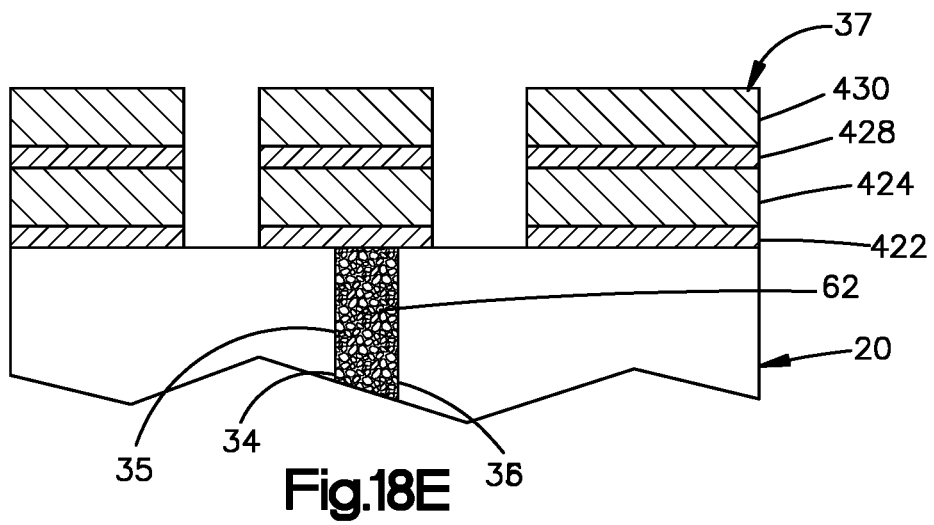

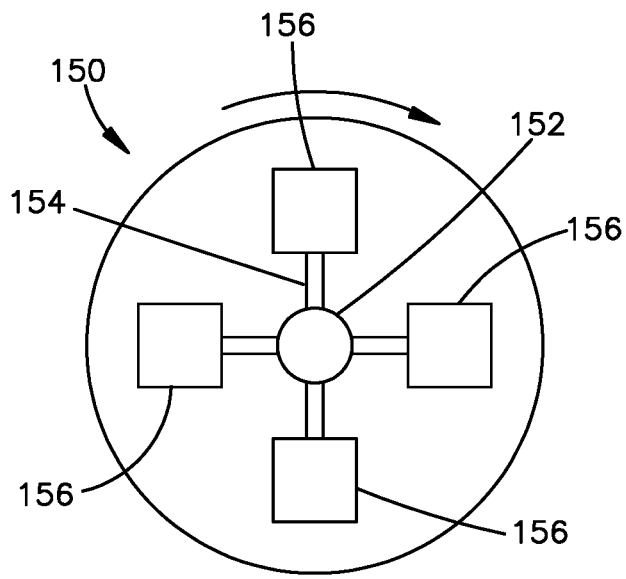
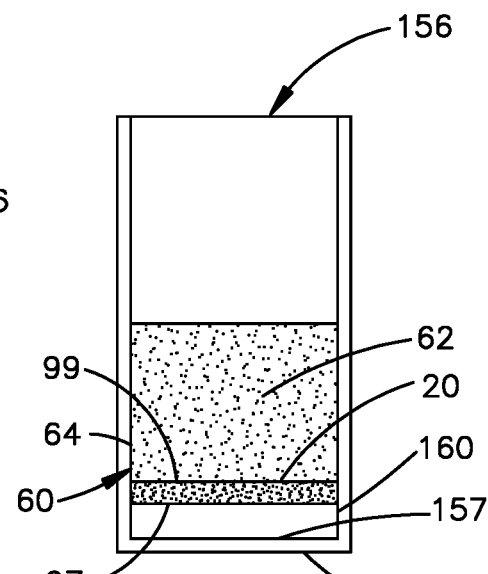
Fig.19A   Fig.19B
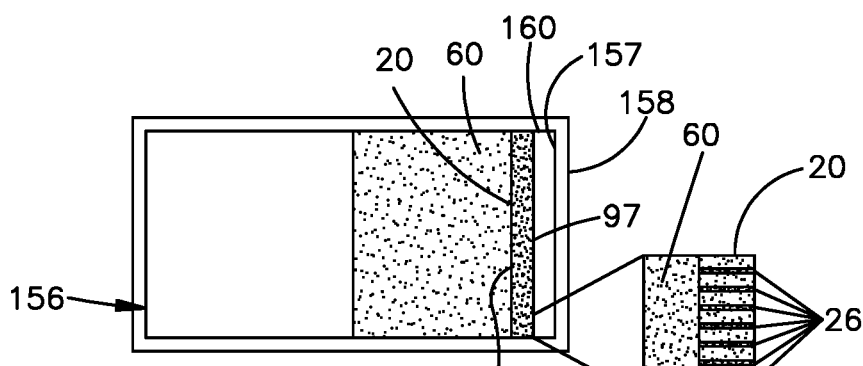
Fig.19C
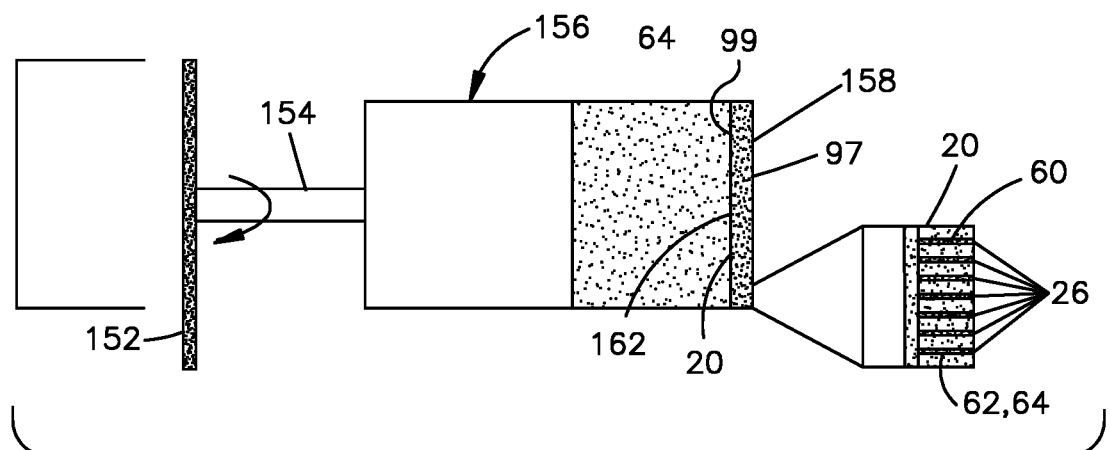
Fig.19D

ELECTRICALLY CONDUCTIVE VIAS AND METHODS FOR PRODUCING SAME

CROSS-REFERENCE TO RELATED APPLICATIONS

This application is the National Stage Application of International Patent Application No. PCT/US2020/053363, filed Sep. 30, 2020, which claims priority to U.S. Patent Application Ser. No. 62/908,496 filed Sep. 30, 2019, U.S. Patent Application Ser. No. 62/923,737 filed Oct. 21, 2019, and U.S. Patent Application Ser. No. 63/038,496 filed Jun. 12, 2020, the disclosure of each of which is hereby incorporated by reference in its entirety herein.

BACKGROUND 2.5-D and 3-D packaging is a novel implementation of an already well-established concept that previously was referred to as MCMs (multichip modules). A thin glass, silicon or other dielectric substrate material is created having a plurality of holes or vias that are metalized in such a manner as to create an electrical path. The integrated circuit packaging industry refers to these interconnection substrates as interposers. Holes fabricated into the interposer are typically very small, for example, 5 µm to 100 µm in diameter and 50 µm to 500 µm in depth. The number of holes per square centimeter may be in the hundreds or even thousands. Following the processing necessary to fabricate these holes the next step is to metalize the hole to provide for an electrically conductive pathway from one circuit plane or substrate to another.

Current state of the art processes known as "copper electroplate" methods for metalizing interposer through and blind holes are very costly and generally lack manufacturing scalability. The metallization methods include a combination of Physical Vapor Deposition (PVD) or evaporative or sputtering deposition to form an adhesion/barrier/and or seed layer followed by electroplating, typically of copper. The equipment necessary to run these processes is expensive and difficult to scale to high-throughput manufacturing. For instance, the copper electroplating process can typically take 1 to 8 hours for each substrate, depending on substrate size, hole diameter and aspect ratio. The electroplating process requires each substrate to be electroplated in an individual process cell having sophisticated analytical and dispensing controls and precise chemical species and electrical field distribution across the substrate.

Electroplated copper deposits extending beyond the surface of the substrate are referred to in the art as "over burden." To level the copper electroplated deposit flush or planar with the substrate surface typically requires a secondary process using chemical-mechanical polishing (CMP). Maintenance and operation of the CMP process requires highly skilled technicians for monitoring and control to achieve consistent results. Copper is a relatively soft metal and methods used to mechanically remove the excess copper are constrained by the loading of the soft copper into the abrasive material.

A second method of depositing copper or other electrically conductive materials into via holes in interposer substrates utilizes metallic inks. The metallic inks typically are formulated using metal powder dispersed in a bonding resin or other polymer for ease of hole filling and a capping agent to prevent the metallic powder from oxidizing. After the holes are filled with the metallic ink along with the resin or capping agents it is necessary to volatize all organic materials and remove them from the metallic powder to achieve reasonable electrical conductivity. Temperatures required for volatizing these organic compounds may reach 400 C to 800 C. The carbon ash left after volatizing the organic compounds may negatively impact optimal conductivity and leave significant potential for discontinuous filling of the hole. The potential for discontinuous or electrically open areas in the filled hole or via is unacceptable.

Most of these processes work only on a very limited hole length/width ratio, and narrow or extra wide holes are very difficult to manufacture in a consistent manner.

SUMMARY

According to one example of the present disclosure, an electrical component can include a substrate that defines a first surface and a second surface opposite the first surface, and an electrically conductive via that extends from the first surface to the second surface, such that the first and second surfaces define respective first and second openings to the hole. The electrical component can further include an electrically conductive fill that extends in the hole from the first surface to the second surface, wherein the electrically conductive fill defines an electrically conductive path from the first surface to the second surface.

BRIEF DESCRIPTION OF THE DRAWINGS

The foregoing summary, as well as the following detailed description of illustrative embodiments of the present application, will be better understood when read in conjunction with the appended drawings. For the purposes of illustrating the locking structures of the present application, there is shown in the drawings illustrative embodiments. It should be understood, however, that the application is not limited to the precise arrangements and instrumentalities shown. In the drawings:

FIG. 4A is a perspective view of a suspension of electrically conductive particles in a liquid medium;

FIG. 4B is a perspective view of the suspension after agitation;

FIG. 4C is a perspective view of a second suspension;

FIG. 5 is a schematic sectional view of a vacuum fill apparatus configured to drive the suspension into the holes of the substrate;

FIG. 6A is a schematic side elevation view of a portion of the substrate illustrated in FIG. 1B, shown after a first fill operation using the vacuum fill apparatus illustrated in FIG. 5, so as to produce a first electrically conductive fill in one of the holes;

FIG. 6B is a schematic side elevation view of the portion of the substrate illustrated in FIG. 6A, after a pressing operation has increased the packing density of the first electrically conductive fill;

FIG. 7A is a schematic view the particles of the suspension illustrated in FIGS. 4A-4B, shown including substantially monosized electrically conductive particles;

FIG. 7B is a schematic sectional view of the particles of the suspension illustrated in FIGS. 4A-4B, shown including a bimodal distribution of small and large particles in accordance with an alternative embodiment;

FIG. 7C is a schematic sectional view of the particles of the suspension illustrated in FIGS. 4A-4B, shown including a trimodal distribution of small particles, large particles, and midsize particles;

FIG. 11 is a schematic sectional side view of the substrate illustrated in FIG. 9C, shown filled by the vacuum fill apparatus;

FIG. 12A is a schematic sectional side elevation view of the substrate illustrated in FIG. 11, shown after a plurality of sequences of filling, drying, and pressing operations, and shown with the hole filled with a final fill suspension of small particles;

FIG. 12B is an enlarged schematic sectional side elevation view of the substrate illustrated in FIG. 12A, shown after pressing the small particles;

FIG. 12C is an enlarged schematic sectional side elevation view of the substrate illustrated in FIG. 12A, showing a filled hole in accordance with another example;

FIGS. 13A-C show a method of delivering the suspension to holes of the substrate during a filling operation in one example, whereby;

FIG. 13A shows the substrate in an initial angular orientation;

FIG. 13B shows the substrate in a first angular orientation different than the initial angular orientation;

FIG. 13C shows the substrate in a second angular orientation opposite the first angular orientation;

FIG. 15A is a schematic side view of adjacent ones of the particles in the hole after pressing and prior to sintering;

FIG. 15B is a schematic side view of adjacent ones of the particles in the hole after sintering;

FIG. 16A is a schematic side view of the substrate illustrated in FIG. 14, but after sintering, showing a surface finishing operation;

FIG. 16B is a schematic side view of the substrate illustrated in FIG. 16A, shown hermetically sealed after the surface finishing operation;

FIG. 18C is a schematic view of the substrate having an electrically conductive redistribution layer constructed in accordance with another embodiment;

FIG. 18D is a schematic view of the substrate having an electrically conductive redistribution layer constructed with in accordance with yet another embodiment;

FIG. 18E is a schematic view of the substrate having an electrically conductive redistribution layer constructed in accordance with still another embodiment;

FIG. 19A is a schematic top plan view of a centrifuge used to fill the hole in accordance with an alternative embodiment, shown having a plurality of rotatable buckets;

FIG. 19B is a schematic side elevation view of the substrate illustrated in FIG. 1A shown placed into one of the buckets and covered with a suspension of electrically conductive particles;

FIG. 19C is a schematic side view of the bucket illustrated in FIG. 19B, showing the bucket oriented during spinning of the centrifuge;

FIG. 19D is a schematic side view of the bucket illustrated in FIG. 19C, shown after centrifugal forces have forced the electrically conductive particles into the holes of the substrate;

DETAILED DESCRIPTION

Figure 1A:
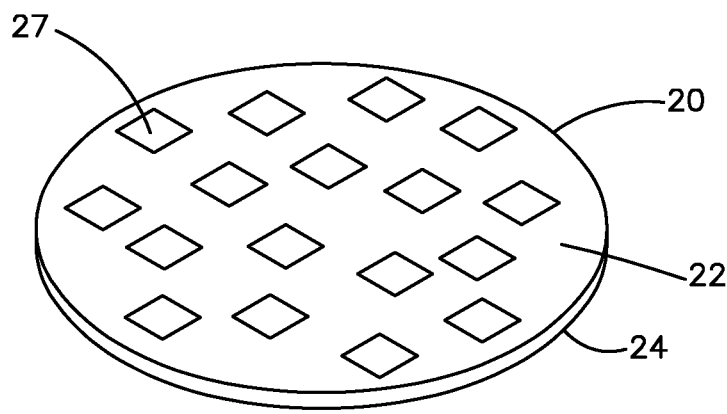
FIG. 1A is a perspective view of a substrate having a plurality of hole arrays that each define a respective plurality of holes.

One or more different disclosures may be described in the present application. Further, for one or more of the disclosures described herein, numerous alternative embodiments may be described; it should be appreciated that these are presented for illustrative purposes only and are not limiting of the disclosures contained herein or the claims presented herein in any way. One or more of the disclosures may be widely applicable to numerous embodiments, as may be readily apparent from the disclosure. In general, embodiments are described in sufficient detail to enable those skilled in the art to practice one or more of the disclosures, and it should be appreciated that other embodiments may be utilized and that structural, logical, software, electrical and other changes may be made without departing from the scope of the particular disclosures. Accordingly, one skilled in the art will recognize that one or more of the disclosures may be practiced with various modifications and alterations. Particular features of one or more of the disclosures described herein may be described with reference to one or more particular embodiments or figures that form a part of the present disclosure, and in which are shown, by way of illustration, specific embodiments of one or more of the disclosures. It should be appreciated, however, that such features are not limited to usage in the one or more particular embodiments or figures with reference to which they are described. The present disclosure is neither a literal description of all embodiments of one or more of the disclosures nor a listing of features of one or more of the disclosures that must be present in all embodiments.

A description of an embodiment with several components in communication with each other does not imply that all such components are required. To the contrary, a variety of optional components may be described to illustrate a wide variety of possible embodiments of one or more of the disclosures and in order to more fully illustrate one or more aspects of the disclosures. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Further still, some steps illustrated in a method can be omitted. Moreover, the illustration of a process by its depiction in a drawing does not imply that the illustrated process is exclusive of other variations and modifications thereto, does not imply that the illustrated process or any of its steps are necessary to one or more of the disclosure(s), and does not imply that the illustrated process is preferred. Also, steps are generally described once per embodiment, but this does not mean they must occur once, or that they may only occur once each time a process, method, or algorithm is carried out or executed. Some steps may be omitted in some embodiments or some occurrences, or some steps may be executed more than once in a given embodiment or occurrence. Further, some of the steps can be eliminated in some embodiments. Further still, other steps can be added as desired.

Techniques and mechanisms described or referenced herein will sometimes be described in singular form for clarity. However, it should be appreciated that particular embodiments may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of embodiments of the present disclosure in which, for example, functions may be executed out of order from that shown or discussed, including substantially concurrently or in reverse order, depending on the functionality involved, as would be understood by those having ordinary skill in the art.

Figure 1B:
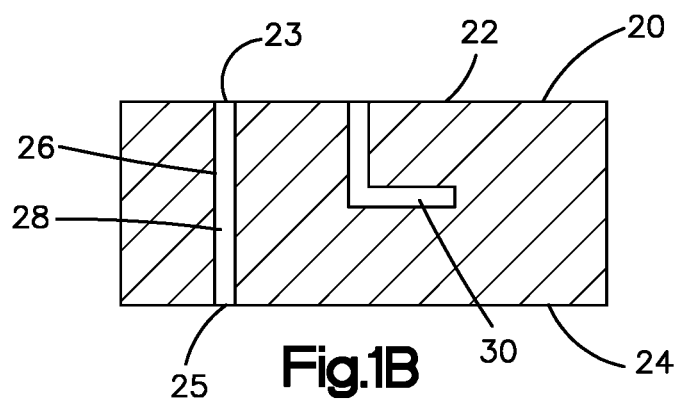
FIG. 1B is a schematic sectional side elevation view of a portion of the substrate illustrated in FIG. 1A, showing a through hole and a blind hole.

With initial reference to FIGS. 1A-1B, a substrate 20 defines opposed outer surfaces including a first surface 22 and a second surface 24 opposite the first surface along a direction. The substrate 20 further includes a plurality of internal surfaces 29 (see FIG. 21B) that define a respective plurality of holes 26. The holes 26 extend from the first surface 22 toward the second surface 24 along a central axis.

For instance, the holes can extend from the first surface 22 to the second surface 24 along the central axis. The substrate 20 can be cut into wafers of 150 mm, 200 mm, or 300 mm in diameter, but it is recognized that the substrate 20 can define any suitable diameter or other maximum dimension as desired. Thus, the term "diameter" can be used interchangeably with the term "maximum cross-sectional dimension" to denote that the structure of reference need not be circular unless otherwise indicated.

The holes 26 can have any suitable diameter as desired. For instance, the holes 26 can have a diameter or other cross-sectional dimension that range from 10 μm to 25 μm. The holes 26 can have a depth along their respective central axes within a range from 100 μm to 500 μm. The diameter requirements have no upper limit. The aspect ratio between hole diameter and hole depth are unlimited for this process. Additionally, a plurality of different hole diameters may be placed in the same substrate. The holes 26 can be conical in shape, cylindrical in shape, hourglass shaped, or can define any suitable shape along their length. The holes 26 can be arranged in one or more hole arrays 27 as desired. Thus, the substrate 20 can define one or more arrays 27 spaced with each other at any suitable distance suitable for cutting the glass and separating the arrays into 27 discrete components of the substrate 20. While glass substrates can have particular applicability to certain end-use applications, it should be appreciated that substrate 20 can be a glass substrate, a silicon substrate, a ceramic substrate, a sapphire substrate, or any organic substrate or any other substrate of any suitable alternative material as desired. When the substrate 20 is a glass substrate, the glass can be substantially lead-free, including lead-free, in one example. In other examples, the glass can include lead.

The term substantially "lead-free," derivatives thereof, and phrases of like import as used herein can refer a quantity of lead is in accordance with the Restriction of Hazardous Substances Directive (RoHS) specifications. In one example, the term "lead-free," "free of lead," and derivatives thereof can mean that means that the quantity of lead is less than 0.1% by weight, including 0% by weight. Alternatively or additionally, the term "lead-free," derivatives thereof, and phrases of like import as used herein can mean that the quantity of lead is less than 0.1% by volume. In another example, the term "lead-free," derivatives thereof, and phrases of like import as used herein can mean that the quantity of lead is less than 100 parts per million (ppm).

At least one or more of the holes 26 can be configured as a through hole 28 that extends through the substrate 20 from the first surface 22 to the second surface 24. Thus, the first surface 22 defines a first opening 23 to the through hole 28, and the second surface 24 defines a second opening 25 to the through hole 28. Otherwise stated, the through hole 28 defines a first end at the first opening 23, and a second end at the second opening 25. Thus, both the first and second ends of the through holes 28 are open to the outer perimeter of the substrate 20. The through hole 28 can be straight and linear from the first opening 23 to the second opening 25. Alternatively, one or more portions of the through hole 28 can be angled, bent, or define any suitable alternative non-straight shape.

Alternatively or additionally, at least one or more of the holes 26 can be configured as a blind hole 30 that can extend from one of the first and second surfaces 22 and 24 toward the other one of the first and second surfaces 22 and 24. Further, the blind hole can terminate at a location spaced from the other of the first and second surfaces and 22 and 24. Thus, the blind hole 30 is open to one surface of the substrate 20 at a first end, and internally closed by the substrate 20 at a second end opposite the first end. Otherwise stated, the first terminal end of the blind hole 30 extends to one of the first and second openings 23 and 25 at the first and second surfaces 22 and 24, respectively, and the second terminal end of the blind hole 30 is disposed between the first and second surfaces 22 and 24. It is recognized, however, that the second terminal end of the blind hole 30 can terminate at another hole 26, and thus can be in fluid communication with both the first and second openings 23 and 25. Further, the blind hole 30 can be linear, or can have one or more segments that are angled with respect to each other. One or more of the segments can include a lateral component. The substrate 20 can include a sacrificial hole that extends from the blind hole 30 to an outer surface of the substrate 20. For instance, when the blind hole 30 is open, either directly or through another hole, to the first surface 22 of the substrate 20, the sacrificial hole can extend from the closed end of the blind hole 30 to the second surface 24.

Figure 2A:
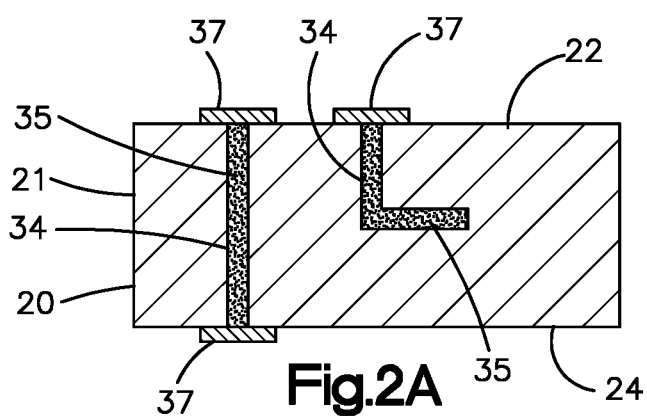
FIG. 2A is a schematic sectional side elevation view similar to FIG. 1, but showing the holes including an electrically conductive fill so as to define electrically conductive vias, and electrically conductive redistribution layers over the vias.
Figure 2B:
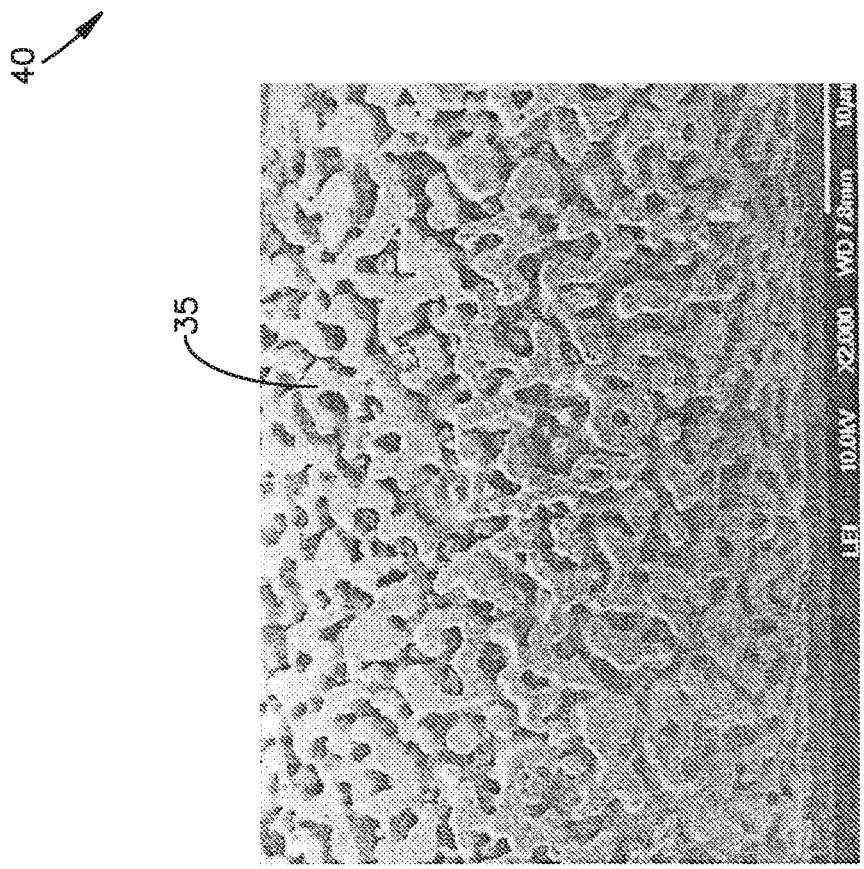
FIG. 2B is a SEM micrograph of one of the vias illustrated in FIG. 2A.

Referring now to FIGS. 2A-2B, in accordance with one example, one or more up to all of the holes 26 can be contain an electrically conductive material so as to define an electrically conductive via 34. In one example, the electrically conductive material can include an electrically conductive fill 35 that is disposed in the respective one or more up to all of the holes 26. Thus, the electrically conductive fill 35 can at least partially define the electrically conductive via 34. As will be appreciated from the description below, additional electrically conductive materials can be disposed in the hole 26 so as to further define the electrically conductive via 34. The hole arrays 27 including the electrically conductive material illustrated in FIGS. 2A-2B can thus define via arrays. In this regard, it will be appreciated that the substrate 20 having electrically conductive vias 34 can be referred to as an electrical component.

In particular, the through hole 28 that contains the electrically conductive fill 35 can be said to define a through via 36. The buried hole 30 that contains the electrically conductive fill 35 can be said to define a buried via 39. Thus, the term "via" and derivatives thereof as used herein can refer to one or both of the through via 36 and the buried via 39. The electrically conductive fill 35 can extend continuously from the first end of the via 34 to the second end of the via 34. Thus, the electrically conductive fill 35 can define an electrically conductive path along the via 34 in the direction that extends between first end of the via and to the second end of the via. For instance, the electrically conductive path can be defined from the first end of the via 34 to the second end of the via 34. In this regard, it is appreciated that the first and second ends of the via 34 can be defined by the first and second openings 23 and 25 when the via 34 is a through via 36. As will be appreciated from the description below, in some examples the fill 35 can include only the electrically conductive material, and air 41. The air 41 can include one or both of ambient air and an inert gas. For instance, the air 41 can be partial or pure argon. In another example, the air 41 can be pure nitrogen.

Further, in some examples, at least 50% of the via by volume can include only the fill 35. For instance, in some examples, from 50% up to 100% of the via by volume can include only the fill 35. In particular, in some examples, from 75% up to 100% of the via by volume can include only the fill 35. For instance, from 90% up to 100% of the via by volume can include only the fill 35. In particular, from 95% up to 100% of the via by volume can include only the fill 35.

The substrate 20 can include at least one or more electrically conductive redistribution layers 37. The redistribution layers can be applied to one or both of the first surface 22 and the second surface 24. The redistribution layers 37 extend over at least one of the electrically conductive vias 34, and are thus in electrical communication with the electrically conductive fill 35. In one example, the substrate 20 can be configured as an electrical interposer configured to make electrical connections at each of the first surface 22 and the second surface 24 at electrical contacts that are in electrical communication with each other through the electrically conductive via 34.

The electrically conductive fill 35 can be defined by any suitable highly conductive electrically conductive material as desired so as to create the electrically conductive via 34. As will be described in more detail below, the electrically conductive material can be defined by sintered particles of the electrically conductive material. In one example, the electrically conductive material can be metallic. For instance, the electrically conductive material can be copper, gold, silver, aluminum, or any suitable alternative metal or alloys thereof or other combinations thereof. Thus, the electrically conductive material can include a copper alloy. Alternatively or additionally, the electrically conductive material can include a silver alloy. Alternatively or additionally, the electrically conductive material can include a gold alloy. Accordingly, in certain examples, the electrically conductive vias 34 can be referred to as metallized vias 34. Similarly, the substrate 20 can be referred to as a metallized substrate. In one example, the electrically conductive material can include silver coated copper.

Alternatively, the electrically conductive material can be non-metallic, for instance an electrically conductive polymer. The electrically conductive material can further include any suitable metal or electrically conductive polymer coated onto particles of any suitable different metal or nonmetal, which can be electrically conductive or electrically nonconductive. As will be appreciated from the description below, the electrically conductive vias 34 can be suitable for conducting both direct current (DC) and radiofrequency (RF) current. The electrically conductive fill 35 can extend in the via 34 from the first end of the via to the second end of the via, such that the electrically conductive material defines an electrically conductive path from the first end to the second end. Thus, when the via 34 is a through via 36, the electrically conductive fill 35 can define an electrically conductive path substantially from the first surface 22 of the substrate 20 substantially to the second surface 24.

Figure 3:
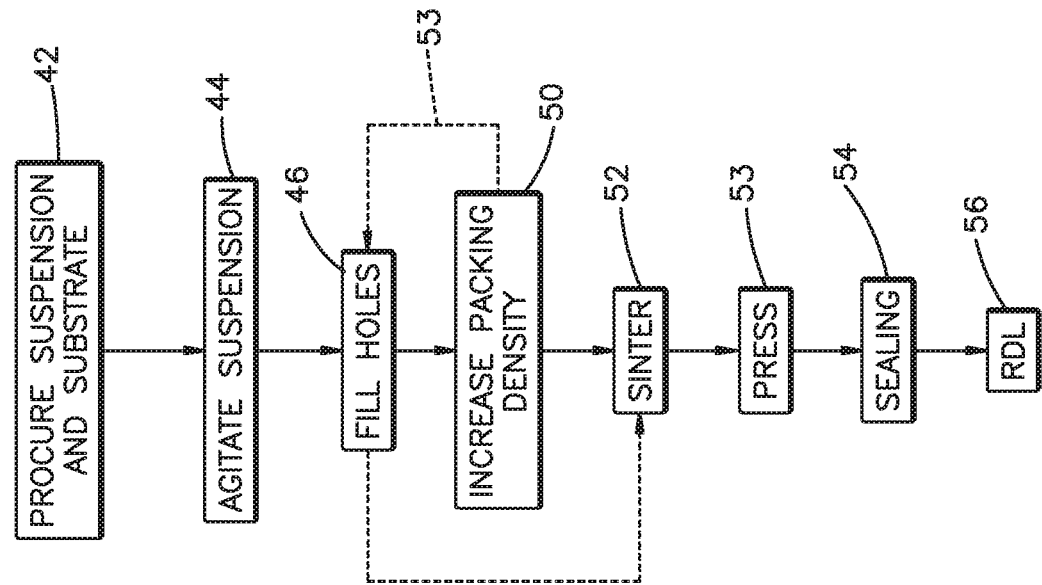
FIG. 3 is a flow chart illustrating the method steps of a method for electrically conductively filling the holes illustrated in FIG. 1B to produce the electrically conductive vias illustrated in FIG. 2A.

Referring now to FIG. 3, a method 40 is provided for electrically conductively filling the holes 26 with the electrically conductive fill 35 to thereby create the electrically conductive vias 34. The method begins at step 42, whereby the substrate 20 and at least one suspension 60 of particles 62 suspended in a liquid medium are procured. Next, at step 44, the at least one suspension can be agitated as desired so as to disperse the particles in the liquid medium.

Next, at step 46, the holes 26 can be filled with one or both of the particles and the liquid medium of the at least one suspension 60. It is appreciated that the term "filled" as used herein with respect to the suspension 60 includes at least partially filled or entirely filled, unless otherwise indicated. The filling step can be achieved by performing a filling operation that forces the suspension into the holes 26 under one or more of a pressure, which could be a positive pressure or a negative pressure, a centrifugal force, and an electrostatic force. The filling step 46 can include on filling operation or a plurality of filling operations. At step 50, the particles are packed together to increase the packing density of the particles in the holes. The filling and compacting steps 46 and 50 define a filling and compacting sequence 55 that can be repeated as many times as desired until the hole 26 receives a desired volume of particles 62. In some examples, however, the compacting step 50 can be omitted, as will be described in more detail below. In one example, the desired volume of particles 62 can extend substantially from the first end of the hole 26 substantially to the second end of the hole 26. When the hole 26 is a through hole, the particles 62 can extend to one or both of the first surface 22 of the substrate 20 and the second surface 24. In some examples, the holes 26 can be overfilled with the particles 62, such that the particles 62 are filled beyond one or both of the first and second surfaces 22 and 24.

At step 52, the metallic particles 62 are sintered so as to define a metallic structure, or metal via. In some examples, the method 40 can proceed from the filling step 46 to the sintering step 52 without performing the step of increasing packing density 50. At step 53, the metallic structure can be subjected to a pressing step whereby the metallic structure is compressed at one or both of the first and second surfaces 22 and 24, respectively, of the substrate 20, thereby sealing the interface between the particles 62 and the substrate 20. As will be described in more detail below, the pressing step can be an isostatic pressing step, or a uniaxial or hard pressing step. At step 54, the vias can be sealed if desired. In some examples, step 54 can be omitted. Thus, the method can advance from step 52 to step 56. As will be appreciated from the description below, the particles 62 can define a hermetic seal with themselves and with the substrate 20. The combination of the sintered particles 62 and air can define the electrically conductive fill. Finally, at step 56, at least one or more redistribution layers 37 are applied to one or both of the first and second surfaces 22 and 24 of the substrate 20. The steps of the method 40 will now be described in more detail.

Referring now to FIGS. 1A-4A, the method 40 begins at the step 42, whereby the substrate 20 is procured along with at least one suspension of electrically conductive particles 62 disposed in a liquid medium 64. Step 42 can include fabricating the substrate 20 having the holes 26 illustrated in FIG. 1, or procuring a substrate 20 with the holes 26. Further, step 42 can include the step of suspending the particles 62 in the liquid medium 64, or procuring the suspension 60.

As described above, the electrically conductive particles 62 can be defined by any suitable electrically conductive material as desired. For instance, the electrically conductive material can be a metal, such as copper, silver, gold. Alternatively, the electrically conductive material can be a combination of more than one metal. For instance, one metal can be coated onto another metal. Alternatively or additionally, the electrically conductive material can be an electrically conductive polymer. In one example, a metal can coat the electrically conductive polymer. Alternatively, the electrically conductive polymer can coat one of the metals. It should be appreciated that one or more of the electrically conductive metals and the electrically conductive polymer can coat any suitable material as desired. In one example, the electrically conductive particles 62 can be silver particles. Alternatively or additionally, the electrically conductive particles 62 can be configured as include copper particles coated with silver. Alternatively or additionally, the electrically conductive particles 62 can be configured as uncoated copper particles.

In this regard, it is recognized that silver is a high electrical conductivity metal. Further, silver is a highly ductile metal, which can be useful during sintering. In particular, the present inventors have discovered that the process of sintering silver does not crack glass substrates whose vias are filled with silver particles. Without being bound by theory, it is believed that the malleability of silver particles allows the substrate 20 to expand and contract during and after sintering without damaging the structural integrity of the substrate 20. At the same time, silver exhibits sufficient strength characteristics. Further still, silver is a substantially nonporous metal, which thereby enhances the electrically conductivity of the resulting electrically conductive fill 35 in the via 34. Alternatively or additionally, as described above, the particles 62 can be gold particles, or particles of any suitable alternative material. Alternatively still, as described above, the particles 62 can be copper particles. While copper particles can be subject to oxidation, it is believed that the oxidation layers can be removed from the copper particles during the methods described herein. For instance, it is believed that at least a portion of the oxidation layer of the copper particles can be removed under vacuum or centrifugal forces described in more detail below. Further, at least a portion up to substantially all of the remaining oxidation layer can be removed during a sintering operation of the type described below. It can therefore be desirable to sinter the copper at step 52 in reduction conditions for the copper oxide.

As illustrated in FIG. 7A, it can be desirable for the particles 62 to be substantially spherical such when they are packed, the particles 62 in the hole 26 define respective interstices 66 therebetween (see., e.g., FIG. 7A) that can combine to define at least one liquid flow path for the evacuation of the liquid medium 64 from the holes 26, leaving behind the particles 62 in the holes 26. Thus, the term "substantially spherical" recognizes that the particles 62 might not be perfectly spherical, but they can approximate the shape of a sphere to the extent that the resulting interstices 66 define a reliable flow path. Thus, the particles 62 can define any shape that they define the interstices 66 described herein. Accordingly, the particles 62 can be at least partially or entirely curved, rounded, or can alternatively or additionally include straight edges. Further, it should be appreciated that when the holes 26 are at least partially or entirely filled with the particles 62, the fill 35 can include pores that are defined by the interstices 66. It should be appreciated that the interstices can define internal air pores of the electrically conductive material in the holes 26. In some examples, substantially all pores of the electrically conductive fill 35 can be defined by the interstices. The term "substantially," "approximately," derivatives thereof, and words of similar import as used herein with respect to a value, size, shape, direction, or location, can include the stated value, size, shape, direction, and location, and variances up to 10% of the stated value or shape, or location, including 8%, 5%, 3%, 2%, and 1%, unless otherwise indicated.

Further, it can be desirable for the electrically conductive particles 62 can be crystallite controlled so that the particles 62 can be sintered without substantial densification, as described in more detail below. While it can be desirable for the silver or copper to be as pure as possible, and thus devoid of organic material, it is recognized that processes for producing the particles 62 that are both substantially spherical silver or copper and crystallite controlled can produce particles having trace amounts of organic material. Therefore, "substantially pure" as used with respect to a material of the particles 62 can mean greater than 90% pure material, by weight. In one example, the particles 62 can be greater than 95% pure material by weight. For instance, the particles 62 can be greater than 98% pure material by weight. That is, the particles 62 can be devoid of more than 2% organic impurities by weight. For instance, the particles can be approximately 98.3% pure material by weight. Otherwise stated, in one example, the substantially pure particles 62 can mean 10% or less of organic material by weight, such as less than 5% organic material by weight, and in one example less than 2% of organic material by weight. For instance, the particles can have approximately 1.7% organic material by weight. In one example, the solid particles 62 have a porosity of no greater than approximately 5% by volume.

Thus, though the electrically conductive material can include a small quantity of organic material as described above, it can be said that the resulting via 34 can include only the electrically conductive material and air. It can further be said that the resulting via 34 can consist essentially of the electrically conductive material and air. As described above, the electrically conductive material can be a metal such as silver or copper in some examples, but other materials are contemplated as set forth herein. Or the silver or copper can be mixed with conductive polymers to get more conduction in the air gaps. Further, the particles 62 can be substantially nonporous, such that when sintered a resulting sintered matrix is produced that provides a highly conductive path from the first end of the via to the second end of the via. In one example, the via can conduct DC current and radio frequency (RF) current at desirable rates.

For instance, the electrically conductive via 34 can conduct RF signals along an entirety of its length with an insertion loss of no more than approximately −0.15 decibels (dB) at an approximately 20 gigahertz (GHz) operating frequency. For instance, the insertion loss can be no more than approximately −1 dB at an approximately 20 GHz operating frequency in some examples. For instance, the insertion loss can be no more than approximately −0.5 dB at an approximately 20 GHz operating frequency in some examples. For instance, the insertion loss can be no more than No more than approximately −0.3 dB at an approximately 20 GHz operating frequency in some examples. For instance, the insertion loss can be no more than approximately −0.1 dB out to an approximately 20 GHz operating frequency some examples. The term "no more than" in this context is used to connote "no less negative than" the stated decibels.

The liquid medium can be any suitable liquid medium as desired to suspend the electrically conductive particles 62. In one example, the liquid medium 64 can be an alcohol. In particular, the alcohol can be one of isopropanol, ethanol, and methanol. In this regard, it is recognized that metals such as silver and copper can have a zeta potential, or electrical surface charge. Thus, particles of the metals can thus potentially agglomerate with each other. Further, the particles can interact with the substrate that can be electrostatically charged, for instance when the substrate is a glass substrate, and with each other. The alcohol can be mildly polar, and thus can be configured to neutralize the zeta potential of the particles 62. Further, the particles 62 can be coated with an organic anti-agglomerating agent that prevents the particles from agglomerating in the liquid medium 64. The anti-agglomerating agent can be defined by a fatty acid. For instance, the fatty acid can be an oleic acid. Alternatively, the fatty acid can be a stearic acid.

The particles 62 can be sized as desired. It will be appreciated that it can be desirable for the particles 62 to be sized sufficiently large such that the interstices 66 define a reliable liquid flow path to evacuate the liquid from the holes 26 of the substrate 20 while leaving behind the electrically conductive material in the holes 26. However, it can be desirable for the particles 62 to be sized sufficiently small such that the resulting via 34 contains a suitable volume of the electrically conductive material of the particles so as to define a reliable electrical path from the first end of the via to the second end of the via. In one example, the particles 62 can have an average size within a range from approximately 1 microns to approximately 10 microns, such as from approximately 2 microns to approximately 10 microns. In one example, the average size of the particles 62 can be range from approximately 2 microns to approximately 4 microns. In another example, the average size of the particles 62 can range from approximately 2.5 microns to approximately 3.5 microns.

It is recognized, however, that an auxiliary electrically conductive material can be added to the particles 62 in the interstices 66 as part of the electrically conductive fill after the liquid medium 64 has been evacuated. In particular, it is envisioned that the auxiliary electrically conductive material can be added prior to sintering. Alternatively or additionally, it is envisioned that the auxiliary electrically conductive material can be added after sintering. The reliable electrical path can be configured to reliably conduct one or both of DC current and RF current as described above. In one example, the particles 62 of the suspension 60 can have an average size within a range from approximately 1 microns to approximately 10 microns, such as from approximately 2 microns to approximately 10 microns. In one example, the average size of the particles 62 can be range from approximately 2 microns to approximately 4 microns. In another example, the average size of the particles 62 can range from approximately 2.5 microns to approximately 3.5 microns.

In one example, the electrically conductive fill 35 can include fused particles of different sizes. In one example, the particles can be fused during a sintering operation. For instance, the at least one suspension 60 can include a first suspension 60a and a second suspension 60b. The first suspension 60a can contain a plurality of first particles 62a suspended in the liquid medium 64 as illustrated in FIG. 4B. The second suspension 60b can contain a plurality of second particles 62b suspended in the liquid medium 64 as illustrated in FIG. 4C. The first particles 62a can include any suitable electrically conductive material described herein. Similarly, the second particles 62b can include any suitable electrically conductive material described herein. In one example, the first and second particles 62a and 62b be defined by respective materials that can be the same material. In another examples, the first and second particles 62a and 62b be defined by respective materials that can be different materials. As will be appreciated below, in some examples, the electrically conductive fill can include a bulk fill of the first particles 62a, and a final fill of the second particles 62b that extends from the bulk fill to the first and second ends of the via. The bulk fill can extend along an intermediate region of the via that extends from the first end of the via to the second end of the via, including a center of the via. Further, the bulk fill can extend along a majority of the via.

When the material of the first and second particles 62a and 62b is the same material, the material can be a single homogeneous material from the first end of the hole 26 to the second end of the hole 26. When the hole 26 is a through hole, it can be said that the material can be a single homogeneous material substantially from the first surface 22 of the substrate 20 substantially to the second surface 24 of the substrate 20. When the material is a metal, then it can be said that the metal is a single homogeneous metal substantially from the first surface substantially to the second surface. Alternatively, the respective materials of the first and second particles 62a and 62b can be different materials. Further, the liquid medium 64 of the first and second suspensions 60a and 60b can be any suitable liquid medium as described herein. The liquid medium 64 of the first suspension 60a can be the same liquid medium or a different liquid medium than that of the second suspension 60b.

In one example, the first particles 62a can have a first average particle size within a range from approximately 1 micron to approximately 10 microns, such as approximately 1.2 microns. In one example, the average size of the particles 62 can be range from approximately 2 microns to approximately 4 microns. In another example, the average size of the particles 62 can range from approximately 2.5 microns to approximately 3.5 microns.

The second particles 62b can have an average particle size less than the average particle size of the first particles 62a. Thus, it can be said that the first particles 62a have a first average particle size, the second particles 62b have a second average particle size, and the first average particle size is greater than the first average particle size. In one example, without being limited unless otherwise indicated, the first average particle size can range from approximately 1.5 to approximately 120 times the second average particle size. In one example, the first average particle size can range from approximately 5 to approximately 20 times the second average particle size. For instance the first average particle size can range from approximately 10 to approximately 15 times the second average particle size.

In one example, without being limited unless otherwise indicated, the second average particle size can range from approximately 0.01 micron to approximately 1 micron. For instance, the second average particle size can range from approximately 0.05 micron to approximately 0.9 micron. In particular, the second average particle size can range from approximately 0.15 to approximately 0.75 micron. In particular, the second average particle size can range from approximately 0.15 micron and 0.5 micron. In one example, the second average particle size can range from approximately 0.15 micron and 0.3 micron. For instance, the second average particle size can be approximately 0.22 micron.

Reference herein to "particles 62" and a "material" thereof is intended to apply to each of the first particles 62a and the second particles 62b unless otherwise indicated. Similarly, reference herein to "liquid medium" is intended to apply to the liquid medium of each of the first suspension 60a and the second suspension 60b unless otherwise indicated. Similarly still, reference herein to "suspension 60" is intended to apply to each of the first suspension 60a and the second suspension 60b unless otherwise indicated.

The viscosity of one or both of the first and second suspensions 60a and 60b can be less than that of conventional pastes that have been used in an attempt to metalize vias in glass substrates. The viscosity of one or both of the first and second suspensions 60a and 60b can be in a range from approximately 1 centipoise (cP) to approximately 1,000 cP. For instance, the range can be from approximately 1.5 cP to approximately 50 cP. In another example, the range can be from approximately 1.8 cP to approximately 15 cP. For instance, the range can be between approximately 1.9 cP to approximately 5 cP.

The first suspension 60a can have a solid concentration of the first particles 62a in a range from approximately 0.1% to approximately 20% by weight. The range can be from approximately 1% to approximately 15% in one example. For instance, the range can be from approximately 1% to approximately 10%. In one example, the solid concentration can be approximately 5%. In another example, the solid concentration can be approximately 10%. Alternatively, the first suspension 60a can have any suitable alternative solid concentration as desired. The second suspension 60b can have a solid concentration of the second particles 62b in a range from approximately 0.1% to approximately 10% by weight. The range can be from approximately 1% to approximately 5% in one example. For instance, the range can be from approximately 1% to approximately 4%. In one example, the solid concentration of the second suspension 60b can be approximately 2%. In another example, the solid concentration can be approximately 10%. Alternatively, the second suspension 60b can have any suitable alternative solid concentration as desired. In this regard, it should be appreciated that any concentration of solid particles above zero can cause the respective liquid medium to allow the particles to flow into the holes 26.

It is recognized that one or both of the first and second suspensions 60a and 60b can include an anti-agglomerating agent to reduce instances of agglomeration of the first and second particles 62a and 62b, respectively, to each other. A reduction in agglomeration can result in higher concentrations of particles in the hole 26 that can fill into the hole 26 at more rapid rates than without the agglomerating agent. In one nonlimiting example, the anti-agglomerating agent can be oleic acid. Oleic acid burns off during sintering. While a trace amount of residual material may remain after sintering, it is believed that the residual material is not of a sufficient quantity to meaningfully impact the electrical performance of the via 34. Therefore, when the anti-agglomerating agent is added to either or both of the suspensions 60a and 60b, the via 34 can still be said to include substantially only the electrically conductive material and air, as illustrated in FIG. 2B. It can further be said that the via 34 consists essentially of the electrically conductive material and air.

With reference to FIG. 7A, the particles 62 can define a monomodal distribution 70. Without intending to be limiting unless otherwise indicated herein, in the monomodal distribution 70, the particles 62 can be within a range of plus or minus 100% of the average particle size. For instance, the range can be of plus or minus 50% of the average particle size.

In one example, without being limiting unless otherwise indicated in the claims, the first particles 62a can define a monomodal distribution 70 can have an average size within a range from approximately 1 micron to approximately 10 microns, such as approximately 1.2 microns. For instance, the average particle size of the first particles 62a can range from approximately 1 micron to approximately 6 microns, such as approximately 1.4 microns. The terms "approximately" and "substantially" as used herein with respect to dimensions and shapes can be interpreted to mean within 10% of the stated value or shape, unless otherwise indicated. In one example, the average size of the first particles 62a can be range from approximately 2 microns to approximately 4 microns. In another example, the average size of the particles 62 can range from approximately 2.5 microns to approximately 3.5 microns.

Further, without being limiting unless otherwise specified in the claims, the second particles 62b can define a monomodal distribution 70 that has an average particle size less than the average particle size of the first particles 62a. Thus, it can be said that the first particles 62a have a first average particle size, the second particles 62b have a second average particle size, and the first average particle size is greater than the first average particle size. In one example, without being limited unless otherwise indicated, the first average particle size can range from approximately 1.5 to approximately 120 times the second average particle size. In one example, the first average particle size can range from approximately 5 to approximately 20 times the second average particle size. For instance the first average particle size can range from approximately 10 to approximately 15 times the second average particle size.

Referring now to FIG. 7B, the first particles 62a of the first suspension 60a can alternatively define a bimodal distribution 72. The bimodal distribution of the first particles 62a can have a fill density of the electrically conductive particles in the via 34 that is greater than the fill density of the monomodal distribution. The fill density can be defined as the density of the particles in the via 34. Thus, it is envisioned that in some examples the vias 34 produced from a bimodal distribution can have a greater electrical conductivity than the vias 34 produced from a monomodal distribution.

The first particles 62a can include a plurality of first bimodal particles 74 and a plurality of second bimodal particles 76. The first bimodal particles 74 can have a first bimodal average particle size as described above with respect to the first particles 62a of the monomodal distribution. Thus, the first bimodal particles 74 can define the interstices 66 described above. The second bimodal particles 76 can have a second bimodal average particle size that is less than the first bimodal average particle size of the first bimodal particles 74. As shown, the second bimodal particles 76 can be sized to fit in respective ones of the interstices 66 defined by the first bimodal particles 74. In one example, the second average particle size of the bimodal particles 76 can range from approximately 0.3 micron to approximately 1 micron. For instance, the second average particle size can be approximately 0.6 micron.

In some examples, it can be desirable to maximize the size of the second bimodal particles 76 so that they fit in respective ones of the interstices 66 without expanding the interstices 66. It is appreciated, however, that the second bimodal particles 76 can expand the interstices 66 while increasing the density of the first particles with respect to the monomodal distribution. Regardless, the first and second bimodal particles 74 and 76 can be said to combine so as to define second bimodal interstices 75 that are smaller than the interstices 66 that can be referred to as first bimodal interstices. Further, the second bimodal interstices 75 can be disposed inside the first bimodal interstices 66.

While not being limiting unless otherwise indicated, the first bimodal particle size and the second bimodal average particle size can define a ratio within a range from approximately 4:1 to approximately 10:1. For instance, the ratio can be approximately 7:1. In other examples, the ratio can range from approximately 1.5:1 to approximately 12:1. For instance, the ratio can range from approximately 1.5:1 to approximately 3.5:1. It is envisioned that the size of the interstices 66 that contain the bimodal particles 74 remains sufficiently large such that the bimodal interstices 66 combine to define a liquid flow path to evacuate the liquid medium 64 from the holes 26 of the substrate 20, while sufficiently small such that the resulting via 34 contains a suitable volume of the electrically conductive material of the particles so as to define a reliable electrical path. It should be appreciated that the second particles 62b of the second suspension 60b can also define the bimodal distribution if desired. In particular, one or both of the first and second particles 62a and 62b can include the bimodal distribution. The second bimodal particles 76 can included in a quantity within a range from approximately five percent by volume of the hole to approximately 20 percent by volume of the hole. For instance, the quantity can be approximately ten percent by volume of the hole. It is understood that including the second bimodal particles 76 can decrease the viscosity of the suspension during the filling step 46, and can result in a higher green density of the fill.

It is appreciated that the bimodal distribution can achieve higher packing densities than the single bulk fill prior to sintering. Thus, the resulting electrically conductive fill can be higher density. The second bimodal particles 76 can be a metal different than the metal of the first bimodal particles 74. The second bimodal particles can be any suitable metal. In one example, the second bimodal particles 76 can have a melting point less than that of the first bimodal particles. In one example, the second bimodal particles 76 can comprise indium. In another example, the second bimodal particles 76 can comprise tin. The bimodal particles 76 can form intermetallics or alloys with the first bimodal particles 74 for transient liquid phase sintering. Further, the transient liquid phase sintering can result in templated/shape-holder pore configurations left over from the second bimodal particles 76. The resulting pore structure and associated porosity can be tunable in order to achieve desired RF and DC conductivity for the resulting via. In particular, the pore structure can be tunable based, at least in part, on the volume of the second bimodal particles 76 and the average particle size of the second bimodal particles 76. Alternatively, if desired, one or both of the volume and average particle size of the second bimodal particles 76 can be controlled to eliminate a continuous porosity from the first end to the second end. Further, the transient liquid phase can result in less organic contamination, better via wall adhesion of the fill, and more controllable via geometries.

It is further recognized that the alloy can be temperature stable during a future RDL step. In particular, the sintering step causes the second bimodal particles 76 to melt and liquify in the first bimodal particles 74, which creates the alloy that has a melting point greater than the temperature at which the RDL layer is applied.

In one example, the hole can be overfilled with the bimodal particles 60a when the compacting step is performed. Further, the bimodal particles 60a can be less compressible than a single mode fill. Thus, it is envisioned that a plating can be applied to the ends of the via and the outer surfaces of the substrate. Further, a redistribution layer can be applied with or without the plating.

It is recognized that the bimodal particles 60a can be filled to a level outboard of the outer surface of the substrate. In particular, a sacrificial layer can be applied to the outer surface having an aperture that is in alignment with the hole of the plate. The sacrificial layer thus extends along a length that effectively increases the length of the hole. Thus, the hole of the substrate can be filled, and the aperture of the sacrificial layer can be at least partially or entirely filled. The sacrificial layer can be removed prior to or after compression of the fill. It is envisioned that the compressed fill can be substantially coplanar with outer surface of the substrate after the sintering step. Accordingly, a redistribution layer alone or in combination with plating can be applied to the sintered fill 35 without performing a final fill. Alternatively, a final fill can be performed if desired, as described in more detail below.

Alternatively, an electrically conductive layer can be applied to one or both outer surfaces of the substrate prior to filling the hole. The electrically conductive layer can further extend along the inner wall of the hole. For instance, the electrically conductive layer can extend along one or both outer regions of the inner wall. The electrically conductive layer can be titanium in one example. It is envisioned that the fill 35 can bond to the electrically conductive layer during the sintering step to create a hermetic seal.

Referring now to FIG. 7C, the first particles 62a of the first suspension 60a can alternatively define a trimodal distribution 73. The trimodal distribution of the first particles 62a can have a fill density of the electrically conductive particles in the via 34 that is greater than that of the bimodal distribution, and thus also greater than the monomodal distribution. Thus, it is envisioned that in some examples the vias 34 produced from the trimodal distribution 73 can have a greater electrical conductivity than the vias 34 produced from each of the bimodal distribution and the monomodal distribution.

The first particles 62a can include the plurality of first bimodal particles 74 described above that define first trimodal particles, the plurality of second bimodal particles 76 described above that define second trimodal particles, and a plurality of third trimodal particles 78. The first trimodal particles 74 can have a first trimodal average particle size as described above with respect to the first particles 62a of the monomodal distribution. Thus, the first trimodal particles 74 can define the interstices 66 described above. The interstices 66 of the trimodal distribution 73 can be referred to as first trimodal interstices. The second trimodal particles 76 can have the second trimodal average particle size that is less than the first bimodal average particle size of the first trimodal particles 74 as described above with respect to the first and second bimodal particles. Thus, the second trimodal particles 76 can be sized to fit in the first trimodal interstices 66 so as to define second trimodal interstices 75 as described above.

Further, the third trimodal particles 78 can be packed in the hole 26 so as to be disposed in the second trimodal interstices 75 As shown, the third trimodal particles 78 can be sized to fit in respective ones of the second trimodal interstices 75 defined by the first trimodal particles 74 and the second trimodal particles 76. In some examples, it can be desirable to maximize the size of the third trimodal particles 78 so that they fit in respective ones of the second trimodal interstices 75 without expanding the interstices 75. It is appreciated, however, that the third bimodal particles 78 can expand the second trimodal interstices 75 while increasing the density of the first particles 62a with respect to the bimodal distribution. Regardless, the first and second and third bimodal particles 76 and 78 can be said to combine so as to define third trimodal interstices 69 that are smaller than the second trimodal interstices 75.

The third trimodal particles 78 can have a third trimodal average particle size that is less than the second trimodal average particle size. While not being limiting unless otherwise indicated, the second trimodal average particle size and the third trimodal average particle size can define a ratio within a range from approximately 4:1 to approximately 10:1. For instance, the ratio can be approximately 7:1. It should be appreciated that the second particles 62b of the second suspension 60b can also define a trimodal distribution if desired. It should be appreciated that the second particles 62b of the second suspension 60b can also define a trimodal distribution if desired. Thus, one or both of the first and second particles 62a and 62b can define the trimodal distribution. Alternatively, the trimodal distribution can be present in a single solution if desired.

When the second particles 62b defines a multimodal distribution, such as the bimodal or trimodal distribution, and the second particles 62b define the final fill, the bimodal distribution can create a hermetic seal at one or both of the first and second ends of the electrically conductive fill 35, as described below.

In one example, the third trimodal particles 78 can be made of any suitable electrically conductive material. For instance, the third trimodal particles 78 can be the same material as the first trimodal particles 74. Thus, in one example, the third trimodal particles 78 can be made of silver. During the sintering step, the second trimodal particles 76 can transport the third trimodal particles 78 during the transient liquid phase.

Referring again to FIGS. 1A-4C in general, it is envisioned that the fill 35 can have a porosity between approximately 10% and approximately 60% by volume. For instance, the porosity can be between approximately 20% and approximately 50%. The porosity can depend on several factors, including particle size, the nature of the particle size distribution (e.g., monomodal, bimodal, or trimodal), and any electrically conductive additives that may be added to the electrically conductive material either before sintering or after sintering. In other examples, it is recognized that the particles 62 can be provided as a quadmodal distribution. In still other examples, it is recognized that the particles 62 can be provided as a quintmodal distribution. Thus, the particles 62, including either or both of the first particles 62a and the second particles 62b, can be provided as any suitable multimodal distribution of particles.

It is recognized that the hole 26 can contain a bulk fill and a final fill. The bulk fill can be at least partially or entirely defined by the first particles 62a described above. The final fill can be at least partially or entirely defined by the second particles 62b described above. The bulk fill can occupy a first portion of the hole 26 or via, and the final fill can occupy a second portion of the hole 26 or via that is different than the first portion. For instance, the bulk fill can occupy an inner portion of the hole 26 or via, and the final fill can occupy opposed outer regions of the hole 26 or via. Thus, the final fill can extend from the bulk fill to each of the opposed ends of the hole 26 or via. For instance, when the hole or via is a through hole or through via, the final fill can extend from the bulk fill to each of the first and second surfaces 22 and 24 of the substrate 20. Thus, it can be said that the electrically conductive fill 35 can include one or both of the bulk fill and the final fill. The bulk fill can be defined by the first particles 62a in one example. The final fill can be defined by the second particles 62b in one example. Alternatively, both the bulk fill and the final fill can be defined by the first particles 62a as desired. In this regard, it is recognized that the method 40 can include multiple steps of bulk filling the hole. One or more of the steps of bulk filling can be performed with the first particles 62a of one of the monomodal distribution, the bimodal distribution, and the trimodal distribution, and one or more other steps of bulk filling can be performed with the first particles of a different one of the monomodal distribution, the bimodal distribution, and the trimodal distribution. Alternatively, all bulk filling steps can be performed with the first particles of the same one of the monomodal distribution, the bimodal distribution, and the trimodal distribution.

The bulk fill can occupy a length of the hole 26 or via within a range from approximately 50% to 100% of the total length of the hole 26 or via. For instance, the bulk fill can occupy a length of the hole 26 or via within a range from approximately 80% to approximately 100% of the total length of the hole 26 or via. In particular, the bulk fill can occupy a length of the hole within a range from approximately 90% to approximately 99% of the total length of the hole 26 or via. In one example, the bulk fill can occupy a length of the hole or via within a range from approximately 94% to approximately 99% of the total length of the hole 26 or via 34. In one specific example, the bulk fill can occupy a length of the hole or via within a range from approximately 96% to approximately 98% of the total length of the hole 26 or via. The final fill can extend from the bulk fill to the first end of the hole 26 or via. Further, the final fill can extend from the bulk fill to the second end of the hole 26 or via. Moreover, the portion of the hole said herein to be occupied by the final fill is not occupied by the bulk fill in one example. In one specific example, the final fill can occupy a length within a range from approximately 1% to approximately 4% of the total length of the via 34 at each of the first and second ends of the via 34.

The present inventors recognize that the electrically conductive particles 62 can tend to settle in the liquid medium 64, especially if stored for a prolonged period of time, as illustrated at FIG. 4A. Therefore, at step 44, and as shown in FIGS. 4B-4C, the suspension 60 can be agitated so as to cause the particles 62 to disperse the particles 62 in the liquid medium 64. For instance, in one example, the suspension can be sonicated so as to cause the particles 62 to disperse in the liquid medium 64. Thus, it can be appreciated that the liquid medium 64 is configured to support the particles 62 as a dispersion 68. It should therefore be appreciated that the liquid medium can be any liquid that is suitable to support the particles 62 so as to assist in filling the holes 26 of the substrate with the particles 62 in accordance with at least one of the methods described herein.

Figure 10:
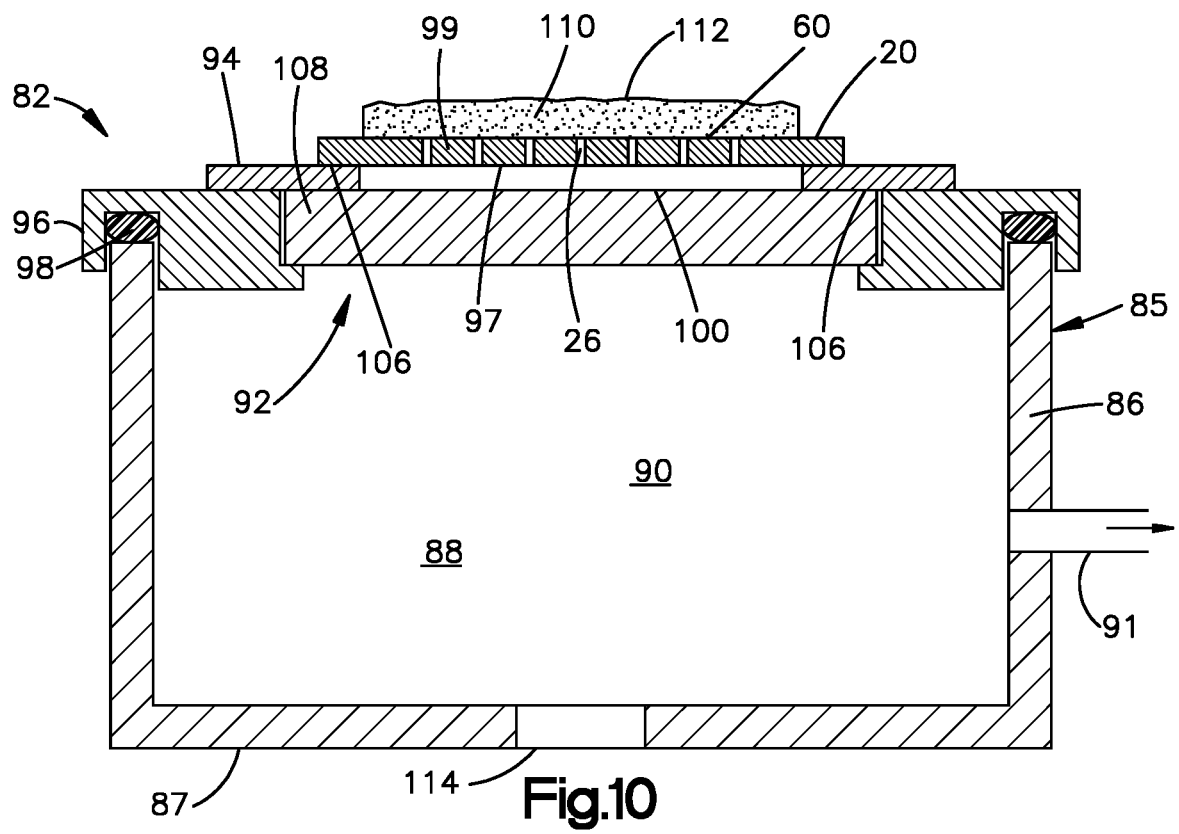
FIG. 10 is a schematic sectional view of a suspended vacuum fill apparatus similar to FIG. 5, but configured to suspend the substrate.

Next, at step 46, the holes 26 can be filled with the at least one suspension 60. As will be appreciated from the description below, the suspension 60, and thus the particles 62, can be urged to flow into the holes 26 under a force defined by a pressure differential across the substrate 20 as illustrated in FIGS. 5 and 10. The pressure differential can be defined by a fluid pressure differential. The fluid pressure differential can be a gaseous pressure differential. In one example, the gas can be air, such that the gaseous pressure differential is an air pressure differential. For instance, the air pressure differential can be defined by a vacuum force. Thus, the particles 62 can be urged to flow into the holes 26 under a vacuum pressure using a vacuum apparatus. Alternatively, the air pressure differential can be defined by a positive air pressure. Alternatively or additionally, the force that urges the particles 62 to flow into the holes 26 can be a centrifugal force, for instance using a centrifuge as described below with respect to FIGS. 19A-19E. Alternatively or additionally, the force that urges the particles 62 to flow into the holes 26 can be an electrostatic force as described below with reference to FIGS. 20A-20F.

The step 46 of filling the holes 26 under air pressure in one example will now be described with reference to FIGS. 5-6B. In particular, a fluid pressure fill apparatus 82 is configured to apply a pressure differential across the suspension 60 that urges the suspension 60 to flow into the holes 26. For instance, the fluid pressure fill apparatus 82 can be configured as an air pressure fill apparatus that is configured to apply an air pressure differential across the suspension 60 that urges the suspension 60 to flow into the holes 26. In one example, the air pressure fill apparatus 82 can be configured as a vacuum fill apparatus 84 configured to apply vacuum pressure to the suspension 60 that creates the air pressure differential. In another example, the vacuum fill apparatus 82 can be modified to apply forced air under positive pressure to the suspension 60 that creates the air pressure differential. It is recognized that the suspension will be urged to flow in a direction from higher pressure to lower pressure.

As illustrated in FIG. 5, the vacuum fill apparatus 84 can include a frame 86 that defines an internal cavity 88 that at least partially defines a vacuum chamber 90. The frame 86 includes a frame body 87 that defines an open end 92 to the internal cavity 88. At least a portion of the substrate 20, and in particular the holes 26, is in fluid communication with the vacuum chamber 90. Further, the substrate 20 is sealed to the frame 86, such that generated vacuum pressure is applied to the substrate 20, and thus the holes 26 without drawing any significant air into the internal cavity through an interface between the substrate 20 and the frame 86. In one example, the vacuum fill apparatus 84 can include a gasket 94 that seals the substrate 20 to the frame 86 with respect to airflow at the interface between the substrate 20 and the frame 86. For instance, the gasket 94 can extend across the interface between the substrate 20 and the frame 86. The gasket 94 can be made of any suitable material as desired. For instance, the gasket 94 can be made of rubber. In one example, the gasket 94 can be a vulcanized silicone. In particular, the gasket 94 can be a room-temperature vulcanizing silicone (RTV silicone).

The frame 86 can include a frame body 87 and a shelf 96 that is attached to the frame body 87 so as to support, directly or indirectly, at least a portion of the substrate 20. The shelf 96 can close a portion of the open end 92. For instance, the shelf 96 can close an outer perimeter of the open end 92. The vacuum fill apparatus 84 can include a seal member 98 that seals the shelf 96 to the frame body 87. Thus, the shelf 96 can be separate from the frame body 87. The seal member 98 can define a nonporous interface with respect to airflow between the shelf 96 and the frame body 87 when the vacuum chamber 90 is under negative pressure. It should be appreciated that the shelf 96 can be monolithic with the frame body 87. The frame body 87 can define an outlet 91 that is configured to be coupled to a vacuum source so as to induce negative pressure in the vacuum chamber 90. Both the frame body 87 and the shelf 96 can be substantially nonporous with respect to airflow therethrough when the vacuum chamber 90 is under negative pressure.

The vacuum fill apparatus 84 can further include a filter media 100 that is positioned between at least a portion of the substrate 20 and the vacuum chamber 90. For instance, the filter media 100 can be aligned with the openings that are to receive the suspension 60. The filter media 100 can be porous with respect to air and the liquid medium 64, but nonporous with respect to the particles 62. Thus, both air and the liquid medium 64 are able to pass through the filter media, while the particles 62 remain in the holes 26. The gasket 94 can further seal the substrate 20 to the filter media 100 with respect to airflow at an interface between the substrate 20 and the filter media 100. Thus, a first interface 102 between substrate 20 and the filter media 100 is sealed with respect to airflow therebetween, and a second interface 104 between the filter media 100 and the frame 86 is sealed with respect to airflow therebetween. It should be appreciated that the same gasket 94 can seal each of the first and second interfaces 102 and 104. Alternatively, a first gasket can seal the first interface 102, and a second gasket separate from the first gasket can seal the second interface 104. Thus, it can be said that at least one gasket seals the first and second interfaces 102 and 104.

The filter media 100 can be made of any suitable material as desired that is suitable to allow the liquid medium 64 and air to pass through while preventing the particles 62 from passing through. A non-limiting list of potential materials for the filter media includes glass microfibers, cellulose, mixed cellulose ester (MCE), Cellulose acetate, Cellulose nitrate, Polytetrafluoroethylene (PTFE), Polyamide, Polyimide-imide, Polyether sulfone, Polyvinylidenedifluoride, Polyacrylonitrile, Polyvinylidenedifluoride, phenol-formaldehyde, VVPP, VVLP, HVLP, as well as many filter membrane types sold commercially by such companies as Millipore, Membrane Solutions, Whatman, and Ahlstrom, and under such trade names as Durapore, ExpressPlus, Isopure, etc. as examples.

Because the first and second interfaces 102 and 104 are sealed, a substantially entirety or an entirety of the vacuum pressure in the vacuum chamber 90 can be applied to the holes 26 of the substrate 20. It should be appreciated that the gasket 94 prevents airflow through the substrate 20 at an exclusion zone 106 of the substrate 20 that is covered by the gasket 94. Therefore, it may be desirable to produce the substrate 20 with no openings at the exclusion zone 106. In one example, the exclusion zone 106 can be disposed at an outer perimeter of the substrate 20, though it should be appreciated that any location of the substrate 20 that is covered by the at least one gasket 94 can define the exclusion zone 106.

The vacuum fill apparatus 84 can further include a support member 108 that is configured to support, directly or indirectly, at least a portion of the substrate 20. In particular, the support member 108 can be aligned with the holes 26 of the substrate 20 that are to be receive the suspension 60 under the induced pressure differential. The support member 108 can be supported by the frame 86 so as to span at least a portion of the open end 92 up to an entirety of the open end 92. In particular, the support member 108 can be supported by the shelf 96. Further, because the filter media 100 is aligned with the holes 26, the filter media 100 is similarly aligned with the support member 108. In one example, the filter media 100 can be disposed between the substrate 20 and the support member 108. In particular, the filter media 100 can rest on the support member 108, and the substrate 20 can rest on the filter media 100.

Each of substrate 20, the filter media 100, and the support member 108 define an inner surface 97 that faces the vacuum chamber 90, and an outer surface 99 that is opposite the inner surface 97. The outer surface 99 of the substrate 20 can be defined by one of the first surface 22 and the second surface 24. The inner surface 97 of the substrate 20 can be defined by the other of the first surface 22 and the second surface 24. At least a portion of the inner surface of the support member 108 can be open to the vacuum chamber 90. At least a portion of the inner surface of the filter member 100 can rest on at least a portion of the outer surface of the support member 108. At least a portion of the inner surface 97 of the substrate 20 can rest on at least a portion of the outer surface of the filter member 100. The gasket 94 can rest on the outer surface 99 of the substrate at the exclusion zone 106. Thus, each of the holes 26 that receives the suspension 60 can be aligned with each of the filter member 100 and the support member 108 with respect to the length of the holes 26, which is coincident with the direction of through the holes 26 that defines the air pressure differential.

The support member 108 can be made from any suitable material that is porous with respect to both air and the filter media 100. In particular, the support member 108 can have a porosity greater than that of the filter media 100. Thus, both air and the filter media are able to pass through the support member 108. In one nonlimiting example, the support member 108 can be defined by a fritted glass (also referred to as a glass frit). Thus, the support member 108 can be a rigid support member.

During operation, a quantity of the suspension 60 is applied to the outer surface 99 of the substrate 20, such that the suspension covers at least a portion of the outer surface 99. For instance, the suspension 60 can be coated onto the outer surface 99. During a bulk fill operation, the suspension 60 can be defined by the first suspension 60a. As will be appreciated from the description below, during a final fill operation, the suspension 60 can be defined by the second suspension 60b, though it should be appreciated that other sized particles may be sufficient for the final fill. For instance, the first suspension 60a can be used for the final fill.

In particular, the suspension 60 is applied to a fill zone of the substrate 20. The fill zone of the substrate 20 can be defined by the holes 26 that are in alignment with the filter media and the support member 108. Thus, the suspension 60 can cover the holes 26 that are to be filled. For instance, the suspension 60 can extend over and across the holes 26. Alternatively or additionally, as described in more detail below, the suspension 60 can be induced to flow along the outer surface 99 of the substrate 20 across the holes 26.

The filling step 46 can include the step of applying the suspension 60 to the outer surface 99 of the substrate 20. The vacuum source can be activated so as to apply negative pressure to the vacuum chamber 90. It should be appreciated that the vacuum source can be activated before the suspension 60 is applied to the substrate 20, during application of the suspension 60 to the substrate 20, or after the suspension 60 has been applied to the substrate 20.

Referring to now also to FIG. 6A, the negative pressure urges the suspension 60 to flow from the outer surface 99 of the substrate 20 into the respective holes 26 that is open to the outer surface 99 of the substrate. As described above, the filter media 100 extends across the inner surface 97 of the substrate 20 and across the holes 26. Because the filter media 100 and the support member 108 are porous with respect to air, the negative pressure in the vacuum chamber 90 creates a pressure differential across the holes 26, which can be configured as a negative pressure that draws a quantity of the suspension 60 into the holes 26. Thus, both the liquid medium and the particles 62 suspended in the liquid medium 64 flow into the holes 26 under the pressure differential. Because the filter media 100 is porous with respect to the liquid medium 64 but nonporous with respect to the particles 62, the pressure differential causes the liquid medium 64 to flow through the filter media 100. Because the particles 62 are unable to flow through the filter media 100, the particles 62 remain in the holes 26. Thus, the particles 62 collect in the hole 26 as the liquid medium 64 flows through the holes 26. Further, because the filter media 100 can be flat against the inner surface 97 of the substrate 20, the particles 62 can accumulate against the filter media 100, and can thus be substantially flush with the inner surface 97 of the substrate 20. Further, when all filling steps have been completed, the particles can be substantially flush with the outer surface 99. Alternatively, the particles 62 can be filled beyond the outer surface 99 of the substrate 20. The particles 62 that are disposed beyond the outer surface 99 can be removed from the outer surface, for instance, by driving a wand across the outer surface 99 of the substrate 20 to remove the particles 62 that extend out from the outer surface 99.

As described above, the holes 26 can be through holes, such that one or both of the negative pressure and the flow of liquid medium 64 from the outer surface 99 of the substrate 20 to the inner surface 97 of the substrate 20 causes the particles 62 to pack against each other, thereby defining one or more of the interstices of the type described above with respect to FIGS. 7A-7C, depending on the nature of the particle size distribution. In particular, a vacuum force applied against the inner surface 97 of the substrate 20 can draw the suspension from the outer surface into the holes 26. Alternatively, a positive air pressure applied to the outer surface 99 can cause the suspension to flow into the holes 26 toward the inner surface 97. Air and the liquid medium of the suspension can evacuate from the through hole 26. Alternatively, if the hole 26 is a blind hole of the type described above, a sacrificial hole can extend from the blind hole to an outer surface of the substrate 20 so as to create a through hole. Thus, the electrically conductive particles 62 can be forced into the blind hole and the sacrificial hole under one or more up to all of forces of pressure differential, centrifugal forces, and electrostatic forces. In order to prevent the sacrificial hole from acting as an electrically conductive via, the sacrificial hole can be capped at a location adjacent the second surface 24 with an electrical insulative cap. Thus, the redistribution layer will not be in electrical communication with metal in the sacrificial hole. The electrically insulative cap can seal the sacrificial hole to provide hermeticity to the sacrificial hole as described herein. Alternatively or additionally, at least some up to all of the metal can be removed from the sacrificial hole. For instance, a laser can ablate the metal in the sacrificial hole without removing the metal from the blind hole. Alternatively or additionally, the sacrificial hole can be etched so as to remove the metal in the sacrificial hole without removing the metal from the blind hole. Alternatively or additionally still, the redistribution layer can avoid contact with the metal in the sacrificial hole, for instance at the second surface 24.

It is recognized that the particles 62 in practice might not be as highly packed as the particles 62 schematically illustrated in FIGS. 7A-7C. Accordingly, the resulting interstices may be sized greater than those illustrated in FIGS. 7A-C, which allows the liquid medium 64 to flow through the particles 62 at greater flow rates. Further as described above, the interstices of the packed particles 62 can define a flow path that allows the liquid medium 64 to flow through the hole 26 and evacuate the hole through the filter media 100. Thus, the liquid medium 64 that has entered the holes 26 is also removed from the holes 26. As the suspension 60 continues to flow into the hole 26, the particles 62 accumulate within the hole 26 until the filling step 46 is completed.

Further, because the support member 108 is porous with respect to the liquid medium 64, the liquid medium 64 can be drawn under the vacuum pressure into the vacuum chamber 90. The vacuum pressure can be any pressure below atmospheric, depending on the desired speed of the filling process. In one nonlimiting example, the negative pressure can range between any pressure below atmospheric up to approximately 120 KPa, such as approximately 80 KPa.

The frame 86 can define a drain 114 that extends through the frame body 87 and in fluid communication with the vacuum chamber 90. Thus, the drain 114 can provide an outlet for the flow of the liquid medium 64 out the vacuum chamber 90 as expelled liquid medium 64. The expelled liquid medium 64 can be discarded. Alternatively, the expelled liquid medium 64 can be reused. In one example, a quantity of particles 62 can be fed into a quantity of the expelled liquid medium 64 so as to produce suspension 60 for use in a subsequent fill operation of the substrate 20, or for a fill operation of a different substrate 20. In one example, the expelled liquid medium 64 can be circulated past a hopper of dry particles 62 as a stream. The hopper can release a quantity of dry particles 62 into the stream so as to produce the suspension 60.

While it is appreciated that the filter media 100 can be nonporous with respect to the particles 62 as described above, it is recognized that the potential exists that the filter media 100 may be porous with respect to a quantity of the particles 62 less than an entirety of the particles 62 that enters the holes 26. Whether the filter media 100 is nonporous with respect to all of the particles 62 or some of the particles 62, the particles 62 that do not pass through the filter media 100 can accumulate in the holes 26 in the manner described above.

With continuing reference to FIG. 6A, is recognized that the pressure differential causes an aligned portion of the suspension 60 that is disposed on the outer surface 99 at a region of alignment 110, whereby the suspension is aligned with a respective hole 26. Thus, the suspension 60 in the region of alignment can be forced into the respective hole 26 under the pressure differential. Further, the pressure differential urges an offset portion of the suspension 60 that is disposed on the outer surface 99 of the substrate 20 at a region of influence 112 to flow into the respective hole 26. The region of influence 112 can have a shape of a circle on the outer surface 99 of the substrate 20, or any suitable alternative shape as desired. The offset portion of the suspension disposed at the region of influence 112 is positioned laterally offset from the respective hole 26 along a lateral direction that is perpendicular to the length of the holes 26. The region of influence is positioned at a location sufficiently close to the respective hole 26 so as to be drawn into the hole 26 under the force from the pressure differential. It has been found that the region of influence 112 is substantially spherical. However, it is envisioned that the region of influence 112 can be alternatively shaped depending on a number of factors including the dispersion gradient of the particles 62 in the liquid medium. It should be recognized that the suspension 60 disposed on the outer surface 99 of the substrate 20 can be agitated during the filling step 46, thereby maintaining the dispersion of the particles 62 in the liquid medium 64. For instance, the substrate 20 can be vibrated, shook, or otherwise moved in such a manner so as to agitate the suspension 60 and cause the suspension to travel either to the respective hole 26, or to the region of influence 112 so as to be forced into the respective hole 26.

Depending on the volume of suspension 60 applied to the outer surface 99 of the substrate 20, the volume of the aligned portion of the suspension 60 and the offset portion of the suspension 60 may be sufficient to fill the hole 26. Thus, in one example, the filling step 46 can be completed when a substantial entirety of the hole 26 is filled with particles 62. Alternatively, it is recognized that the volume of the aligned portion of the suspension 60 and the offset portion of the suspension 60 may not be sufficient to fill the hole 26 in one fill operation in some examples. In this case, the vacuum pressure fails to draw additional quantities of suspension 60 into the hole 26, leaving a volume of particles 62 in the hole 26 that is less than a volume of particles 62 sufficient to fill a substantial entirety of the hole 26 from the first end of the hole to the second end of the hole. It should therefore be appreciated that the step 46 of filling the hole 26 can include partially filling the hole 26 and filling a substantial entirety of the hole 26.

Once the liquid medium 64 has been drawn into the hole 26 from the regions of alignment 110 and influence 112 under the vacuum pressure, and no other liquid medium 64 is available to be drawn into the hole 26 under the pressure differential, continued application of the pressure differential to the hole 26 draws air through the hole 26. The drawn air forces the liquid medium 64 in the holes to evacuate the hole 26 through the flow path defined by the interstices. Because the electrically conductive material is at least substantially nonporous, the liquid medium 64 does not enter the electrically conductive material. Rather, the liquid medium 64 evacuates the hole 26 under the pressure differential. Thus, the pressure differential applied during the filling step causes the packed particles 62 in the hole to be at least substantially dry or entirely dry with respect to the liquid medium 64.

It is appreciated that once the liquid medium has vacated the hole 26, the resulting packed electrically conductive particles 62 can be in contact with each other so as to define a first or initially packed powder 63 of a first fill 65. The first or initially packed powder 63 can be configured as a bulk fill as described herein. It should be recognized that when the liquid medium 64 has evacuated the hole, the surface charge of the particles 62 is no longer neutralized by the liquid medium 64. Accordingly, the particles 62 can agglomerate to each other, so that the particles 62 in the hole 26 defines a volume of packed particles.

In one example, the filling step 46 can include the step of causing additional suspension 60 to be brought into one or both of the region of alignment 110 and the region of influence 112. The additional suspension 60 can increase the volume of particles 62 that becomes packed in the hole 26. For instance, the additional suspension 60 can cause the hole 26 to be filled substantially in its entirety with the particles 62. Alternatively, the additional suspension 60 can increase the volume of the particles 62 in the hole to a volume less than the volume of particles 62 sufficient to substantially fill the hole, but greater than the volume of particles 62 that become packed in the hole 26 without the causing step.

For instance, referring now to FIGS. 6A and 13A-13C, the causing step can include the step of rocking the substrate 20 so as to angulate the substrate 20 back and forth in one or more planes of angulation. In particular, the causing step can include the step of rocking the fluid pressure fill apparatus 82 including the substrate 20 back and forth. The rocking step can cause the suspension 60 on the outer surface 99 of the substrate 20 to flow across the outer surface 99. Thus, quantities of the suspension can flow into one or both of the region of alignment 110 and the region of influence 112 of the hole 26. As the substrate 20 is continuously rocked, additional quantities of the suspension 60 can replace quantities of suspension that have flowed into the hole 26 from one or both of the region of alignment 110 and the region of influence 112. A rocker member 209 can be actuated to apply the rocking step. It is recognized that the substrate 20 can be rocked manually by manually actuating the rocker member. Alternatively, the vacuum fill apparatus 84 can define a rocking platform that supports the substrate 20 directly or indirectly, and is configured to rock the substrate 20 automatically. It is appreciated that the fluid pressure fill apparatus 82 can include a dam 116 that captures the suspension 60 and prevents the suspension 60 from flowing off of the substrate 20 as the substrate 20 is rocked. The dam 116 can be defined by the at least one gasket 94 in one example. For instance, the at least one gasket 94 can be defined by the at least one gasket that seals the first interface 102 as described above with reference to FIG. 5. The dam 116 can extend up with respect to the substrate 20 at a sufficient height so as to prevent the suspension from spilling off the dam 116 during the step of rocking the substrate 20.

Figure 13D:
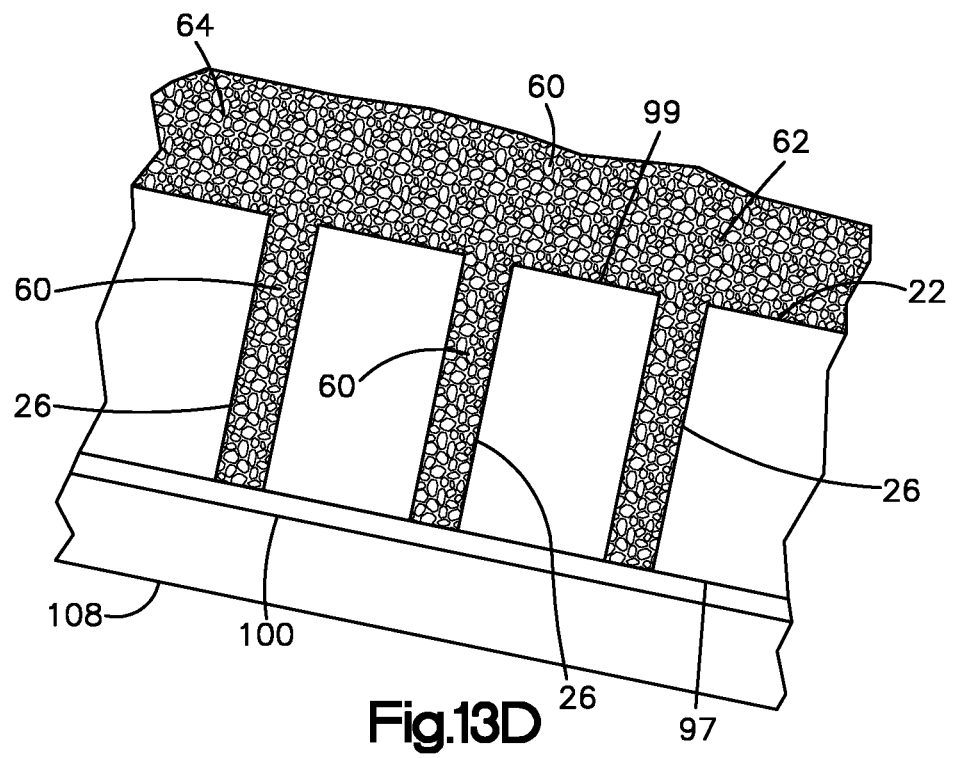
FIG. 13D shows a method of delivering the suspension to holes of the substrate during a filling operation in another example.

Alternatively, referring now to FIG. 13D, the causing step can include the step of causing the suspension to cross-flow fill into the holes 26. In particular, the suspension 60 can be applied to the outer surface 99 of the substrate 20 at a location laterally spaced from the holes 26. The substrate 20 can then be tilted, which causes the suspension 60 to flow across the outer surface 99 and sequentially over the holes 26. As the suspension 60 flows over a first hole 26, a volume of the suspension 60 can flow into the first hole 26. The suspension 60 then flows over a second hole 26 adjacent the first hole 26 so as to cause a volume of the suspension 60 to flow into the second hole 26. Accordingly, the tilting of the substrate 20 can cause the suspension to sequentially flow over the holes 26. The suspension can flow into the holes 26 under gravitational forces. In this regard, the suspension can flow into the holes 26 under gravitational forces as the substrate 20 is rocked as described above with respect to FIGS. 13A-13C. Alternatively, tilting the substrate 20 can cause the suspension to enter the region of influence, where it can be drawn into the hole. For instance, as the suspension 60 flows over a given hole 26, the hole can be filled with the suspension 60 under forces applied to the suspension arising from the pressure differential in the manner described above. Further, as described above, after the causing steps of FIGS. 13A-13D have completed, continued application of the vacuum pressure to the hole 26 draws air into the hole 26, thereby at least substantially drying the hole 26.

Figure 8A:
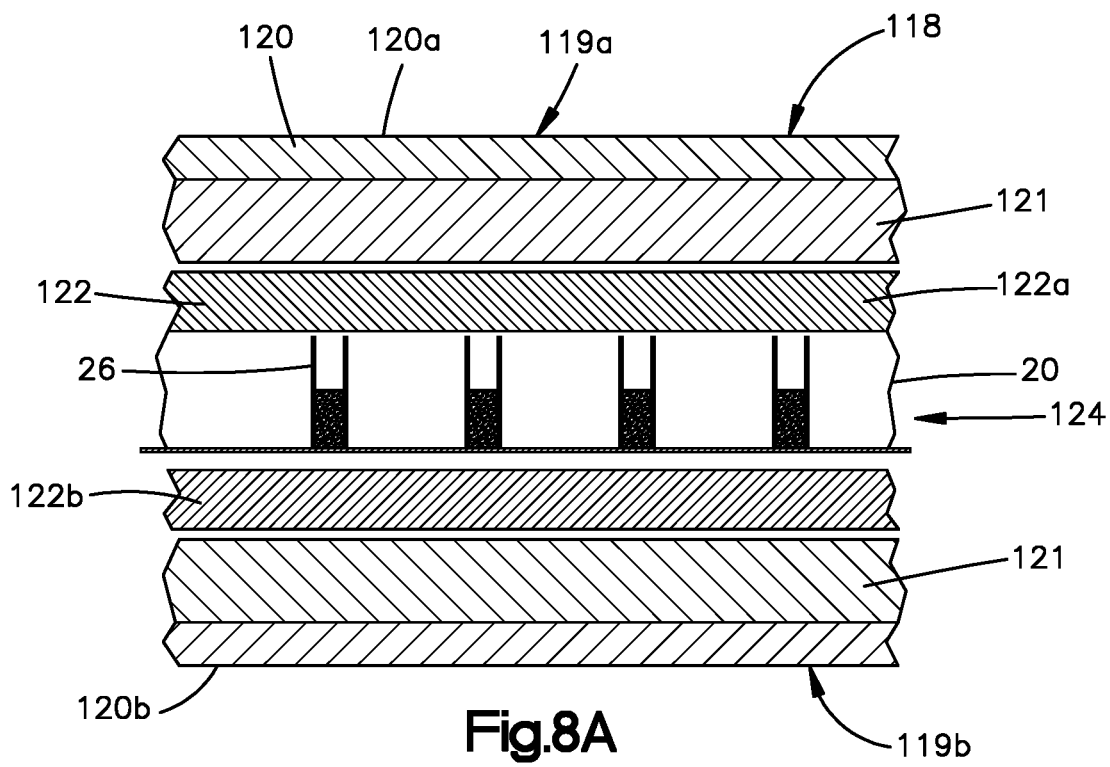
FIG. 8A is a schematic sectional view of the substrate shown disposed in an envelope that is configured to compress the particles after a filling operation and removal of the liquid medium.
Figure 8B:
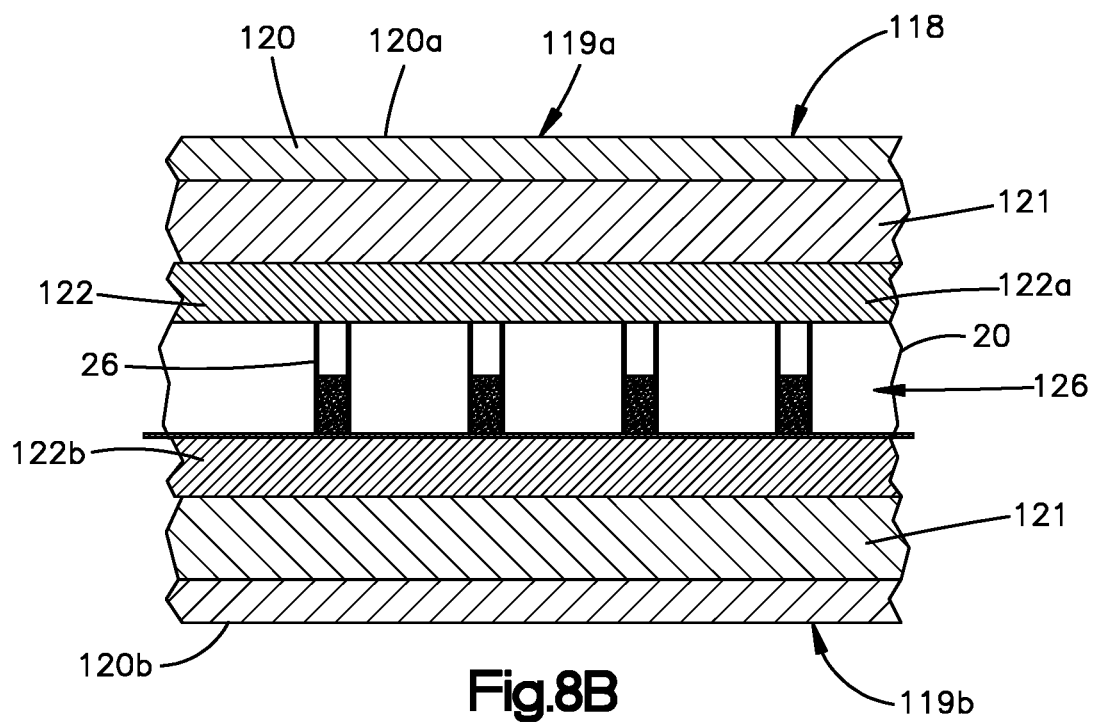
FIG. 8B is a schematic sectional view of the substrate disposed in the envelope illustrated in FIG. 8A, showing the envelope in surface contact with the substrate.

As illustrated in FIG. 3, once the liquid medium has been removed from the hole 26 during the step of filling the holes 26, the packing density of the particles 62 that were drawn into the hole 26 in the immediately preceding filling step 46 can be increased at compacting step 50. Thus, a step of compacting the particles 26 in the hole can be performed. In one example, referring now to FIGS. 8A-8B, the substrate 20 can be placed in an envelope 118. The envelope 118 includes a first laminate 119a and a second laminate 119b spaced from the first laminate 119a so as to define an internal space 124 that is size and configured to receive the substrate 20.

In particular, the first laminate 119a can include a first outer sheet 120a and a first inner layer 122a. The second laminate 119b can include a second outer sheet 120b and a second inner layer 122b. The first and second inner layers 122a and 122b face each other, and thus face the substrate 20 when the substrate 20 is disposed in the internal space. As will be appreciated from the description below, the first and second inner layers 122a and 122b can be referred to as first and second compaction members, respectively, that are configured to apply pressure to the dry initially packed powder 63 that further packs the dry initially packed powder 63 into highly packed powder 77 whose particles 62 that are pressed together more than when the particles 62 are packed particles after the filling and removing step 46 and before the compacting step 50. In particular, the first and second inner layers 122a and 122b can be sufficiently flexible so as to extend into the respective holes 26 to pack the particles 62. In this regard, the envelope 118 can be referred to as a soft pack envelope. Similarly, the compacting step 50 can be referred to as a soft compacting step. It will be appreciated that the density of particles 62 in the holes 26 after the compacting step 50 can be greater than after the filling step 46 and prior to the compacting step 50. In this regard, compacting step 50 can also be referred to as a densification step.

The internal space 124 is sized and configured to receive the substrate 20 after the step of removing the liquid medium 64 from the holes 26. Thus, the inner layers 122 face respective opposed surfaces of the substrate 20. The outer sheets 120 are nonporous with respect to air and flexible, and can surround the inner layers 122. Accordingly, when the first and second laminates 119a and 119b are the fused to each other so that the internal space 124 is fully enclosed so as to define an enclosure 126, air is unable to enter the enclosure 126.

In one example, respective portions of the first and second laminates 119a and 119b can be sealed to each other so as to partially define the enclosure 126. The substrate 20 can then be placed in the internal space 124 prior to forming the enclosure 126 such that the inner surface 97 faces one of the first and second inner layers 122a and 122b, and the outer surface 99 faces the other of the first and second inner layers 122a and 122b. Next, a vacuum is applied to the internal space 124 of the enclosure 126 to remove the air from the internal space 124, and the first and second laminates 119a and 119b can be sealed, for instance heat-sealed, to each other so as to define the enclosure 126 under vacuum. When the envelope 118 is placed under vacuum, the inner layers 122a and 122b can lay flat against respective ones of the inner and outer surfaces 97 and 99 of the substrate 20 can extend over the holes 26. Further, the first inner layer 122a and the second inner layer 122b can lie against any overfilled particles 62 that are filled beyond one or both of the surfaces 97 and 99.

Figure 8C:
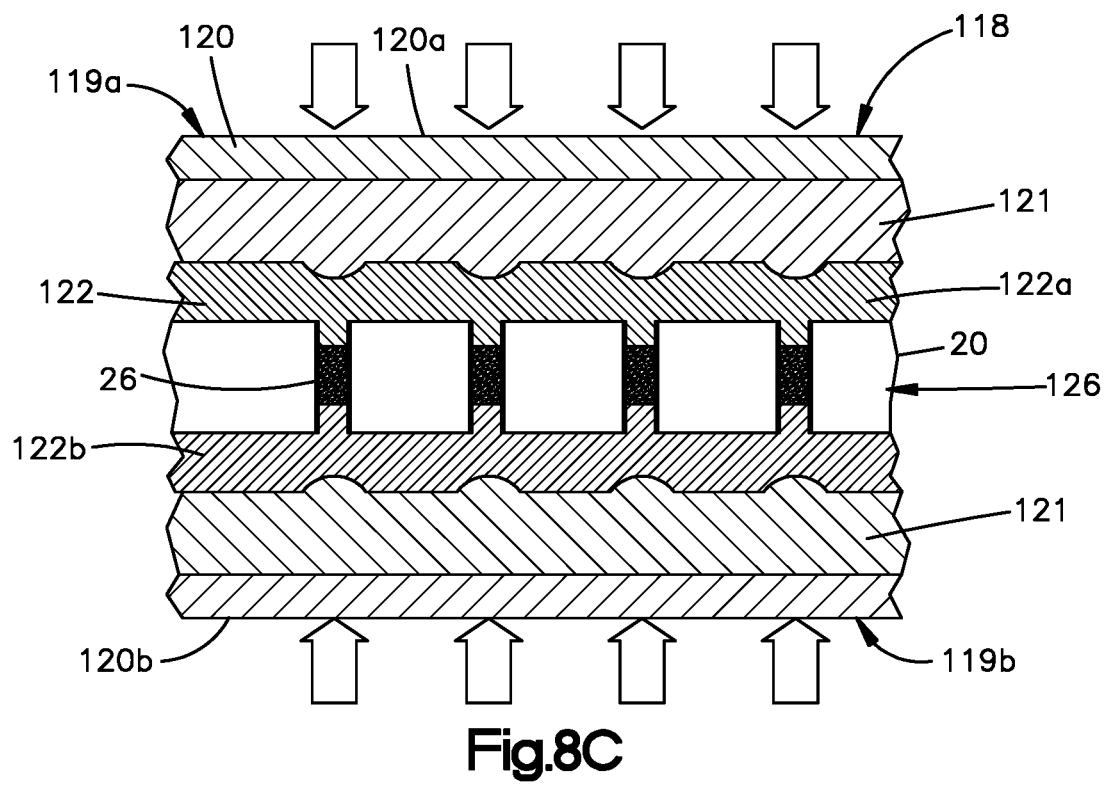
FIG. 8C is a schematic sectional view of the substrate disposed in the envelope as illustrated in FIG. 8B, but showing the envelope under pressure during a pressing operation to densely pack the particles in the holes of the substrate.

Accordingly, referring now to FIG. 8C, the envelope 118 can be placed in a press 128 that is configured to apply sufficient external pressure to the envelope 118 that causes the envelope 118 to densify the particles 62 of the initially packed powder 63. For instance, the press 128 can be an isostatic press that applies an isostatic pressure to the laminate. Thus, the compacting step 50 can be referred to as an isostatic compacting step. The isostatic pressure can be applied to the outer sheets 120a and 122a, which in turn applies the isostatic pressure to the inner layers 122a and 122b. The isostatic pressure can be in the range of approximately 5000 pounds per square inch (PSI) to approximately 60,000 PSI. For instance, the isostatic pressure can be in the range of approximately 20,000 PSI to approximately 50,000 PSI. In one example, the isostatic pressure can be in the range of approximately 25,000 PSI to approximately 40,000 PSI.

The pressure of the isostatic press applied to the envelope 118 can drive the inner layers 122a and 122b to enter opposite ends of the holes 26 under the isostatic pressure, thereby further compacting the particles 62 of the initially packed powder 63 achieved during the filling step 46 to a highly packed powder 77 whose particles 62 that are more tightly packed than the packed particles 62. Thus, it can be said that the pressure densifies the particles 62 in the hole 26. In particular, the isostatic pressure drives the inner layers 122a and 122b to densify the packed powder 63. It should be appreciated that when the initially packed powder is further packed into highly packed powder, the distance along the length of the hole 26 that is occupied by the particles of the highly packed powder decreases with respect to the distance that is occupied by the particles of the initially packed powder. That is, the particles 62 can compress longitudinally in the hole 26.

The isostatic pressure can be applied at room temperature. In this regard, the isostatic press can be referred to as a cold isostatic press (CIP). Alternatively, the isostatic press can be configured as a warm isostatic press (WIP) that can configured to apply the isostatic press at a temperature that can be in a range from approximately 120 C to approximately 250 C for a time period sufficient to cause the particles 62 to deform and further densify. That is, the substrate 20 and the electrically conductive particles 62 can be heated during the compaction step. The compaction step under WIP can displace the anti-agglomerating agent described above so as to promote metal-on-metal contact between the adjacent particles 62, both of the bulk fill when the bulk fill is compacted, and of the final fill when the final fill is compacted.

Without being bound by theory, it is believed that the inner layers 122a and 122b can cause the outer ends of the initially packed powder 63 to densify more than the intermediate portion of the initially packed powder 63 that extends between the outer ends. Further, referring also to FIG. 6B, the inner layers 122a and 122b can drive the initially packed powder 63 of the first filling step 46 to move in the hole 26 toward the center of the hole 26. Thus, initially packed powder 63 can be driven to substantially the center of the hole 26 with respect to the overall length of the hole 26 as illustrated in FIG. 6B. Subsequent pressing steps of subsequent fills can drive the resulting subsequent packed powder 79 against the powder that was drawn into the hole 26 during a previous filling step 46, also referred to as prior powder. The prior powder can be defined by one or both of the first filling step 46 and, if desired, a first compacting step 50. Alternatively, the prior powder can be defined by one or both of a subsequent filling step 46 and, if desired, a subsequent compacting step 50.

In one example, the inner layers 122a and 122b can apply substantially equal amounts of pressure to each end of the holes 26 as they extend into opposed ends of the hole 26. Accordingly, the initially packed powder 63 that is disposed off-center with respect to the length of the hole 26 can be contacted by the respective one of the inner layers 122a and 122b, driven toward the center of the hole 26, and pressed between the inner layers 122a and 122b. Subsequent initially packed powders are pressed against previously pressed highly packed powders. Thus, one of the inner layers 122a and 122b contacts the outer end of a previously pressed highly packed powder, and the other of the inner layers 122a and 122b contacts the outer end of the subsequent initially packed powder, thereby highly compacting the subsequent initially packed powder into highly packed powder. As the initially packed powders are packed longitudinally by the inner layers 122a and 122b, it should be appreciated that the initially packed powders can expand radially as they are packed into highly packed powders, thereby compressing the respective particles 62 against the inner wall of the substrate 20 that defines the hole 26.

The inner layers 122a and 122b can be made of any suitable material as desired. In one example, the inner layers 122a and 122b can be made of a viscoelastic material and thus configured to enter the holes 26 so as to compress the particles 62 disposed therein. For instance, the inner layers 122a and 122b can distribute the isostatic pressure uniformly across the substrate, such that the inner layers 122a and 122b conform to the outer surfaces 22 and 24 of the substrate 20 and extend into the holes 26. Thus, the inner layers 122a and 122b can mechanically pack the initially packed powder 63 into a highly packed powder. It is therefore desirable that the inner layers 122a and 122b are made from a material that does not adhere to the particles 62, such that when the isostatic pressure is removed, the inner layers 122a and 122b can be removed from the holes 26 without pulling the particles 62 out of the holes 26. In one example, the inner layers 122a and 122b can be made of Mylar. In another example, the inner layers 122a and 122b can be made of Teflon. The outer layers sheets 120a and 120b can be made of any suitable nonporous material. For instance, the outer sheets 120a and 120b can be made of a flexible metal such as aluminum.

In one example, the outer sheets 120a and 120b can include a fusion material 121 such as mylar coated to their respective inner surfaces if desired. The fusion material 121 can fuse to itself to create the vacuum enclosure 126. The inner layers 122a and 122b can be separate from the outer sheets 120a and 120b, and placed between the outer sheets and the substrate 20. Alternatively, the inner layers 122a and 122b can line the outer sheets 120a and 120b as desired.

It should therefore be appreciated that the vacuum in the enclosure 126 is sufficient so as to cause the inner layers 122a and 122b to lay flat against the inner and outer surfaces 97 and 99 alone or in combination with the overfill. Accordingly, it will be recognized that any suitable apparatus that causes the inner layers 122a and 122b to lay flat against the inner and outer surfaces 97 and 99, alone or in combination with the overfill, prior to applying the isostatic pressure to the inner layers 122a and 122b either directly, or indirectly through the outer layers, uniformly as described herein is contemplated. The inner layers can therefore be referred to as compaction members that are configured to be driven into the holes 26 of the substrate 20 so as to highly pack the initially packed powder 63 into highly packed powders disposed therein.

Referring now to FIGS. 3 and 6B, the step of increasing the packing density 50 is completed once the isostatic pressure has been removed from the compaction members. Once the step of increasing the packing density has been completed, a first filling and compacting sequence 55 has likewise been completed. It is appreciated, however, that in certain examples, the step 50 can be omitted. Instead, a step of pressing the substrate 20 to pack the particles 62 can be performed at step 53 as described in more detail below. Still in other examples, both steps 50 and 53 can be performed during the method 40. Further, it should be appreciated that the step of isostatically pressing the particles 62 can be performed at a plurality of instances between a plurality of sequential iterations, respectively, of filling the holes at step 46.

Referring to FIG. 6B-7C, it is recognized that the particles 62 after the first fill step 46, and optionally after the first compacting step 50, can define a bulk fill that extends along only a portion of the hole 26 in some examples. In other examples, the bulk fill can extend along a substantial entirety of the hole 26. When the bulk fill extends along only a portion of the hole, the particles 62 can occupy a length of the hole 26 that is less than an entirety of the length of the hole 26, thereby defining longitudinal distances that are measured from the bulk fill to each of the first and second surfaces 22 and 24 of the substrate 20. If each of the distances is greater than a predetermined distance, then a subsequent sequence 55 is performed to fill the hole 26 with additional bulk fill until the distances reach the predetermined distance. If each of the distances is less than or equal to the predetermined distance, a final fill can be introduced into the hole 26 from the bulk fill to the first and second ends, respectively, of the hole 26. The distances can be determined after a filling step 46 is performed. Alternatively, the distances can be determined after a compacting step 50 is performed that compacts the final fill, and further compacts the final fill against the bulk fill which may have been compacted during a previous compacting step.

Alternatively still, it is recognized that the particles 62 of the bulk fill can extend from the first end of the hole 26 to the second end of the hole after the first compacting step 50 in some examples. Accordingly, the bulk fill can extend substantially from the first surface 22 of the substrate 20 substantially to the second surface 24 of the substrate 20. For instance, the bulk fill can extend from the holes 26 beyond one or both of the first surface 22 and the second surface 24 of the substrate 20. Thus, a single filling step 46 can fill the holes 26 such that the electrically conductive particles 62 extend continuously through the holes and can extend from the hole beyond each of the first and second surfaces 22 and 24 of the substrate 20. As will be appreciated from the description below, the particles 62 can subsequently be compacted inside the holes 26, and against one or both of the first surface 22 and the second surface 24 during the pressing step 53 described in more detail below.

In one example, the predetermined distance can be in the range from approximately 1 micron to approximately 30 microns. In one example, the range can be from approximately 1 micron to approximately 20 microns. For example, the range can be from approximately 1 micron to approximately 10 microns. For instance, the range can be from approximately 2 microns to approximately 6 microns. In one example, the predetermined distance can range from approximately 0.5% of the total length of the hole 26 to approximately 25% of the total length of the hole 26. For instance, the range can be from approximately 0.5% of the total length of the hole 26 to approximately 20% of the total length of the hole 26. For instance, the range can be from approximately 0.5% of the total length of the hole 26 to approximately 15% of the total length of the hole 26. For instance, the range can be from approximately 0.5% of the total length of the hole 26 to approximately 10% of the total length of the hole 26. For instance, the range can be from approximately 0.5% of the total length of the hole 26 to approximately 5% of the total length of the hole 26. For instance, the range can be from approximately 1% of the total length of the hole 26 to approximately 4% of the total length of the hole 26.

Figures 9A, 9B:
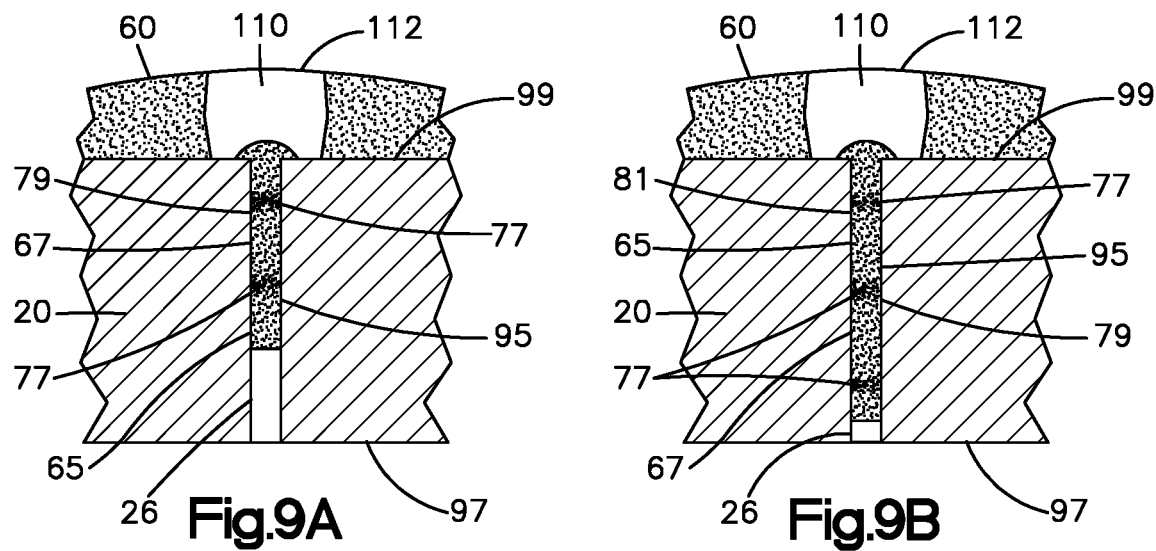
FIG. 9A is a schematic side elevation view of a portion of the substrate illustrated in FIG. 6A, shown after a subsequent fill operation using the vacuum fill apparatus illustrated in FIG. 5.
FIG. 9B is a schematic side elevation view of a portion of the substrate illustrated in FIG. 9A, shown after pressing the subsequent fill, and adding a third fill operation using the vacuum fill apparatus illustrated in FIG. 5.

When the distances have reached the predetermined size or range of sizes, at least one final sequence 55 of filling and pressing steps can be performed. Thus, the particles 62 that enter the hole 26 during the final filling step 46 of the final sequence 55 can be referred to as a final fill as illustrated in FIG. 9B. The final fill is intended to occupy a portion of the hole 26 that extends from the bulk fill to the first and second terminal ends of the hole 26. When the hole 26 is a through hole, the final fill is intended to extend from the bulk fill to each of the first and second surfaces 22 and 24 of the substrate 20. The particles 62 of the bulk fill can be defined by the first particles 62a that are configured and intended to extend along a majority of the length of the hole 26. The particles 62 of the final fill can be defined by the second particles 62b, though it is appreciated that other sized particles are contemplated for the final fill. Thus, in one example, the hole 26 can be filled with both the bulk fill and the final fill.

As illustrated in FIG. 9A, when each of the distances is greater than the predetermined distance, a subsequent filling step 46 is performed in the manner descried above so as to produce initially packed powder 63 from a subsequent fill 67 of the subsequent filling step 46. The subsequent filling step 46 can be a bulk filling step. The subsequent compacting step 50, if performed, can produce highly packed powder 77 from the subsequent fill 67 as shown in FIG. 9B. The highly packed powder can be more packed than after the first filling step, and optionally the first compacting step 50. Thus, as described above with reference to the first filling step, the subsequent filling step begins at step 46 whereby a subsequent filling step 46 is performed in the manner described above with respect to the first filling step, as illustrated at FIG. 9A. In particular, the inner surface 97 of the substrate 20 is placed against the filter media 100 in the manned described above.

Referring to FIG. 9A, the highly packed powder 77 of the first fill 65 can provide a plug 95 that allows air and liquid medium 64 to pass through, but does not allow the first particles 62a to pass through. In particular, when the particles 62 in the hole 26 define the monomodal distribution 70 described above, the particles 62 define the interstices 66. Alternatively, when the particles 62 of the first fill 65 define the bimodal distribution 72, then the particles 62 can define the first and second bimodal interstices 66 and 75, respectively, as described above. Alternatively still, when the particles 62 of the first fill 65 define the trimodal distribution 73, then the particles can define the first, second, and third trimodal interstices 66, 75, and 69, respectively, as described above. It is recognized in certain examples that the interstices of the first fill 65 can be sized smaller than the first particles 62a. Accordingly, the plug 95 can be said to define an internal filter in the hole 26 that is nonporous with respect to the first particles 62a. The plug 95 can be defined by highly packed powder 77, or can be defined by the first particles 62a that were drawn into the hole 26 during the first filling step 46. The interstices of the internal filter are large enough so as to be porous with respect to fluid and air. Accordingly, it is contemplated that the particles 62 that flow into the hole 26 in a subsequent filling step 46 be prevented by the internal filter defined by the first particles 62a from traveling through the hole 26 to the filter media 100 that underlies the substrate 20. However, it may still be desirable to include the filter media 100 as a barrier to protect the support member 108 (see FIG. 5) from stray particles that may nevertheless flow through the hole 26. The filter media 100 of the subsequent compacting step may, in some example, be more coarse than the filter media 100 of the first compacting step.

It should be appreciated, referring now to FIG. 9A, that the inner surface 97 of the substrate during a first subsequent filling step 46 can be defined by the same one of the first and second surfaces 22 and 24 that defined the inner surface 97 during an immediately preceding filling step, which can be the first filling step as shown, or alternatively a subsequent filling step. Similarly, the outer surface 99 can be defined by the same one of the first and second surfaces 22 and 24 that defined the outer surface 99 during the immediately preceding filling step. Alternatively, the substrate 20 can be flipped with respect to the immediately preceding filling step, such that the inner surface 97 is defined by the other one of the first and second surfaces 22 and 24. Similarly, the substrate 20 can be flipped with respect to the immediately preceding filling step, such that the outer surface 99 is defined by the other one of the first and second surfaces 22 and 24.

Accordingly, during the first subsequent filling step, the vacuum pressure can cause the suspension 60 to flow into the same one of the first and second ends of the hole 26 as the immediately preceding filling step. Alternatively, the substrate 20 can be flipped such that the vacuum pressure causes the suspension 60 to flow into the opposite one of the first and second ends of the hole 26.

As illustrated in FIG. 9A, the first subsequent filling step 46 can be performed such that subsequently packed powder 79 of the subsequent fill 67 of the first subsequent filling step 46 overfills the hole 26. That is, the particles 62 of the subsequently packed powder 79 are filled beyond one of the first and second surfaces 22 and 24. It is recognized, however, that the subsequent compacting step 50, if performed, packs the subsequently packed powder 79 into subsequently highly packed powder. Thus, the distance along the length of the hole 26 that is occupied by the subsequently highly packed powder decreases with respect to the distance that is occupied by the particles 62 of the subsequently packed powder 79 after the subsequent filling step 46 but before the subsequent compacting step 50. That is, the particles 62 can compress longitudinally during the subsequent compacting step 50, if performed. Accordingly, even when the particles 62 are overfilled (meaning extending filled beyond one or both of the first and second surfaces 22 and 24) prior to compacting, it is recognized that the subsequently highly packed powder defined by the subsequent fill 67 after the subsequent compacting step 50 can be recessed with respect to the respective outer surface of the substrate 20 as shown in FIG. 9B, thereby defining the distance described above.

Figure 9C:
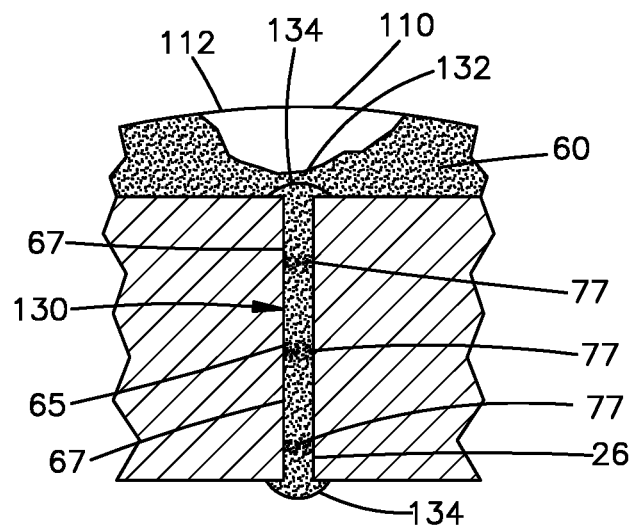
FIG. 9C is a schematic side elevation view of a portion of the substrate illustrated in FIG. 9A, shown after second and third fill operations.

Once the first subsequent filling step 46 has been performed at one end of the hole 26 as illustrated in FIG. 9A so as to define the subsequently packed powder 79, the subsequent packed powder 67 can be subsequently packed at step 50 into highly packed powder 77 as shown in FIG. 9B if desired. Thus, the electrically conductive material can include regions of highly packed powder 77 that are spaced from each other along the hole, and along the resulting via. Alternatively, the compacting step 50 can be omitted, such that the particles 62 that extend at least to (and potentially past) the one end of the hole 26 can remain as subsequently packed powder 79 without being highly packed. Next, as shown at FIG. 9B, the substrate 20 can be flipped with respect to FIG. 9A, and a second or opposite subsequent filling step 46 can be performed at the opposite end of the hole 26 so as to define a second or opposite subsequently packed powder 81 that extends to, and potentially past, the opposite end of the hole 26. Next, if desired, an opposite subsequent compacting step 50 can be performed to pack the opposite subsequently packed powder 81 into highly packed powder 77 if desired. Thus, the first or initially packed powder 63 of the first fill 65 can be disposed between the subsequently packed powder 79 and the opposite subsequently packed powder 81. Any one or more up to all of the first or initially packed powder 63, the subsequently packed powder 79, and the opposite subsequently packed powder 81 can define highly packed powder 77 if desired. As illustrated in FIG. 9C, the particles 62 of the first fill 65 and the subsequent fills 67 can combine to define bulk fill 130.

Referring now to FIGS. 9C and 12A, when the distances described above are within the predetermined distance, a final filling step 46 can be performed at each end of the hole 26. That is, a first final filling step 46 can be performed at a first end of the hole 26, such that the particles 62b of the second suspension extend from the bulk fill to the first surface 22, and in some cases beyond the first surface 22. Subsequently, as described in more detail below, the substrate 20 can be flipped to perform a second final filling step whereby 46 whereby the particles 62b of the second suspension extend from the bulk fill to the second surface 24, and in some cases beyond the second surface 24.

At least one final filling step 46, which can include the first final filling step and the second final filling step, can thus use the second suspension 60b as desired. The particles 62b of the second suspension 60b can define a final fill. Alternatively, the first suspension 60a can be used for the final filling step 46. Thus, while the final filling step 46 is described below in connection with the second suspension 60b, the description can apply equally to the first suspension 60a. The final filling step 46 can be performed after the first filling step 46, or after one or more subsequent filling steps 46. Alternatively still, if the first filling step 46 causes the particles 62 to extend beyond the first and second surfaces 22 and 24 of the substrate 20 and the compacting step 50 is omitted, the final filling step 46 can be omitted.

The suspension 60 used during the final fill steps can be defined by the second suspension 60b or any suitable alternative suspension as desired, to produce a finally packed powder 132. During the first final filling step 46, a first final suspension 60 can be filled at one end of the hole 26 so as to define a first final fill. The vacuum forces can evacuate the liquid of the suspension 60 in the manner described above. During a second or opposite final filling step 46, a second or opposite suspension 60 can be filled at the opposite end of the hole 26 so as to define a second final fill, whereby the vacuum forces can evacuate the liquid of the suspension 60. The particles 62 of the final fill can be defined by the second suspension 60b or, alternatively, the first suspension 60a as described above. The first final fill can be overfilled in the hole 26 so as to be filled beyond the outer surface 99 of the substrate 20, which can be defined by the first outer surface 22 or the second outer surface 24. A first final compacting step 50 can then be applied to the first final fill if desired to pack the finally packed powder 132 to highly packed powder 77 of the final fill 134, as illustrated in FIG. 12B. In this regard, it is appreciated that the highly packed powder 77 of the final fill 134 can be overfilled with respect to the hole 26 either or both of before the compacting step and after the compacting step.

Next, the substrate 20 can be flipped and the second or opposite final filling step can fill the opposite end of the hole with a second final suspension so as to produce an opposite finally packed powder, or second final fill, at the opposite end of the hole 26. The particles of the second final suspension can be packed at step 50 to produce highly packed powder of the final fill 134 shown in FIG. 12B that is substantially planar and/or substantially flush with the first and second surfaces 22 and 24. The term "substantially" in the context of planar and flush with the first and second surfaces 22 and 24 recognize that minor variations can exist from perfect planarity and perfectly flush, but would be understood by a skilled artisan as flush for the purposes of future patterning and subsequent use. Alternatively, as described above, the compacting step 50 can be omitted. Alternatively, if the first final fill is not packed at the compacting step 50, the compacting step 50 can be performed after the second or opposite final filling step 46 so as to produce highly packed powder from the finally packed powder of both the first and second final filling steps 46. The opposite packed powder 77 of the final fill can likewise be overfilled in the hole 26 after the final filling step 46, and further after the compaction step as desired.

It is recognized that the packed bulk fill 130 and the packed final fill 134, whether packed at step 50 or not, can combine so as to define the fill 35 of the via 34. Thus, the fill 35 can be said to be defined by the electrically conductive material.

Once the final compacting step has been performed, excess particles can be removed from the substrate 20. In this regard, it can be said that a first final fill extends from the bulk fill to the first surface 22 of the substrate 20, and can be overfilled such that an excess first final fill extends out beyond the first surface 22. Alternatively or additionally second final fill extends from the bulk fill to the second surface 22 of the substrate 20, and can be overfilled such that an excess second final fill extends beyond the second surface 24. Thus, one or both of the excess first final fill and an excess of the second final fill can be removed after the final compaction step and before sintering the particles, so as to substantially planarize the first and second final fills. For instance, a wand can be driven across the first surface 22 of the substrate 20 to remove the excess first final fill, and across the second surface 24 of the substrate to remove the excess second final fill. The wand can have a hardness greater than the final fill, and less than the substrate 20. In one example, the wand can be a rubber wand. In another example, the wand can be a Teflon wand. Next, the particles 62 in the hole 26 can be substantially non-densification sintered to produce an electrically conductive via 34, as described in more detail below.

It is recognized that the density of particles 62 in the hole 26 of the highly packed powder 77, if applicable, of the first fill 65 is greater than the density of particles 62 in the hole of the initially packed powder 63 of the first fill 65. It is further recognized that the density of particles 62 in the hole 26 of the highly packed powder 77, if applicable, of the subsequent fills 67 is greater than the density of particles 62 in the hole of the subsequently packed powder 63. Similarly, it is recognized that the density of particles 62 in the hole 26 of the highly packed powder 77 of the final fills 134, if applicable, is greater than the density of particles 62 in the hole of the finally packed powder 132.

Referring now to FIG. 10, it is recognized that the subsequent filling steps 46 can be performed by subsequently filling one side of the hole with particles 62, flipping the substrate 20, and subsequently filling the opposite side of the hole with particles without compacting the particles at step 50 after the first subsequent filling step 46. Then the compacting step 50, if performed, can pack the first and second subsequently filled particles 62 at both ends of the hole 26 simultaneously.

In this regard, the vacuum apparatus 84 can define a suspended vacuum apparatus 85. In particular, the suspended vacuum apparatus can be constructed as described above with respect to the vacuum apparatus 84 of FIG. 5. However, the gasket 94 of the suspended vacuum apparatus 85 can extend across an interface between the shelf 96 and the support member 108. The gasket 94 can be spaced from the outer surface of the support member 108. Thus, the substrate 20 can be placed onto the outer surface of gasket 94. Accordingly, the region of alignment of the substrate 20 that defines the holes 26 can be suspended over the support member 108. Thus, an air gap 136 can be defined between the substrate 20 and the support member 108. In particular, the substrate 20 and the support member 108 can be spaced from each other along the same direction as the elongation of the holes 26.

The gap 136 can be sufficient to accommodate the overfill of the powder particles 62 that can be produced during the final filling step 46, such that the overfill that faces the support structure 108 does not contact the support structure 108. As discussed above, when the liquid medium 64 has evacuated the hole, the remaining particles 62 can be referred to as a dry packed powder. Further, because the surface charge of the particles 62 is no longer neutralized by the liquid medium 64, the particles 62 can agglomerate to each other. Thus, the agglomerated particles do not fall out of the hole 26 and into the gap 136 prior to being packed into highly packed powder. If desired, the filter media 100 can be placed over the support member 108 so as to protect the support member 108 from any stray particles 62 that escape through the hole 26 during the filling step 46. The filter media 100 can extend across the support member 108 and into the interface between the gasket 94 and the support member 108 as desired.

During operation, referring to FIG. 11, at least one gasket seals a first interface 102 between substrate 20 and the support member 108, or alternatively between the substrate 20 and the filter media, with respect to airflow therebetween. The at least one gasket can further seal a second interface between the support member 108 and the shelf 96 with respect to airflow therebetween. The gasket 94 can support the perimeter of the substrate 20 at the exclusion zone described above. Further, portions of the gasket 94 or other auxiliary support member can extend between the support member 108 and the substrate 20 so as to support a middle region of the substrate 20, which is likely to experience elevated forces from the applied negative pressure.

The suspension 60 is applied to the outer surface 99 of the substrate 20 until the respective end of the hole 26 is filled with particles as described above. The liquid medium 64 is evacuated from the hole 26 in the manner descried above. Next, the substrate is flipped such that the previously inner surface 97 now defines the outer surface 99, and the suspension is again applied to the outer surface 99, and the respective hole is filled with particles. If the subsequent fill process is a bulk fill process, then both the first and opposite subsequently packed powders can be filled without performing the compacting step 50 between the steps of filling the first subsequently packed powder and filling the opposite subsequently packed powder. Next, the substrate 20 can be packed at step 50 in the manner described above, if desired. The compacting step 50 can cause both the first subsequently packed powder and the opposite subsequently packed powder to be packed into respective highly packed powders. Alternatively, the compacting step 50 of the subsequent fill process can be omitted. Alternatively still, if the subsequent fill process is a final fill process, then both the first and opposite finally packed powders 132 can be filled without performing the compacting step 50 between the steps of filling the first finally packed powder and filling the opposite finally powder. After the final filling step 46, the substrate 20 can be packed at step 50 in the manner described above, which causes the both the first finally packed powder and the opposite finally packed powder to be packed into respective highly packed powders 77 as illustrated at FIG. 12A.

It is therefore recognized that the suspended vacuum apparatus 85 can be used to fill the holes 26 with both the first and second or opposite subsequently packed powders prior to compacting the particles 62 at step 50. If the compacting step 50 is performed, both the first and opposite subsequently packed powders can be packed into highly packed powders simultaneously during step 50. Alternatively, as described above, the compacting step 50 can be omitted. Alternatively or additionally, it is envisioned that the suspended vacuum apparatus 85 can be used to fill the holes 26 with first and opposite finally packed powders prior to performing the final compacting step 50. The final compacting step 50 can pack both the first and opposite finally packed powders into highly packed powders simultaneously. Alternatively, as described above, the final compacting step 50 can be omitted.

Alternatively, referring to FIG. 12C, the compacting step 50 can be omitted after the final filling step 46 has been completed. When the compacting step 50 is omitted from the method 40, the particles 62 in the hole 26 can extend substantially from the first surface 22 substantially to the second surface 24. In some examples, the particles 62 can extend beyond the first and second surfaces 22 and 24 after the one or more filling steps 46 have been completed. Further, the particles 62 can be devoid of areas of highly packed powder 77 in the holes 26 after completion of the one or more filling steps, and when the sintering step 52 (see FIG. 3) is to be performed.

Referring now to FIG. 19A, while the filling step 46 has been described as inducing air pressure to drive the suspension 60 into the holes in examples described above, it is recognized that the filling step 46 can be performed in accordance with a number of other examples. For instance, a centrifuge 150 can provide the force that drives or draws the suspension 60 into the holes 26. In one example, the holes 26 can be through holes of the type described above. Thus, the force that urges the particles 62 to flow into the holes 26 can be a centrifugal force. The centrifuge 150 can include a rotatable hub 152, at least one bucket 156 such as a plurality of buckets 156, and arms 154 that extend between the hub 152 and the buckets 156.

As illustrated in FIG. 19B, the substrate 20 can be placed in the bucket 156, such that the substrate 20 is supported by a distal wall 158 of the bucket 156. Thus, the inner surface 97 of the substrate 20 faces the distal wall 158 of the bucket 156, and the outer surface 99 of the substrate 20 faces away from the distal wall 158. The inner surface 97 can be defined by one of the first and second surfaces 22 and 24. The outer surface 99 can be defined by the other of the first and second surfaces 22 and 24. The inner surface 97 can be placed against a corresponding support surface 157 of the distal wall 158 inside the bucket 156. The support surface 157 of the bucket 156 can be planar and made of a suitable material that will allow the substrate 20 to be subsequently removed from the inner surface 157 without causing pull out of the particles disposed in the holes. Alternatively, an auxiliary support member 160 can be placed in the bucket 156 between the substrate 20 and the inner surface 157. The support member 160 can define a support surface, such that the inner surface 97 of the substrate 20 is placed against the support surface. The support member 160 can be made of any suitable material, such as glass which can be coated to prevent the support member 160 from adhering to the particles of the substrate 20 as desired. The inner surface 157 or the support member 160 can seal the inner surface 97 of the substrate 20 in order to prevent evacuation of the particles 62 out of the holes 26 at the interface between inner surface 97 of the substrate 20 and the support surface. In some examples, it is recognized that the hole can be a blind hole as opposed to a through-hole. Thus, the centrifuge 150 can cause particles to flow into the blind hole through the open end of the blind hole so as to fill the blind hole in the manner described herein with respect to the through-hole.

As illustrated in FIG. 19B, the suspension 60 can then be applied to the outer surface 99 of the substrate 20 in the bucket 156 such that the suspension covers at least a portion of the outer surface 99. As described above, the suspension 60 can be sonicated or otherwise agitated so as to disperse the particles 62 in the liquid medium 64 prior to applying the suspension to the substrates 20 in the bucket 156.

The bucket 156 can be oriented in a first orientation such that that the inner surface 157 can be oriented substantially horizontally, such that the suspension 60 does not slide off the outer surface of the substrate or otherwise pour out of the bucket. Next, referring to FIG. 19C, the buckets 156 can be pivotally attached to the arms 154. Thus, as the buckets 156 revolve around the hub 152, the buckets 156 can pivot from the first orientation to a second orientation whereby the inner surface 157 is oriented substantially vertically, or substantially perpendicular to the first orientation. The centrifuge 150 can cause the buckets 156 to revolve about the hub 152 at any suitable speed as desired. For instance, the centrifuge 150 can rotate at a speed that applies any suitable G-force as desired to drive the particles 62 into the holes 26. For instance, the g-force can be between approximately 100 and approximately 15,000 Gs. In one example, the g-force can be approximately 6,000 Gs.

As illustrated in FIG. 19D, it is recognized that the specific gravity of the particles 62 is significantly higher than that if the liquid medium 64. As a result, the centrifugal forces applied to the suspension 60 causes the particles 62 to displace the liquid medium 64 from the holes 26 and flow into the holes 26. The particles 62 in the holes 26 pack against each other under the centrifugal forces, thereby creating a packed powder 162. However, because the liquid medium 64 remains in the interstices between the particles of the packed powder 162, the packed powder 162 can be referred to as a wet packed powder. After the centrifuge operation is completed a volume of residual liquid medium 64 can remain on the outer surface 99 of the substrate 20. As illustrated in FIG. 19D, the solid content of the suspension 60 can be greater than the volume of solids that fill the holes 26, such that the residual liquid medium 64 can include a quantity of the particles 62. However, the concentration of particles 62 in the residual liquid medium 64 outside the substrate 20 after the fill operating is less than the particle concentration of the suspension 60 prior to operating the centrifuge 150. Alternatively, the particle content of the suspension 60 can be calculated to fill the holes 26 during the centrifuge operation such that substantially no particles 62 remain in the residual liquid medium 64. Once the holes 26 have been filled with the packed powder 162, the centrifuge operation is discontinued, and the residual liquid medium can be desiccated off the substrate 20 or otherwise removed from the substrate 20.

The liquid medium 64 disposed in the holes 26 can then be removed. For instance, the substrate 20 can then be placed in any suitably warm environment to cause the liquid medium to evaporate. Alternatively or additionally, air can be forced through the holes 26 so as to remove the liquid medium from the holes 26. It should be appreciated that in one example, when the filling process is performed with the centrifuge 150, the filling process 46 can be brushless. That is, the method 40 can omit any step of brushing or otherwise bringing any structure along the outer surface of the substrate 20 so as to forcibly removing excess electrically conductive material from the outer surface 99 of the substrate 20 after the filling step 46. Alternatively or additionally, referring to FIG. 9E, before or after the liquid medium 64 has been removed from the holes 26, a step can be performed to remove the residual liquid 64 from the outer surface 99 of the substrate 20. For instance, any suitable wand 103 can be driven across the outer surface 99 of the substrate 20 to remove the residual liquid 64 containing particles 62. The wand 103 can be made of any material as desired that will not pull the electrically conductive particles out of the holes 26. For instance, a Teflon or a nickel wand may be particularly suitable. Alternatively, if the residual liquid medium 64 is devoid of particles 62, the residual liquid medium 64 can be removed in the manner described above without using the wand 103.

After the filling step 46 has been performed with the centrifuge, the compacting step 50 can be performed. In one example, the compacting step 50 can be performed after removing the residual liquid medium 64 and particles 62 from the outer surface 99 of the substrate 20. In particular, the substrate 20 can be placed inside the envelope 118, and the air can be removed from the envelope 118 in the manner described above with respect to FIGS. 8A-8B, and the substrate 20 can be pressed in the press 128 as described above with respect to FIG. 8C. The compacting step 50 can further pack the particles 62 in the holes 26, thereby creating a bulk fill of dry highly packed powder as described above.

Alternatively, the compacting step 50 can be performed without first removing the residual liquid medium and particles 62 from the outer surface 99. Without being bound by theory, it is believed that if the residual liquid medium 64 and particles 62 are not first removed, a majority or a substantial entirety of the residual liquid medium 64 and particles 62 can be removed from the substrate by adherence to the inner layers 122a and 122b when the substrate 20 is removed from the enclosure after completion of the compacting step 50. Alternatively, as described above, the compacting step 50 can be omitted after the filling step 46 has been performed with the centrifuge.

In one example, after the filling step 46 using the centrifuge, it is recognized that the resulting at least one fill of particles 62 can extend along an entirety of the length of the hole 26 from the first end of the hole to the second end of the hole 26. In one example, the bulk fill of particles 62a can extend along an entirety of the length of the hole 26. Alternatively, a first filling step 46 under centrifugal forces can introduce a plurality of second particles 62b into the hole 26 so as to define a final fill that enters the hole 26 from the outer surface 99. Thus, the step introduces a first final fill into the hole 26. The centrifugal forces cause the particles to flow to the inner surface 97, and accumulate in the hole 26 toward the outer surface 99. Thus, a first final fill extends to the inner surface 97, which can be defined by the first surface 22 of the substrate 20. Next, a second filling step 46 under centrifugal forces can introduce a plurality of first particles 62a into the hole 26 from the outer surface so as to define a bulk fill that extends from the first final fill toward the second surface 24. Thus, this step introduces a bulk fill into the hole 26. A gap can be defined in the hole from the bulk fill to the outer surface 99, which can be defined by the second surface 24, of the substrate 20. Thus after the second filling step, a third filling step under centrifugal forces can introduce a plurality of second particles 62b into the hole as a second final fill. Thus, the step introduces a second final fill into the hole 26. The second final fill can extend from the bulk fill to the second surface 24. It is appreciated that the compacting step 50 can be applied to the particles in the hole 26 after the first filling step and prior to the second filling step. Alternatively or additionally, the compacting step 50 can be applied to the particles in the hole after the second filling step and prior to the third filling step. Alternatively, a single filling step can be performed that substantially fills the hole with second particles 62b.

In some examples, a first filling step can include the step of introducing the first particles 62a of the bulk fill into the hole using a gaseous pressure differential of the type described above. Then, the first and second final fills can be introduced into the hole under centrifugal forces. For instance, a first final filling step under centrifugal forces can force the first particles 62a into the hole such that they extend from the bulk fill substantially to the first surface of the substrate. A second final filling step under centrifugal forces can force the first particles 62a hole such that they extend from the bulk fill substantially to the second surface of the substrate. This may be desirable when, for instance, the bulk fill in the hole has been rendered substantially non-porous and thus not suitable for gas pressure differential filling. As will be described in more detail below, one or more metals can be deposited into the interstices of the bulk fill, which can decrease the porosity of the bulk fill.

The compacting step 50 can cause the gap to extend from the first particles 62a to the second surface 24. Alternatively, the volume of first particles 62a introduced into the hole can be predetermined to be less than the volume of the hole 26 that is not occupied by particles. Thus, the second filling step can define the gap prior to, or without, performing the compacting step 50. Alternatively or additionally, the compacting step 50 can be applied to the particles in the hole after the third filling step. The resulting hole includes a bulk fill in the hole, a first final fill that extends from the bulk fill to the first surface 22 of the substrate 20, and a second final fill that extends from the bulk fill to the second surface 24 of the substrate 20.

If desired, the substrate 20 can be vibrated during the step of introducing the at least one fill into the hole 26. For instance, the substrate 20 can be vibrated during the application of the centrifugal force of the first filling step to encourage the second particles 62b to enter the hole 26. Alternatively or additionally, the substrate 20 can be vibrated during the application of the centrifugal force of the second filling step to encourage the first particles 62a to enter the hole 26. Alternatively or additionally, the substrate 20 can be vibrated during the application of the centrifugal force of the third filling step to encourage the second particles 62b to enter the hole 26.

Further, the particles 62 can extend beyond one or both of the first and second surfaces 22 and 24 of the substrate 20. For instance, one or both of the inner surface 97 and surface of the support member 160 that faces the inner surface 97 can be precoated with the suspension 60 prior to performing the step of filling 46 under centrifugal forces, thereby creating the overfill at the inner surface 97. The precoated suspension 60 can include the second particles 62b. Thus, the first final fill including the second particles 62b can be overfilled in the hole 26, and thus can extend out with respect to the inner surface 97, or first surface 22. Alternatively still, a stand-off member can be disposed between the support member 160 and the inner surface 97 prior to performing the step of filling 46 under centrifugal forces. The stand-off member can define a gap between the inner surface 97 and the support member 160. Thus, the particles can be forced under centrifugal forces into a gap between the inner surface 97 and the support member 160. Thus, a single filling step 46 can fill the holes 26 such that the electrically conductive particles 62 extend continuously through the holes and can be overfilled, such that they extend beyond one or both of the first and second surfaces 22 and 24 of the substrate 20. In one example, the stand-off member can be defined by a sacrificial layer that is deposited onto the substrate 20, and can be removed from the substrate after the filling process has completed. For instance, the sacrificial layer can be defined by a photoresist or any suitable alternative sacrificial material.

Figure 18A:
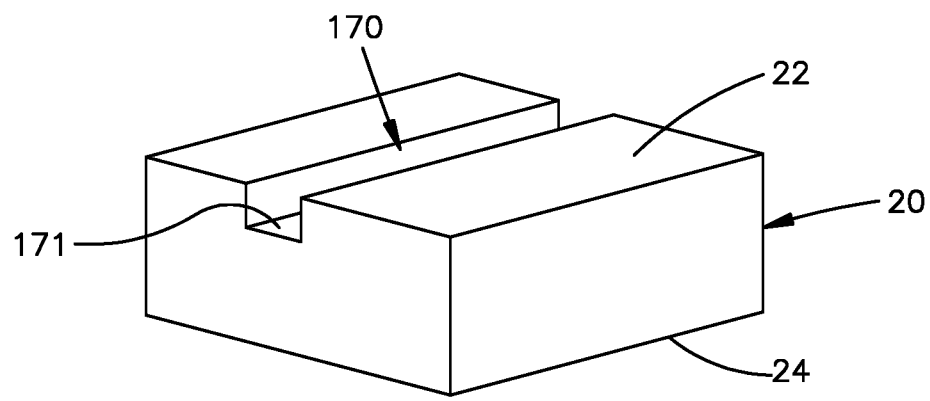
FIG. 18A is a schematic view of the substrate of FIG. 16A showing a trench formed in an outer surface thereof.

Alternatively, as illustrated in FIG. 18A, the substrate 20 can define a trench 170 in a first side of the substrate 20 that defines the first surface 22. The trench has a base 171 at defines a first portion of the first surface 22. The trench 170 is formed in a second portion of the first surface 22. Thus, the base 171 is offset from the second portion of the first surface 22 toward the second surface 24. Thus, a first end of the hole 26, and the resulting via, can terminate at the trench 170, and in particular at the base 171 of the trench 170. Accordingly, the hole 26, and the resulting via, is open to the trench 170. The second portion of the first surface 22 can be placed against the support surface described above. Thus, the first portion of the first surface 22 can be spaced from the support surface, thereby defining a gap between the first portion of the first surface 22 and the support surface. The gap can be defined by the trench 170. Thus, the first filling step can cause the second particles 62b to enter the trench 170. For instance, the second particles 62b can substantially fill the trench 170. The substrate 20 thus can include an electrical conductor in the trench 170 that is in electrical communication with the resulting via.

It should be appreciated that the trench 170 can be a first trench of the substrate 20, and that the substrate 20 can define a second trench configured as described above with the first trench, but on the opposite second side of the substrate 20. The second trench can thus have a second base that defines a first portion of the second surface 24. The second trench is formed in a second portion of the second surface 24. Thus, the second base is offset from the second portion of the second surface 24 toward the first surface 22. Thus, a second end of the hole 26, and the resulting via, can terminate at the second trench, and in particular at the base of the second trench. Accordingly, the hole 26, and the resulting via, is open to the second trench. The second particles 62b can be driven into the second trench and the hole 26 from the second surface 24 during the third filling step described above. That is, the third filling step can cause the second particles 62b to enter the second trench and the hole 26. For instance, the second particles 62b can substantially fill the second trench. The substrate 20 thus can include an electrical conductor in the second trench that is in electrical communication with the resulting via.

While the gap can be defined by a trench in the substrate 20 as described above, it is appreciated that a trench can alternatively or additionally be defined in the support member. The trench in the support member can define a base that is recessed from the support surface and aligned with the first end of the hole 26 of the substrate 20. Accordingly, a gap can be defined by the first surface 22 of the substrate 20 and the base of the trench in the support member. As a result, during the first filling step, the portion of the first final fill to extends from the hole 26 of the substrate 20 into the trench of the support structure.

Alternatively or additionally, the substrate 20 can be flipped such that what was the inner surface 97 is now the outer surface 99, and what was the outer surface 99 is now the inner surface 97. The filling step 46 under centrifugal forces can then be repeated as a subsequent filling step under centrifugal forces. Thus, where the centrifugal forces 150 urged particles into the holes 26 substantially from the first surface 22 in the first filing step, the centrifugal forces can now urge particles into the holes 26 substantially from the second surface 24 during the subsequent filling step under centrifugal forces.

After the one or more filling steps 46 under centrifugal forces have been completed, the particles 62 can subsequently be compacted inside the holes 26 and against one or both of the first surface 22 and the second surface 24 during the pressing step 53 described in more detail below.

If the compacting step 50 is performed, the resulting highly packed powder can occupy a length of the hole 26 that is less than an entirety of the length of the hole, thereby defining longitudinal distances that are measured from the bulk fill to each of the first and second surfaces 22 and 24 of the substrate 26, as described above. If the distances are greater than the predetermined distance as described above, then at least one subsequent bulk filling step 46 can be described of the type described above, using one or more of the vacuum apparatus 84, the suspended vacuum apparatus 85, and the centrifuge as desired. It should be appreciated that filling the holes with first and opposite subsequently packed powder with one or both of the vacuum apparatus 84 and the centrifuge 150 includes filling the first subsequently packed powder at step 46. Next another subsequent sequence 55 includes filling the opposite subsequently packed powder at step 46. Alternatively, as described above, the suspended vacuum apparatus 85 can be used to fill the first and opposite powders in sequence. The compacting step 50 can be performed after one or more up to all of the filling steps 46 as desired. Alternatively, the compacting step 50 can be omitted. Once each of the distances are equal to or less than the predetermined distance, a final filling step 46 of the type described above is performed.

Referring now to FIGS. 20A-20F, the filling step 46 can be performed by applying electrostatic forces to the particles 62 that drive the particles 62 to flow into the holes 26. In particular, an electrostatic fill device 200 is configured to apply the electrostatic force to the suspension 60 that drives the particles to flow into the holes 26.

Figure 20A:
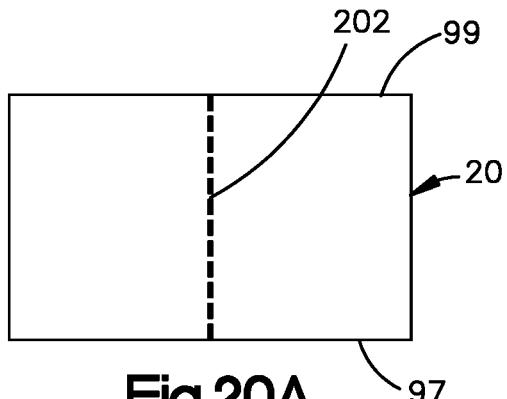
FIG. 20A is a schematic view of a substrate showing a weakened region after ablation.
Figure 20B:
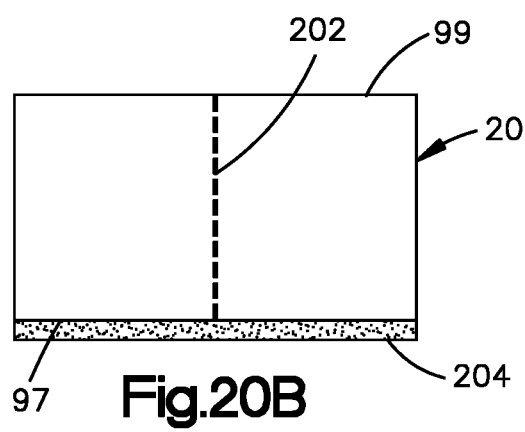
FIG. 20B is a schematic view of the substrate illustrated in FIG. 20A, but showing an electrically conductive layer applied to an inner surface of the substrate.
Figure 20C:
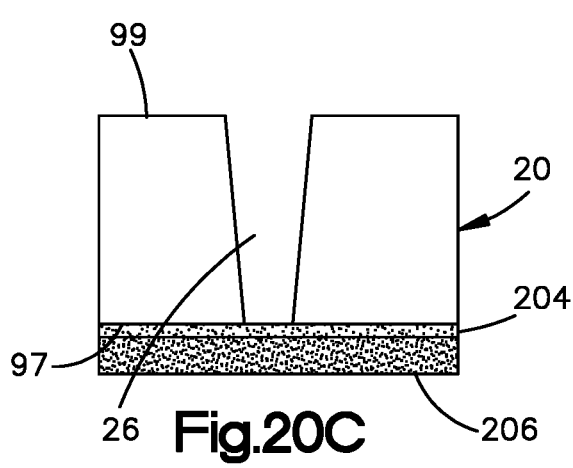
FIG. 20C is a schematic view of the substrate illustrated in FIG. 20B, but showing the weakened region removed to reveal a hole, and including a mask applied to the electrically conductive layer.

As illustrated in FIG. 20A, a region of the substrate 20 can be ablated, such as laser ablated, so as to define a weakened region 202 that can be subsequently removed at a later step so as to define the hole 26. As illustrated in FIG. 20B, an electrically conductive layer 204 can be applied to the inner surface 97 of the substrate 20. For instance, the layer 204 can be a metallic layer. In one example, the metallic layer can be sputtered onto the inner surface 97 of the substrate 20. Next, as illustrated at FIG. 20C, a non-reactive mask 206 can be applied to the electrically conductive layer 204. For instance, the non-reactive mask 206 can be a photoresist or other suitable material. Next, the ablated region can be etched so as to produce the hole 26. In this regard, while the hole is shown conically tapered, it should be appreciated that all holes 26 described herein, and thus the resulting vias 34, can be shaped in any manner as desired. For instance, the holes 26 can be substantially cylindrical. Alternatively, the holes 26 can be conical. For instance, the holes can taper inwardly from the outer surface 99 to the inner surface 97. Alternatively, the holes can taper outwardly from the outer surface 99 to the inner surface 97. The holes 26 can define any suitable alternative shape as desired. It should be further appreciated that the substrate 20 as described in all examples herein can be fabricated in accordance with any suitable available method, including laser ablation and subsequent etching to form the holes 26.

Figure 20D:
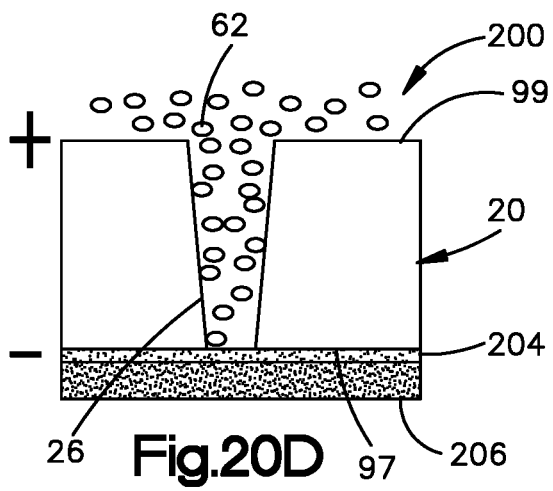
FIG. 20D is a schematic view of the substrate illustrated in FIG. 20C, but showing electrically conductive particles being driven into the hole.

As illustrated in FIG. 20D, the suspension 60 can be applied to the outer surface 99 of the substrate 20 so as to cover at least a portion of the outer surface 99 as described above. The layer 204 can have an electrical charge that is opposite the electrical charge of the particles 62. For instance, the electrical charge of the particles 62 can be defined by the zeta potential described above. The layer 204 can have a surface charge. Alternatively, the layer 204 can be electrically connected to an electrode that applies an electrical charge to the layer 204. In one example, the layer 204 can define a negative charge, the particles 62 can be positively charged. The liquid medium 64 can be any suitable liquid that does not neutralize the electrical surface charge of the particles 62 with respect to the attraction to the oppositely charged layer 204 that is external to the suspension 60. Alternatively, the particles 62 can be disposed in a paste. Alternatively or additionally, an electrical charge can be applied to the particles opposite the electrical charge of the layer 204.

Figure 20E:
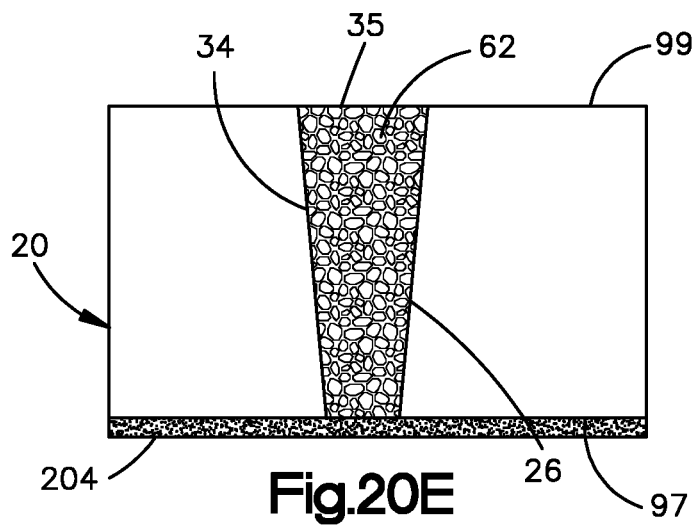
FIG. 20E is a schematic view of the substrate illustrated in FIG. 20C, but showing the electrically conductive particles packed in the hole, and extending along an entire length of the hole.

During operation, the layer 204 can electrostatically draw the particles 62 to flow into the hole 26, and displace the liquid medium 64 that is disposed in the hole 26. Thus, the particles 62 can define a wet packed powder of the type descried above. The hole 26 can then be allowed to dry. It is recognized that the force associated with the charge can fill an entire length of the hole 26 in one example, as illustrated in FIG. 20E. The charge can further pack the particles 62 inside the hole 26. In another example, the particles 62 can be packed in the manner described above with respect to compacting step 50. Of course, as described above, the compacting step 50 can be omitted. It should be appreciated that the particles 62, including one or both of the first particles 62a and the second particles 62b, that are disposed in the holes 26 can contact an internal surface of the substrate 20 that extends from the first surface 22 to the second surface 24 so as to at least partially define the hole 26 after the filling step, whether the filling step is performed under a pressure differential, centrifugal forces, or electrostatic forces.

Figure 20F:
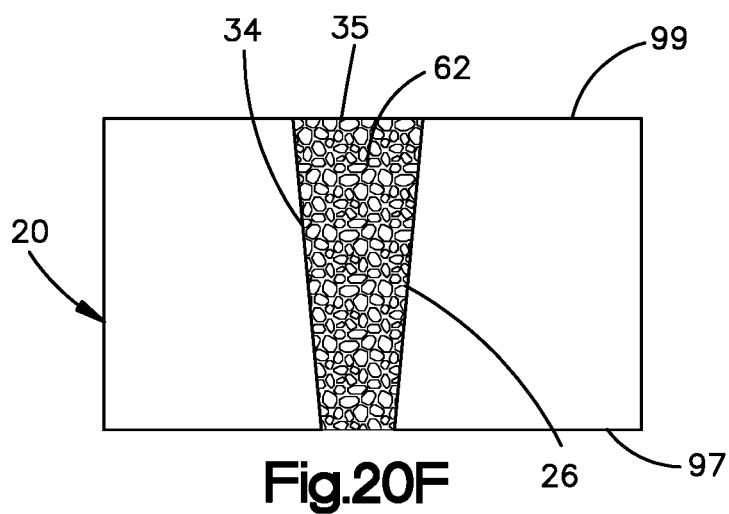
FIG. 20F is a schematic view of the substrate illustrated in FIG. 20E, but showing removal of the electrically conductive layer in one example.

If the compacting step 50 is performed, it should be appreciated that only one of the inner layers 122a and 122b (see FIGS. 8A-8B) enters the hole 26 at the outer surface 99 of the substrate 20. The other one of the inner layers 122a and 122b can bear against the layer 204. Alternatively, the layer 204 can be removed, and the other one of the inner layers 122a and 122b can enter the hole 26 at the inner surface 97. Once the compacting step 50 is completed, or if the compacting step 50 is omitted, a final filling step alone or in combination with one or more subsequent filling steps can be performed. The one or more subsequent filling steps and the final filling step, if performed, can be performed in the manner described herein. It should be appreciated that the layer 204 can define the sputter layer for a redistribution layer (RDL) as described in more detail below. Alternatively, as illustrated in FIG. 20F, the layer 204 can be removed. It is recognized that this method is intended to be used with a large number holes of the type commonly found on the substrate 20. The layer 204 can overly many or all of the holes 26 so as to draw the particles 62 into each of the holes 26 in the manner described herein.

Figure 20G:
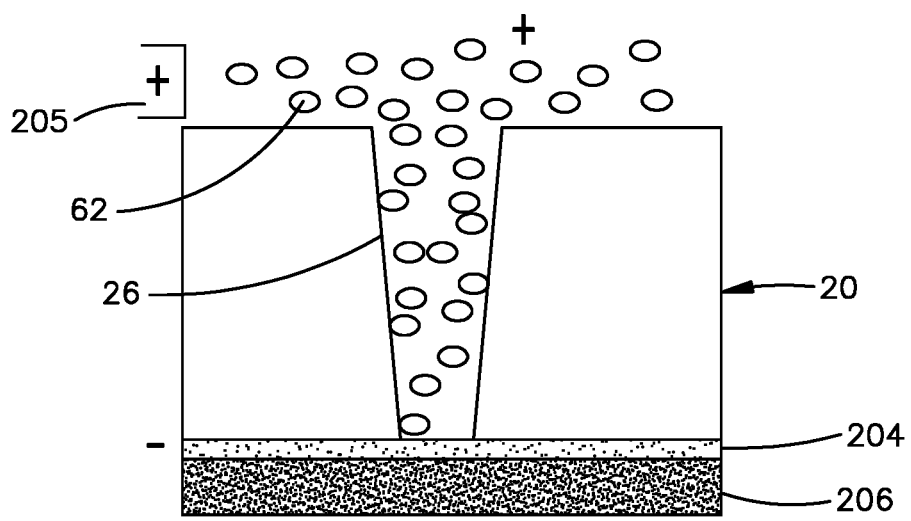
FIG. 20G is a schematic view similar to FIG. 20D, but showing application of electrostatic forces to the suspension so as to fill the holes of the substrate in accordance with another example.

As illustrated in FIG. 20G, a second electrical charge 205 can be adjacent at the outer surface 99 that is the same charge as the particles 62. Thus, the second electrical charge 205 can apply a force that drives the particles 62 along the outer surface 99. The particles 62 can be in suspension as described above. Alternatively, the particles 62 can be dry. For instance, the second electrical charge can be a positive charge that repels the suspension 60 away from the second charge. The second charge can be applied at a location outside the array of holes 26, such that the second charge drives the suspension 60 to flow across the outer surface 99 and into the holes 26 in the manner described above.

In another example, the layer 204 can be provided as a sacrificial oxide layer, and a carrier layer can be disposed over the oxide layer. A redistribution layer can be applied to the outer surface 99 surface of the substrate 20, and the oxide can then be etched so that a redistribution layer can be applied to the inner surface 99 of the substrate 20.

It is thus recognized that the particles 62 can be urged into the holes under a force from an air pressure differential, a centrifugal force, an electrostatic force, or a combination of the above. Further, it is recognized that one or more bulk fill operations can be performed. In some examples, a final fill operation can be performed after the one or more bulk fill operations. The particles during the final fill operation can have an average size that is smaller than the average size of the particles during the bulk fill operation. In one example, the filling step can include filling the hole at a first side of the substrate 20 that defines the first surface 22, flipping the substrate, and filling the hole at an opposed second side of the substrate the that defines the second surface 24. Alternatively, it is recognized that a first step of filling the substrate can include introducing the final fill into the hole at the first side of the substrate in accordance with any of the filling steps described herein such that the final fill accumulates at the second side of the substrate. Thus, the final fill can extend from the second surface of the substrate into the hole. Alternatively or additionally, a first final fill can extend from the hole onto the second surface in the manner described above, so as to define a button after the hard pressing step. Next, the bulk fill can be introduced into the hole at the first side of the substrate in accordance with any of the filling steps described herein such that the bulk fill extends from the first final fill toward the first surface. Finally, a second final fill can be introduced into the hole at the first side of the substrate in accordance with any of the filling steps described herein such that the second final fill extends from the bulk fill substantially to the first surface of the substrate. The phrase "to the first surface," "substantially to the first surface," "to the second surface," "substantially to the second surface," and phrases of like import are intended to include both termination at or substantially at the respective surface, and termination outward from the respective surface, unless otherwise indicated. Alternatively or additionally, a first final fill can extend from the hole onto the second surface in the manner described above, so as to define a button after the hard pressing step.

Figure 14:
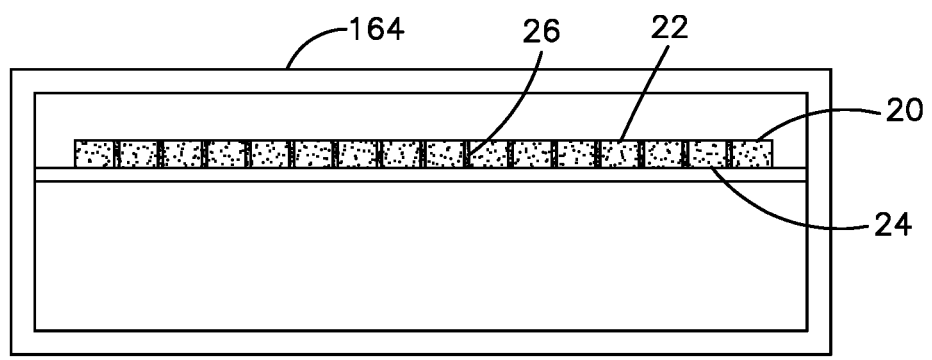
FIG. 14 is a schematic sectional side elevation view of a method step of sintering the substrate.

Referring again to FIG. 3, once the filling step or steps 46 have been completed so as to fill the holes 26, alone or in combination with one or more compacting steps 50, the particles 62 can be sintered at sintering step 52. It is appreciated that the particles 62 can be dry prior to the sintering step 52. In particular, referring now to FIG. 14, the substrate 20 can be placed in an oven 164 for a length of time at any suitable pressure at a temperature sufficient to sinter the particles 62. For instance, the pressure in the oven 164 can be at atmospheric pressure. Alternatively, the oven 164 can define a vacuum. The oven can further include any suitable gaseous environment as desired. In one example, the sintering process is substantially a non-densification sintering process. It is recognized that densification during sintering can cause portions of adjacent ones of the particles 62 to flow toward each other, thereby shrinking the resulting electrically conductive fill 35.

Referring now to FIGS. 15A-15B, it is recognized that deformation of the particles 62 can take place during the substantially non-densifying sintering step 52. However, the deformation is relatively minimal compared to densification sintering. For instance, the substantial non-densification is illustrated whereby in FIG. 15A, a plurality of adjacent particles 62 are in contact with each other and define respective geometric centers 159 that are spaced from each other a first distance D1. After the substantially non-densification sintering step, the geometric centers 159 of the two adjacent particles 62 define a second distance D2 between their respective geometric centers, as shown in FIG. 15B. The difference between the second distance D2 and the first distance D1 is no more than approximately 30% of the first distance in one example. For instance, the difference is no more than approximately 20% of the first distance. For example, the difference is no more than approximately 15% of the first distance. In another example, the difference is no more than approximately 10% of the first distance. For instance, in one specific example, the difference is no more than approximately 5% of the first distance. In one particular example, the first distance D1 can be substantially equal to the second distance D2.

It is recognized that sintering includes an initial stage whereby a neck 145 is formed that extends between adjacent sintered particles, so as to define grain boundaries 149 at respective interfaces between adjacent sintered particles 62. It should be appreciated that the particles 62 can define what is referred to as a "bulk nanostructured" powder. Each of the particles 62 can include a packed array of nanograins. In one example, each particle 62 can include at least a thousand up to over a million nanograins. It is, however, contemplated, that the particles 62 can each include less than one-thousand nanograins, for instance when the average size of the particles is 0.22 μm. During the initial stage of sintering, the nanograins that make up the particles 62 can expand or grow. As this occurs, pores internal to the particles 62 can be moved to the outer surface of the particle 62 and removed. In a second or intermediate stage of sintering, interstices 66 between the adjacent particles 62 can shrink during densification of the particles 62. However, the densification of the particles 62 can be tuned by determining the average grain size in the originally synthesized particles 62 of the suspension 60 described above. The densification of the particles 62 can further be tuned by determining the modal distribution of particles 62. For instance, as described above with respect to FIGS. 7A-7C, the particles 62 can define a monomodal distribution, a bimodal distribution, or a trimodal distribution for example. It is appreciated that the modal distribution of the particles 62 does not affect the grain growth behavior of the nanograins in each of the particles 62. Rather, the multimodal distribution can affect the densification behavior of particle to particle interaction, such as necking, during sintering.

It has been found that smaller sized nanograins produce greater nanograin growth during the first phase of densification. Greater nanogram growth in the first stage of densification has been found to result in less densification of the particles 62 during the second or intermediate stage of densification. Further, greater initial density of the electrically conductive particles 62 in the hole 26 prior to sintering can also produce less densification of the particles 62 during the second or intermediate stage of densification. It is recognized that trimodal distributions have a greater initial density than bimodal distributions. Further, bimodal distributions have a greater initial density than a monomodal distributions. Thus, a trimodal distribution of the particles has greater initial density than a monomodal distribution.

Accordingly, to decrease densification during the second or intermediate stage of sintering, it can be desirable to decrease the sizes of the nanograins that form the particles 62. Further, to decrease densification during the second or intermediate stage of sintering, it can be desirable to provide the particles in a bimodal or trimodal distribution. It is recognized, however, that the particles can be substantially non-densification sintered in a monomodal distribution.

Without being bound by theory, it is believed that decreasing the nanograin size alone or in combination with providing bimodal or trimodal particle distributions can decrease a transition point of total achievable densification between the intermediate stage of sintering and the final stage of sintering. Otherwise stated, the ability of the particles 62 to densify during the intermediate stage of sintering can be reduced such that the resulting sintered particles 62 are substantially non-densified. During the final stage of sintering, nanograins can further grow in addition to the growth achieved during the initial sintering phase, which can be a precursor to closure of pores within the particles 62. The end result after sintering is completed is a contiguous metal networked fill within the via that can extend substantially from the first surface 22 substantially to the second surface 24 without changing the coplanarity of the metallized via and the surrounding substrate 20 (see FIG. 2A). Further, the contiguous metal networked fill can contact the substrate 20 at one or more up to all locations of in the via, at the first surface, and at the second surface 24. The contiguous metal networked fill can extend out from the via onto one or both of the first and second surfaces 22 and 24 of the substrate 20.

It should therefore be appreciated that a method of tuning densification of the particles 62 during the step 52 can include the step 46 of filling the hole with a bulk nanostructured electrically conductive powder having particles that each include a packed array of nanograins. The method can further include the step 52 of sintering the particles in the hole at a temperature range for a time duration. The method can further include the step of determining at least one of an average grain size and a modal distribution prior to the filling, step so as to, in turn, determine an amount of densification during the sintering step. As described above, the filling step can include filling the hole with a suspension of the particles in a liquid medium, and evacuating the liquid medium from the hole prior to the sintering step 52.

As described above, a majority of the total volume of particles 62 in the hole 26 can be substantially non-densification sintered as described above. In one example, at least approximately 60% the total volume of particles 62 in the hole 26 is substantially non-densification sintered. In another example, at least approximately 70% of the total volume of particles 62 in the hole 26 is substantially non-densification sintered. In still another example, at least approximately 80% of the total volume of particles 62 in the hole 26 is substantially non-densification sintered. In yet another example, at least approximately 90% of the total volume of particles 62 in the hole 26 is substantially non-densification sintered. For instance, in one particular example, at least approximately 95% of the total volume of particles 62 in the hole 26 is substantially non-densification sintered. Particular. More particularly, in one example, approximately 100% of the total volume of particles 62 in the hole 26 is substantially non-densification sintered. It should be appreciated that at least a portion of the fill defined by the non-densification sintered particles 62 in the hole 26 can contact the internal surface of the substrate 20 that extends from the first surface 22 to the second surface 24 and at least partially defines the hole.

The sintering step 52 can occur at a sintering temperature within a temperature range from approximately 100 degrees Celsius to approximately 400 degrees Celsius. In one example, the temperature range can be from approximately 200 degrees Celsius to approximately 400 degrees Celsius. For instance, the temperature range can be from approximately 300 degrees Celsius to approximately 400. For instance, the temperature range can be from approximately 300 degrees Celsius to approximately 350 degrees Celsius. For instance, the sintering temperature can be approximately 325 degrees Celsius.

The sintering step 52 can occur for any suitable duration as desired within any of the temperature ranges identified above to sinter the particles 62 without substantially densifying the particles 62 as described above. For instance, the duration can be in a duration range from approximately 15 minutes to approximately 4 hours. In one example, the duration range can be from approximately 30 minutes to approximately 2 hours. For instance, the duration can be approximately 1 hour.

Advantageously, as discussed above, the particles 62 can be ductile and malleable. As a result, the particles 62 can have a coefficient of thermal expansion (CTE) that tis mismatched with respect to that of the substrate 20 without damaging the substrate 20 during sintering. In particular, the malleability of the silver particles 62, for instance, allows for non-densification sintering while maintaining the structural integrity of the substrate. Thus, it is appreciated that no materials are added to either of the suspensions 60*a* and 60*b* that are intended to bring the coefficient of thermal expansion of the resulting particles 62 closer to that of the substrate 20. Accordingly, the sintered particles 62 is devoid of residual material that is the product of a burned CTE matching agent. For instance, each of the first and second suspensions 60 can be devoid of glass frit, or fritless. Further, in examples whereby the electrically conductive material of the particles 62 is a metal, the resulting via 34 can define the single homogeneous metal substantially from the first surface 22 of the substrate 20 substantially to the second surface 24. For instance, the first and second particles 62*a* and 62*b* (and thus the bulk fill and final fill) can be the same metal. In one example, the same metal can be silver. In another example, the same metal can be copper. It should be appreciated, of course, that the first and second particles 62*a* and 62*b* (and thus the bulk fill and final fill) can alternatively be different metals.

Alternatively or additionally, the sintering step 52 can include the step of applying a radiofrequency (RF) current to the particles 62 sufficient to generate eddy currents that cause the particles 62 to substantially non-densification sinter.

Figure 21A:
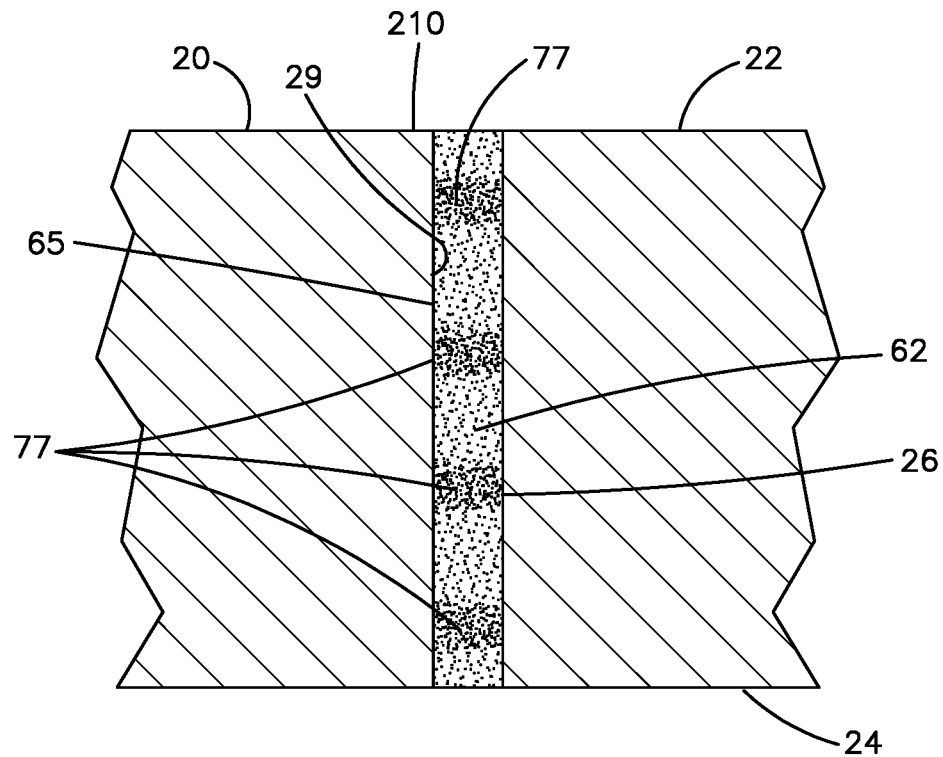
FIG. 21A is a schematic view of a substrate having an internal surface defining a hole containing electrically conductive particles, the substrate including an electrically conductive coating that bonds electrically conductive particles to the internal surface.
Figure 21B:
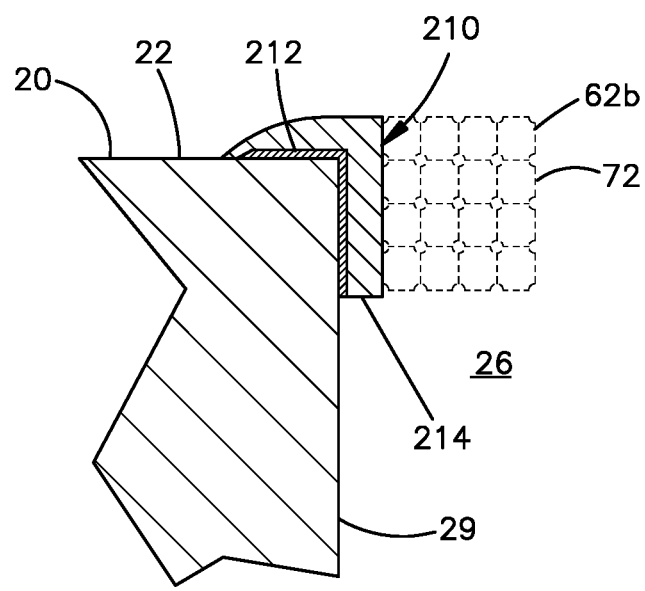
FIG. 21B is an enlarged schematic view of a portion of the substrate illustrated in FIG. 21A, showing a portion of the coating.

Referring now to FIGS. 21A-21B, at least a portion of the electrically conductive fill can be bonded to the internal wall 29 of the substrate 20 prior to sintering the electrically conductive fill. For instance, the substrate 20 can include an electrically conductive coating 210 that is bonded to each of the internal wall 29 and the particles 62. For instance, the coating 210 can be bonded to each of the internal wall 29 and the second particles 62*b* of the final fill.

The coating 210 can extend from the internal surface onto one or both of the first surface 22 and the second surface 24. The coating 210 can include a first portion 210*a* that is coated to a first end of the internal surface 29 of the substrate 26, and a second portion 210*b* that is coated to a second end of the internal surface 29 of the substrate that is opposite the first end along the same direction that separates the first and second surfaces 22 and 24 of the substrate. In one example, the first portion 210*a* of the coating extends from the first end of the internal surface 29 to the first surface 22 of the substrate 20, and the second portion 210*b* extends from the second end of the internal surface 29 to the second surface 24 of the substrate. Alternatively, the coating 210 can be localized to the internal surface 29 without extending to either or both of the first surface 22 and the second surface 24.

The first and second portions 210*a* and 210*b* are spaced from each other along the internal surface 29 in the direction that separates the first and second surfaces 22 and 24. In particular, the first portion 210*a* of the coating 210 can extend along the internal surface 29 at a location aligned with at least a portion of the final fill that extends from the bulk fill toward the first surface 22. The second portion 210*b* of the coating 210 can extend along the internal surface 29 at a location aligned with at least a portion of the final fill that extends from the bulk fill toward the second surface 22. Accordingly, the coating 210 can bond the final to the substrate 20, and in particular to the internal surface 29.

In one example, the coating 210 does not extend along the internal surface 29 into an intermediate region of the resulting via 34, wherein the bulk fill is disposed in the intermediate region. Alternatively, if desired, the coating 210 can extend along an entirety of the internal surface 29. The electrically conductive coating can further extend from the internal surface 29 onto either or both of the first and second surfaces 22 and 24. For instance, the first portion 210*a* can extend from the internal surface 29 onto the first surface 22. The second portion 210*b* can extend from the internal surface 29 onto the second surface 24.

The electrically conductive coating 210 can include at least one metal that is vapor deposited onto the substrate 20 so as to define a first metal layer 212. The first metal layer 212 thus bonds to the substrate, and in particular to the internal surface 29. The at least one metal can further include a second metal layer 214 that bonds to both the first metal 212 and the final fill, thereby bonding the final fill to the substrate 20. For instance, the second metal can be vapor deposited onto the first metal layer 212. In this regard, the first layer 212 can be referred to as an adhesion layer. The first metal can be at least one of titanium, chrome, tantalum, tungsten, and alloys thereof including a titanium-tungsten alloy. The first layer 212 can have any suitable thickness as desired. In one example, the thickness of the first layer 212 ranges from approximately 1 nanometer (nm) to approximately 100 nm. For instance, the thickness of the first layer 212 can range from approximately 1 nanometer (nm) to approximately 50 nm. In one example, the thickness can range from approximately 5 nm to approximately 10 nm.

The second layer 214 can be referred to as a bonding layer that bonds to the electrically conductive particles 62*b* of the final fill. In one example, the second metal of the second layer 214 is miscible with the metal of the electrically conductive particles 62*b*. Thus, when the electrically conductive particles 62*b* are silver particles, the second metal of the second layer 214 can be a miscible with the metal of the second electrically conductive particles 62*b*, which can be silver or any suitable alternative metal as described above. Thus, the second metal of the second layer can be silver miscible in one example. Further, the second metal can be a transition metal. For instance, the second metal can be at least one or more of silver, copper, aluminum, palladium, and alloys thereof including a silver-palladium alloy. Thus, the coating, including the first and second layers 212 and 214, and thus the first and second metals, can be defined by the same single metal in some examples. Otherwise stated, the coating can include a single metal that bonds to the internal surface of the glass substrate, for instance using vapor deposition, and sinter bonds to the second electrically conductive particles 62*b*.

The second layer 214 can be thicker than the first layer 212. For instance, the second layer can have a thickness within a range from approximately 200 nm to approximately 5 microns. For instance, the thickness can range from approximately 0.5 micron to approximately 2 microns. In other examples, it is recognized that the first layer 212 can sinter bond directly with the electrically conductive particles 62*b* of the final fill.

As described above, the coating 210, and in particular the first layer 212 can be applied to the internal surface 29, and optionally either or both of the first and second surfaces 22 and 24, by a vapor deposition process. For instance, the vapor deposition process can be physical vapor deposition (PVD). Thus, the first layer 212 can be applied to the internal surface 29 via any one of ionized physical vapor deposition (iPVD), magnetron sputtering, DC sputtering, and evaporation deposition. Similarly, the second layer 214 can be applied to the first layer 212 by a vapor deposition process. For instance, the vapor deposition process can be physical vapor deposition (PVD). Thus, the second layer 214 can be applied to the first layer via any one of ionized physical vapor deposition (iPVD), magnetron sputtering, DC sputtering, and evaporation deposition.

Once the coating 210 has been bonded to the internal surface 29, the electrically conductive fill, such as the final fill, can be bonded to the coating 210. In particular, the electrically conductive fill, such as the final fill, can be bonded to the second layer 214. In one example, the final fill can be sinter bonded to the second layer 214 during sintering of the particles in the hole 26. The final fill can be a monomodal fill or a multimodal fill as desired. In one example, the final fill can be a bimodal or trimodal fill. In this regard, it should be appreciated that the coating 210 defines an interface between the final fill and the internal surface 29 of the substrate 26. The interface can present a barrier to gas with respect to penetration into the via 34. Alternatively or additionally, the interface can present a barrier to liquid with respect to penetration into the via 34.

It should be appreciated that the electrically conductive coating 210 can be applied to the substrate 20 prior to performing the step of filling the second electrically conductive particles 62b that defines the final fill into the hole 26. For instance, the electrically conductive coating 210 can be applied to the substrate 20 prior to performing the step of filling the first electrically conductive particles 62a that defines the bulk fill into the hole 26. Thus, the electrically conductive coating 210 can be applied to the internal surface 39 prior to filling any of the electrically conductive particles 39 into the hole 26.

Alternatively, the method can include the step of performing a first filling operation step that forces a plurality of the first electrically conductive particles 62a into the hole 26. This first filling step can be applied using any suitable filling technique described herein. Once an entirety of the first electrically conductive particles 62a have been forced into the hole using one or more first filling steps, and the particles 62a have been packed as desired, the coating 210 can be applied to the substrate 26 in the manner described above. Thus, the step of applying the coating can be after a first filling step, including a plurality of first filling steps. Therefore, the coating 210 can thus be further applied to at least one of the opposed outer ends of the bulk fill. For instance, the first portion 210a of the coating can be applied to a first outer end of the bulk fill. The second portion 210b of the coating can be applied to a second outer end of the bulk fill that is opposite the first outer end along the same direction that separates the first and second surfaces 22 and 24 of the substrate 20. Next, at least one final filling operation can be performed that forces the second electrically conductive particles 62b into the hole so as to define a final fill that extends from the first electrically conductive particles toward each of the first and second surfaces 22 and 24, respectively. The final filling operations can be performed under vacuum as described above, under centrifugal forces described above, under electrostatic forces as described above, or using any suitable alternative method as desired. Once the coating has been applied to the internal surface 29 and the first and second particles 62a and 62b have been filled into the hole 26, the particles can be non-densification sintered in the manner described above.

It is appreciated that the coating 210 can be vapor deposited to the internal surface 29 in a vapor deposition chamber. Further, the electrically conductive particles 62, including the first particles 62a and the second particles 62b can be non-densification sintered in the same common vapor deposition chamber. Thus, heat can be applied to the vapor deposition chamber that increases the temperature in the chamber to a sintering temperature sufficient to cause the first and second electrically conductive particles to sinter. The sintering temperature can range from approximately 100 degrees Celsius to approximately 400 degrees Celsius. For example, the sintering temperature can range from approximately 300 degrees Celsius to approximately 400 degrees Celsius. In particular, the sintering temperature can range from approximately 300 degrees Celsius to approximately 350 degrees Celsius. In one specific example, the sintering temperature can be approximately 325 degrees Celsius. Heat can be applied to the vapor deposition chamber in any suitable manner as desired. For instance, radiant heat, conductive heat, or convective heat can be applied to an external surface of the vapor deposition chamber so as to increase the temperature inside the chamber.

As the particles 62 are non-densification sintered, the second particles 62b of the final fill can be sinter bonded to the coating 210. Further, the first particles 62a (for instance at the end or ends of the bulk fill) can be sinter bonded to the coating 210 as the particles 62 are non-densification sintered.

In one example, heat can be applied to the vapor deposition chamber while the coating is applied to the internal surface 29 of the substrate 20. Thus, heat can be applied to the chamber simultaneous with application (e.g., vapor deposition) of the coating to the internal surface. Alternatively, after the sintering has been completed in the vapor deposition chamber, the temperature in the vapor deposition chamber can be reduced, and the coating 210 can be vapor deposited to the internal wall. In particular, the first layer 212 can be vapor deposited onto the internal surface 29, and the second layer 214 can be vapor deposited onto the first layer 212. The elevated temperature inside the vapor deposition chamber during the vapor deposition can be sufficient to sinter bond the particles 62 to the coating 210. For instance, the vapor deposition can occur at an elevated temperature within a range from approximately 80 degrees Celsius to approximately 250 degrees Celsius.

Alternatively still, the coating 210 can be vapor deposited to the internal surface 29 prior to increasing the temperature in the vapor deposition chamber to the sintering temperature. For instance, prior to sintering, the temperature in the vapor deposition chamber can be cooled and maintained such that the temperature at the internal surface 29 of the substrate 20 is maintained below approximately 100 degrees Celsius during the vapor deposition. For instance, the temperature at the internal surface 29 can be maintained at a temperature within a range from approximately 0 degrees Celsius to approximately 80 degrees Celsius during the vapor deposition. The vapor deposition chamber can be cooled using any suitable apparatus and method as desired. For instance, helium backside cooling can be applied to the vapor deposition chamber. Alternatively or additionally, a water jack can reduce the temperature of the vapor deposition chamber. Alternatively or additionally still, a plurality of internal heat exchange tubes can carry a cooled fluid inside the vapor deposition chamber.

Once the vapor deposition has been completed, heat can be applied to the vapor deposition chamber to raise the temperature in the chamber 241 to the non-densification sintering temperature described above.

It is recognized that the coating 210 can be applied to the inner surface of any suitable hole in the substrate 20, whether the hole is metallized or not. In this regard, the substrate 20 can include holes that are not metallized or otherwise electrically conductive. The coating 210 can be applied to the internal surface of such holes so as to contribute to the hermeticity of the hole.

It is recognized that the resulting vias 34 contain substantially only the electrically conductive material and air as described above, in addition to any metal introduced into the hole, if applicable as described herein. Further, as will now be described, the resulting vias 34 can be hermetic.

Figure 27:
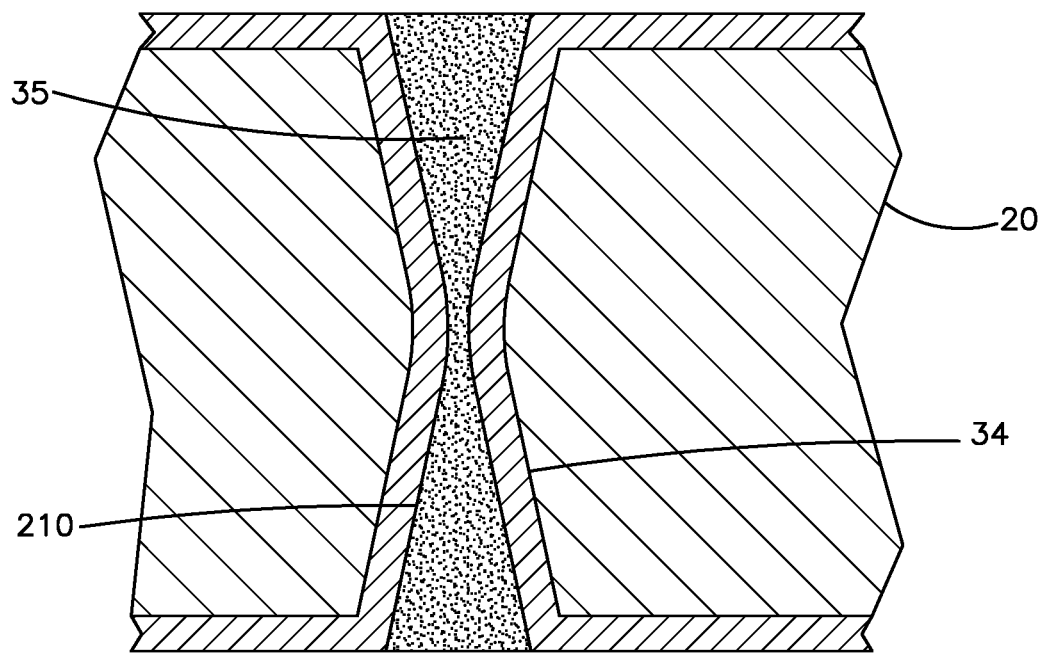
FIG. 27 is a schematic sectional elevation view of a hybrid-filled via in another example.

Referring now to FIG. 27, the via 34 can define any suitable size and shape as desired. For instance, the via 34 can be substantially hourglass shaped having first and second different electrically conductive materials that extend from the first surface of the substrate 20 to the second surface of the substrate 20. The internal surface of the hourglass shaped via 34 can define a taper of at least one to three degrees. Alternatively or additionally, the via 34 can contain metals that are deposited therein using different deposition techniques. For instance, the via 34 can include a coating 210 that is applied to the internal surface of the hole. The coating 210 can extend along an entirety of the internal surface of the hole and resulting via 34. Further, the coating can extend along a portion of each of the first and second opposed surfaces of the substrate 20.

The first layer of the coating 210 can be electroless plated onto the internal surface of the hole. Thus, as described above, the first layer can be referred to as an adhesion layer. The first layer can be a first metal such as titanium. The second layer can be an electrical conductor layer of a second metal. For instance, the second metal can be copper or silver. The second layer can be applied using an electrochemical deposition. The second layer can be applied substantially uniformly along the first layer. The second layer can have a thickness within a range from approximately 3 microns to approximately 7 microns. As illustrated, the coating 210 can be configured to not completely fill the narrowest portion or neck of the hole. The electrically conductive fill 35 can be introduced into the hole in accordance with any suitable method described above, such that the fill 35 occupies a substantial entirety of a remainder of the hole that is not occupied by the coating. Thus, the coating 210 and the fill 35 can combine to entirely fill the neck of the hole 26 and resulting via. For instance, the fill 35 can be introduced under fluid pressure, centrifugal forces, electrostatically, or some combination thereof. The fill 35 can be sinter bonded to the second layer in the manner described above.

Referring now to FIGS. 12A-12C, in one example the substrate 20 filled with particles can be placed into a chamber, and an oxidizing gas can be introduced into the chamber and forced through the hole 26 at an elevated temperature, such that oxidation of the particles can be evacuated from the respective hole. The elevated temperature can be greater than approximately 50 degrees Celsius in one example, and less than approximately 400 degrees Celsius. The chamber can be a vacuum chamber. Alternatively or additionally, the chamber can be a sintering oven. The substrate 20 can be placed into the chamber once the particles 62 are dried, either by evacuating the liquid during the vacuum filling processes described above, or drying the particles after filling under centrifugal forces, or filling the holes in any suitable alternative method or methods described herein In one example, when the substrate is disposed in the chamber, a nitrogen and oxygen mix can be forced to flow through the hole at an elevated temperature that is above ambient temperature. Thus, the substrate, including the particles 62, can be substantially at the elevated temperature. In one example, the elevated temperature can range from approximately 40 degrees Celsius to approximately 75 degrees Celsius. For instance, the elevated temperature can be approximately 50 degrees Celsius. Next, the temperature in the chamber is increased to a level that causes organics in the hole to form oxides. For instance, the temperature in the chamber can be increased to a level within a range from approximately 75 degrees Celsius to approximately 150 degrees Celsius. In one example, the temperature can be increased to approximately 120 degrees Celsius. The flow of the nitrogen and oxygen mix through the hole causes the oxides to evacuate from the particles 62, and thus from the holes. The weight of the substrate can be monitored throughout this process, it being recognized that as the substrate reduces or stops losing weight, it can be concluded that substantially all of the organics that have formed oxides have been evacuated from the hole.

Next, the nitrogen and oxygen mix can be evacuated from the hole. In particular, a cleansing gas can be subsequently introduced into the chamber and forced to flow through the hole of the substrate. In one example, the cleansing gas can be nitrogen. The nitrogen can be a pure nitrogen. The cleansing gas removes the nitrogen and oxygen mix from the hole so as to prevent the metallic particles 62 from oxidizing in the presence of the nitrogen and oxygen mixture. The cleansing gas can be added at a pressure within a range from approximately 0 TORR to approximately 760 TORR. Further, the cleansing gas can be added at a temperature within a range from approximately 120 degrees Celsius to approximately 180 degrees Celsius.

Next, a subsequent step can be performed whereby metal oxides can be removed that were formed during the step of causing the nitrogen and oxygen mix to flow through the holes. The subsequent step can include causing a nitrogen and hydrogen mix to flow through the hole so as to remove metal oxides from the hole. Finally, the nitrogen and hydrogen mix can be evacuated from the hole. In particular, a cleansing gas can be subsequently introduced into the chamber and forced to flow through the hole of the substrate. In one example, the cleansing gas can be nitrogen. The nitrogen can be a pure nitrogen. The cleansing gas removes the nitrogen and hydrogen mix from the hole. Next, the substrate can be sintered in the manner described above. In particular, the substrate can be moved to a sintering oven. Alternatively, the chamber can be defined by a sintering oven, such that the temperature in the chamber is increased to the sintering temperature as described above.

In particular, referring again to FIGS. 3 and 22A-22B generally, once the substrate 20 has been sintered at step 52, the substrate 20 can be subjected to a pressing step 53 to seal an interface between the substrate 20 and the particles 62. The interface can include a first interface between the sintered electrically conductive fill and either or both of the first and second surfaces 22 and 24. Alternatively or additionally, the interface can include a second interface between the substrate 20 and the sintered electrically conductive fill at a location along the internal surface 29 toward or to the first surface 22, and further along the internal surface 29 toward or to the second surface 22.

Figure 22A:
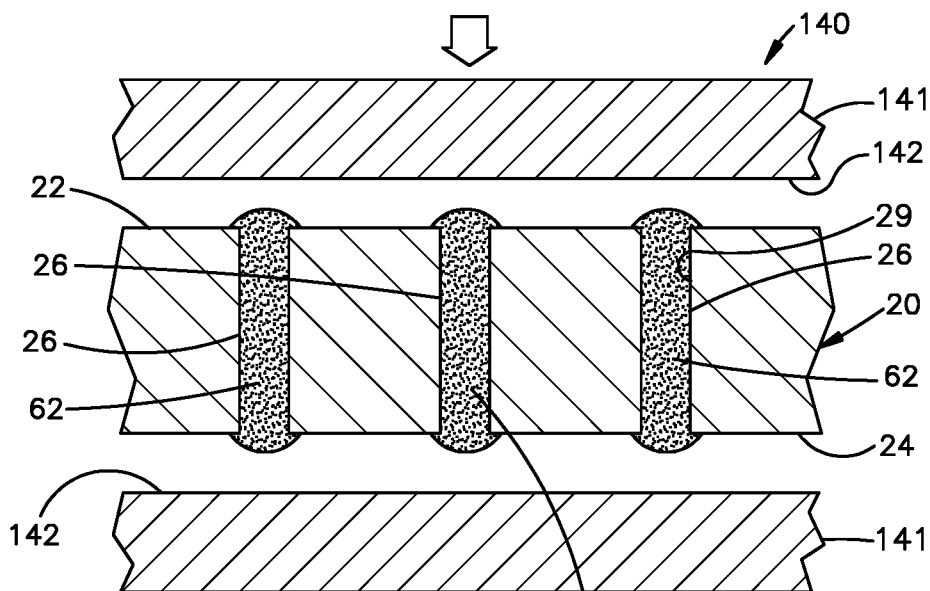
FIG. 22A is a schematic view of a hard press applied to an overfilled substrate in accordance with another example.
Figure 22B:
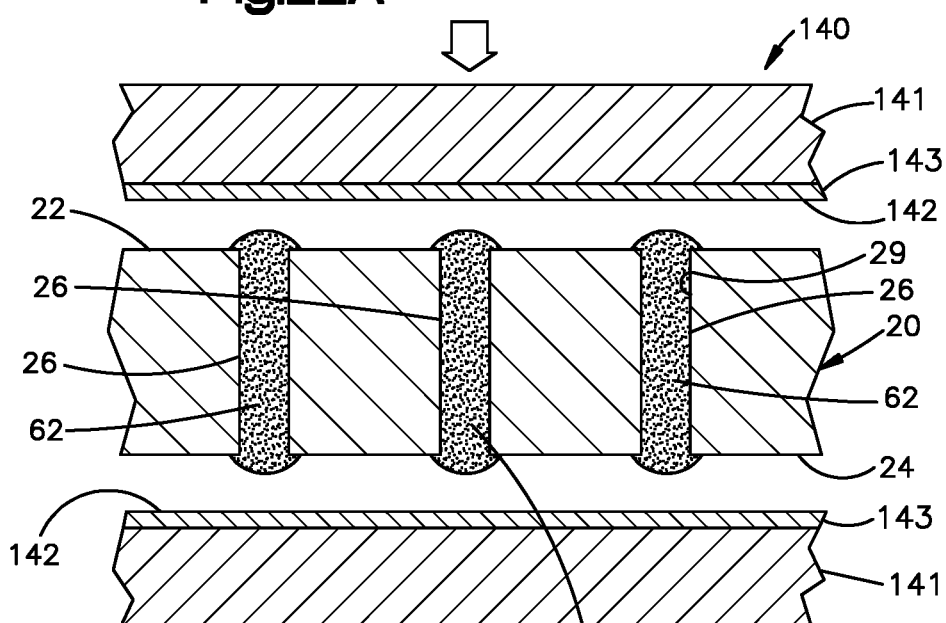
FIG. 22B is a schematic view of the hard press of FIG. 22A, but including a press member in another embodiment.

In one example, referring to FIGS. 22A-22B, the pressing step 53 can be performed in a hard press 140. In particular, the hard press 140 can include first and second press surfaces 142 that can be brought into contact with the substrate 20, and pressed toward the first and second surfaces 22 and 24 of the substrate 20. When the particles 62 are overfilled in the hole 26 such that they extend beyond the first and second surfaces 22 and 24 at their first end second ends, respectively, and sintered, the resulting sintered electrically conductive fill extends through the hole 26 and includes a first portion that extends beyond the first surface 22 of the substrate 20 and a second portion that extends beyond the second surface 24 of the substrate 20. The first and second portions of the electrically conductive fill define respective first and second ends that are disposed outboard of the first and second surfaces 22 and 24, respectively, along the central axis of the hole 26. During the pressing step 53, the press surfaces 142 can be brought into contact with the first and second ends of the electrically conductive fill. In particular, at least one or both of the first and second press surfaces 142 can be moved uniaxially toward the other of the first and second press surfaces, and thus toward the respective first and second surfaces 22 and 24. The pressing step 53 can be referred to as a uniaxial pressing step.

Figure 22C:
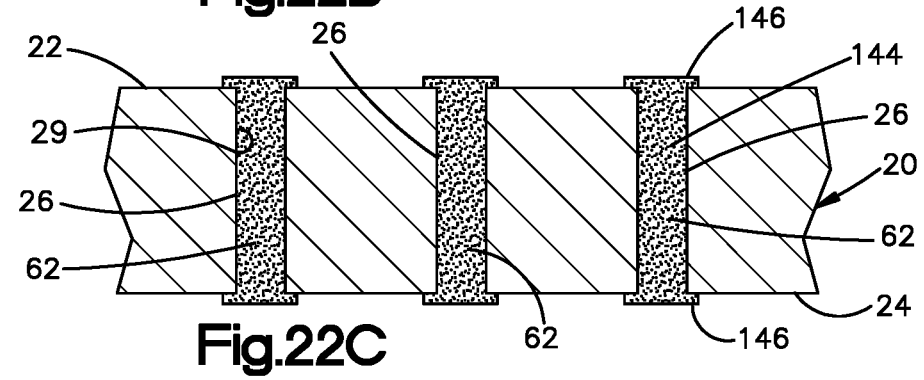
FIG. 22C is a schematic view of the substrate after the hard press operation.

One or both of the platens 141 can be brought toward each other until the press surfaces 142 contact those portions of the metal structure that extend out from either or both of the first and second surfaces 22 and 24, also referred to as the overfilled portion of the electrically conductive fill, which can be a metal fill as described above. As the press surfaces 142 continue to be brought toward each other, and thus toward the substrate 20, the press surfaces 142 compress the overfilled first and second portions of the sintered electrically conductive fill against the first and second surfaces 22 and 24, respectively, as illustrated in FIG. 22C. In particular, the metal structure can deform so as to define an I-Beam-shaped structure having a stem 144 that extends inside the hole 26 to the first and second surfaces 22 and 24, and outer bumps 146 that are compressed against the first and second surfaces 22 and 24, respectively. The first and second portions of the electrically conductive fill can define the outer bumps 146. The outer bumps 146 can be flat outer bumps 146 having outer surfaces that are substantially parallel with the respective first and second surfaces 22 and 24 of the substrate 20. Further, the bumps 146 can extend out with respect to the hole 26, and thus the via 34, along a direction that is perpendicular with respect to the hole 26, and thus the via 34.

The compression of the flat outer bumps 146 against the first and second surfaces 22 and 24, respectively, can seal the ends of the vias 34 at both surfaces 22 and 24 of the substrate 20. Further, it should be appreciated that at least some of the electrically conductive fill, which was formed from non-densification sintered particles 62, can become densified during the pressing step 43. Further, the overfilled portions of the electrically conductive fill can contact the substrate 20 at one or both of the first and second surfaces 22 and 24, respectively. The press surfaces 142 can also apply an axial compressive force to portions of the electrically conductive fill that is disposed inside the hole 26 along the central axis of the hole 26. The compression of the electrically conductive fill in the hole 26 can cause the sintered particles 62 to seal against the inner surface 29 of the holes 26. The compression of the electrically conductive fill against the substrate 20 can cause the via 34 to be hermetic. Accordingly, the metallic structure of the via 34 can be substantially nonporous at substantially each of the first surface 22 and the second surface 24. Further, interference between the flat outer ends and the substrate 20 can resist or prevent migration of the electrically conductive fill 35 during operation.

While the via described herein provides improved electrical performance, and without being bound by theory, it is believed that further densifying the electrically conductive material can further improve certain aspects of the electrical performance of the resulting via.

In one example, illustrated in FIG. 22A, the press surfaces 142 can be defined by respective platens 141 of the uniaxial press. It can be desirable for the platens 141 to be sufficiently planar at the respective press surfaces 142 such that the respective outer surfaces of the bumps 146 are likewise planar after deformation. Alternatively, as illustrated in FIG. 22B, the press surfaces 142 can be defined by press members 143 that are disposed between the platens 141 and the respective first and second surfaces 22 and 24 of the substrate 20. In one example, the press members 143 can be carried by respective surfaces of the platens 141 that face the substrate 20. Thus, when at least one or both of the platens 141 are brought toward each other, the press surfaces 142 of the press members 143 contact the first and second ends of the particles 162 and apply a force to the particles 162, thereby deforming the particles 162 as described above. The force applied to the particles 162 can be up to approximately 300,000 pounds per square inch (PSI), such as up to approximately 150,000 PSI. The press members 143 can be defined by any suitable rigid non-compressible material such as glass, Tungsten, or any suitable alternative material having a suitable hardness to compress the particles 62 without undergoing deformation, and without reacting with the particles 62. Further, the press surfaces 142 can be planar before they contact the particles 62, as they compress the particles 62 against the substrate 20, and after the hard pressing step 53 is completed. In particular, the planar press surfaces 142 can be parallel to the first and second surfaces 22 and 24, respectively, of the substrate 20.

It is recognized that the bumps 146 can be created without adding any additional layer to the substrate that artificially extend the holes 26, and thus the vias 34, beyond either or both of the first and second surfaces 22 and 24. For instance, the bumps 146 can be created without adding a sacrificial layer, such as a dry film resist, onto either or both of the first and second surfaces 22 and 24 of the substrate 20 that would artificially extend the holes 26, and thus the vias 34, beyond either or both of the first and second surfaces 22 and 24. In that regard, the filling steps 46 can be performed without first adding a dry film resist onto the surfaces 22 and 24. Accordingly, in one example, no portion of the holes 26 or vias 34 is defined by a layer of resist that extends out from either of the first and second surfaces 22 and 24. Further, the holes 26, and thus the vias 34, can be filled with the particles 62 without depositing an electrically conductive layer onto the first and second surfaces 22 and 24, for instance, gold or titanium, in order to artificially extend the hole 26 beyond the first and second surfaces 22 and 24. Accordingly, in one example, no portion of the holes is defined by a layer of titanium or gold that extends out from either of the first and second surfaces 22 and 24.

In some examples, the hard pressing step can be performed at atmospheric temperature and at a heated temperature, and the overfilled particles can be surface finished. In some examples, the heated temperature can be sufficient to cause all particles in the respective holes to sinter during the step of hard pressing.

Figure 23A:
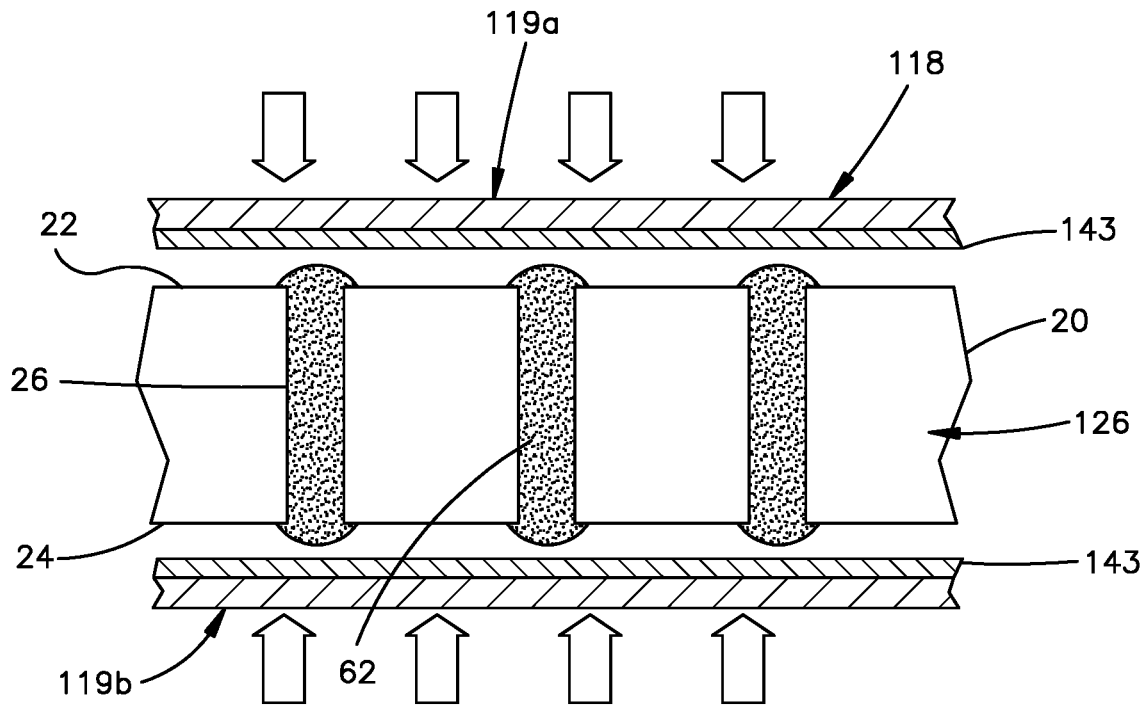
FIG. 23A is a schematic view of a uniaxial pressing step whereby the substrate is disposed between first and second press members disposed in a vacuum envelope.
Figure 23B:
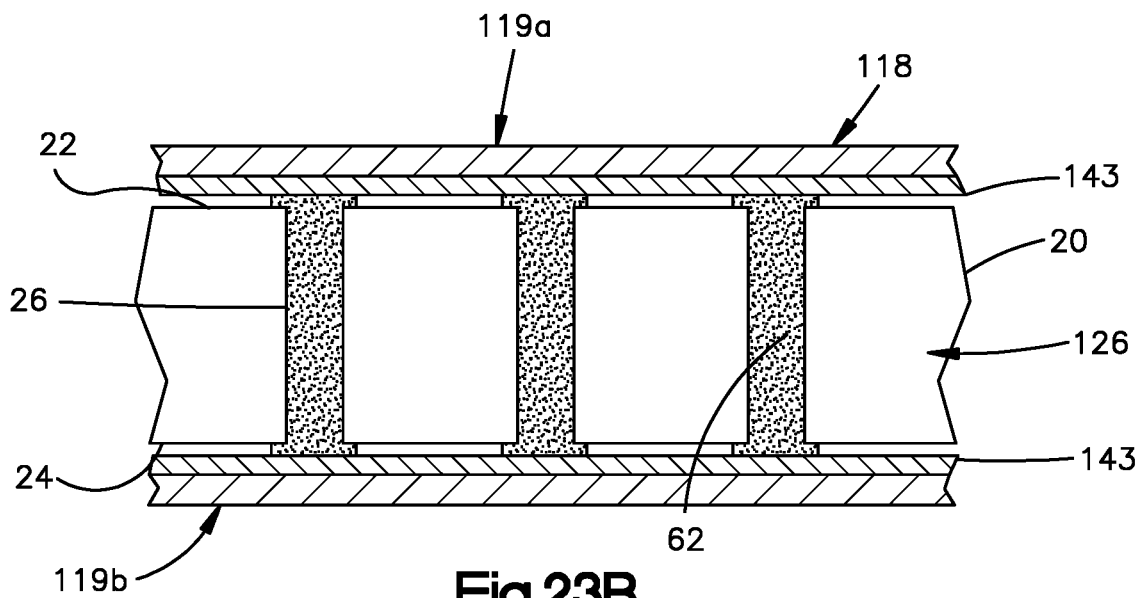
FIG. 23B is a schematic view of the uniaxial pressing step of FIG. 23A, showing the uniaxial force applied to the substrate.

Further, the pressing step 53 can be performed at atmospheric pressure. Alternatively, the pressing step 53 can be performed under vacuum. For instance, referring to FIGS. 23A-23B, first and second rigid press-members 143 can be disposed inside any suitable envelope, such as the envelope 118 described above with respect to FIGS. 8A-8B. Thus, the envelope can include a first laminate structure 119a and a second laminate structure 119b. The first and second laminate structures 119a and 119b can be impermeable with respect to airflow therethrough. It should be appreciated that the laminate structures 119a can be replaced by a single layer as desired. The substrate 20 can be placed in the envelope between the opposed press members 143, such that the first surface 22 faces a first one of the press members, and the second surface 24 faces the other of the press members 143. Thus, the first press member 143 is disposed between the first surface 22 and the first structure 119a, and the second press member 143 is disposed between the second surface and the second structure 119b. The interior of the envelope can be placed under vacuum in the manner described above. Next, the platens 141 can apply a compressive force to the envelope, and in particular to the first and second structures 119a and 119b, which is applied to the press members 143 inside the envelope. Thus, the respective press surfaces of the press members 143 apply a uniaxial force that compresses the electrically conductive fill against the substrate 20 in the manner described above. Alternatively, the pressing step 253 can be performed in an isostatic press, whereby isostatic pressure can be applied to the first and second press members 143 that causes the press members 143 to apply the uniaxial force to the electrically conductive fill.

The uniaxial force can be applied for any suitable duration lasting from seconds to several hours. The uniaxially force can further be applied while the substrate 20 is at any suitable temperature from approximately zero C to the melting temperature of the substrate 20. Thus, in one example, the pressing step 53 can be a cold hard pressing step at room temperature. Alternatively, the pressing step can be a warm or hot hard pressing step at a temperature greater than room temperature up to the melting temperature of the substrate 20. For instance, the temperature can be up to approximately 1200 C. The temperature of the platen 141 during the pressing step can be sufficient to soften and deform the electrically conductive fill, but not liquify it. The platen 141 can heat the electrically conductive fill directly or through the press members 143. Thus, the pressing step 53 can forge the electrically conductive fill in some examples. The uniaxial forces can range up to approximately 100,000 PSI.

Figure 24A:
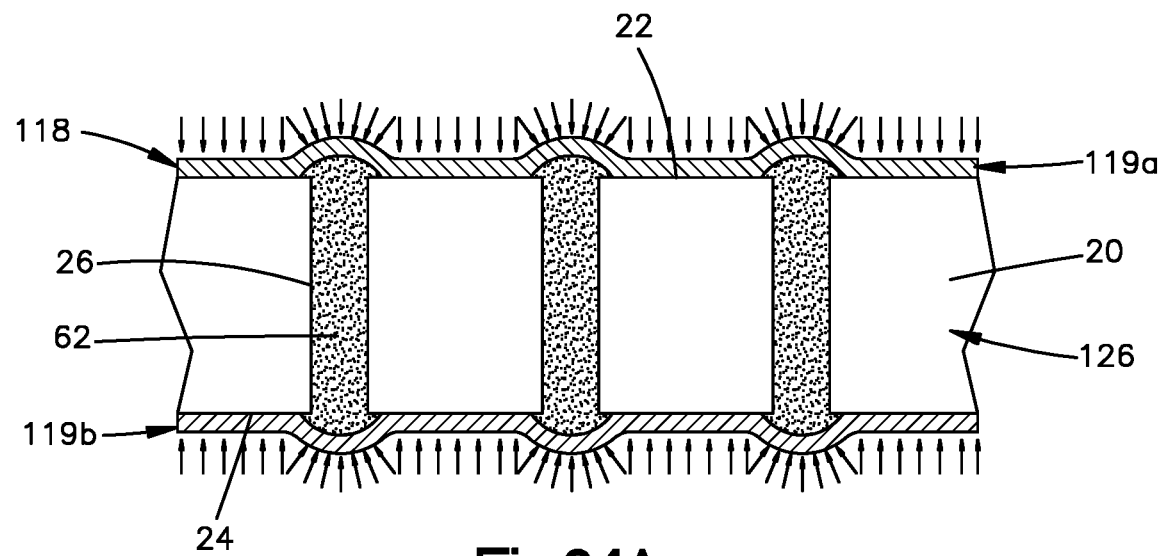
FIG. 24A is a schematic view of an isostatic pressing step whereby the substrate is disposed in a vacuum envelope and configured to be pressed by first and second opposed structures of the envelope.

Alternatively still, referring now to FIG. 24A, an isostatic force can be applied to the substrate 20 and electrically conductive fill disposed inside the envelope between the first and second opposed structures 119a and 119b. In one example, the isostatic forces are applied to the envelope, and the structures 119a and 119b, which are malleable, can apply the isostatic forces directly to the substrate 20 and electrically conductive fill. When the isostatic forces are applied to the envelope, the first structure 119a conforms to the first surface 22 and the first end of the electrically conductive fill, and the second structure 119b confirms to the second surface 24 and the second end of the electrically conductive fill. The first and second structures 119a and 119b thus apply isostatic compressive forces to the overfilled portions of the electrically conductive fill that extend beyond the first and second surfaces 22 and 24 of the substrate 20. The isostatic forces can be applied to the overfilled portions of the electrically conductive fill along a direction substantially normal to the outer surfaces of the overfilled portions. The resulting first and second portions of the overfilled electrically conductive fill can be compressed and densified, and define substantially dome shaped outer surfaces after isostatic pressure has been applied.

Figure 24B:
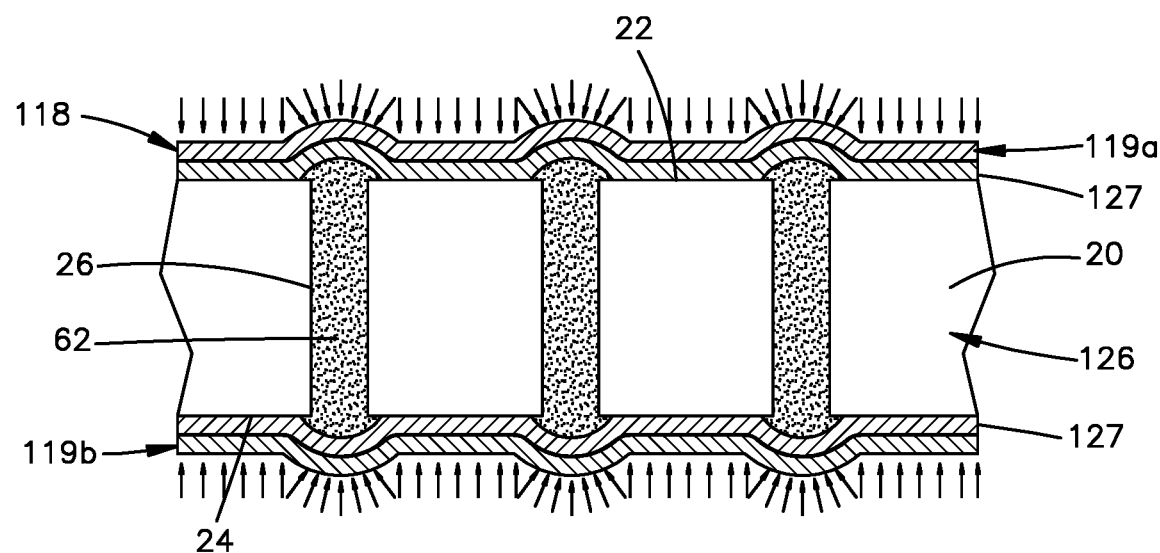
FIG. 24B is a schematic view of an isostatic pressing step whereby the substrate is disposed in a vacuum envelope and configured to be pressed by first and second layers disposed between the substrate and opposed first and second structures of the envelope, respectively.

Alternatively, referring to FIGS. 24B, any suitable malleable layers 127 can be disposed in the envelope and configured to apply the isostatic forces to the substrate 20 and both opposed ends of the sintered electrically conductive fill. Thus, the malleable layers 127 can define respective press surfaces that are configured to bear against the overfilled portions of the sintered electrically conductive fill. The malleable layers 127 can be configured as any suitable high temperature polymer such as Polytetrafluoroethylene (PTFE), or can alternatively be a metal foil. In this regard, it is appreciated that the malleable layers 127 are resistant to melting or decomposing. The malleable layers 127 can also advantageously resist adhering to, or altering material composition of, the substrate 20 and the electrically conductive fill. Isostatic forces are applied to the envelope, which causes isostatic pressure applied to the first and second structures 119a and 119b to be applied to the first and second malleable layers 127, respectively. Thus, when the isostatic forces are applied to the envelope, the first malleable layer 127 conforms to the first surface 22 and the first end of the electrically conductive fill, and the second malleable layer 127 confirms to the second surface 24 and the second end of the electrically conductive fill. The malleable layers 127 thus apply isostatic compressive forces to the overfilled portions of the electrically conductive fill that extend beyond the first and second surfaces 22 and 24 of the substrate 20. The isostatic forces can be applied to the overfilled portions of the electrically conductive fill along a direction substantially normal to the outer surfaces of the overfilled portions. The resulting first and second portions of the overfilled electrically conductive fill can be compressed and densified, and define substantially dome shaped outer surfaces after isostatic pressure has been applied.

During the pressing step 53, the isostatic forces can be applied at room temperature (also known as a cold isostatic press). Alternatively, the isostatic forces can be applied at an elevated temperature, up to approximately 2,200 C, for instance from in a range from approximately 45 C to approximately 500 C. Thus, the temperature of structures 119a and 199b, alone or in combination with the malleable layer 127, can be elevated with respect to room temperature as the isostatic forces are applied to the substrate and electrically conductive fill. When the isostatic forces are applied at the elevated temperature, it is desirable to construct the envelope such that the first and second structures 119a and 199b do not melt against the substrate and electrically conductive fill. The isostatic pressure can be applied up to approximately 100,000 PSI.

Referring now also to FIG. 3, it is recognized that the pressing step 53 can be performed after the sintering step 52 as described above. Further, the pressing step 53 can be performed alone or in combination with one or more of the compacting steps 50. Alternatively, the pressing step 53 can be performed in the method 40 whereby no compacting steps 50 are performed. Alternatively, the method 40 can include one or more compacting steps 50 whereby no pressing steps 53 are performed. When the method includes the pressing step 53 but not the compacting step 50, outer portions of the electrically conductive fill can have a greater density at its outer ends than the portion of the electrically conductive fill that extends from the first outer portion of the electrically conductive fill to the second portion of the electrically conductive fill.

In still other examples, the pressing step 53 can be performed prior to the sintering step 52. In particular, one or more filling steps 46 can be performed until the electrically conductive particles overfill the holes 26, such that the particles extend beyond the first and second surfaces 22 and 24 as described above. Next, after the pressing step 53, the electrically conductive particles can be sintered at step 52 as described above. Alternatively, the sintering step 52 and the pressing step 53 can be performed simultaneously. That is, the electrically conductive particles can be sintered while under isostatic pressure that performs the pressing step 53. Therefore, the pressing step 53 can be performed to the sintered electrically conductive fill, to the unsintered electrically conductive particles, or to the electrically conductive particles as they are sintered.

In some examples, the method 40 can include the step 54 (see FIG. 3) of sealing the via. In one example, the sealing step can be performed by polishing or surface finishing the particles 62. In particular, as illustrated at FIG. 16A-16B, the outwardly-facing surface of the sintered particles 62 at each of the first and second surfaces 22 and 24 can be polished to increase the planarity of the outward-facing surface of the sintered particles 62. It is recognized that the outwardly-facing surface of the sintered particles 62 can be defined by the final fill. For instance, the outwardly-facing surface of the sintered particles 62 at each of the first and second surfaces 22 and 24 can be pressed with a wand 166 that is driven across the respective surface. The wand 166 can have a hardness greater than that of the electrically conductive material and less than that of the substrate. For instance, the hardness can be greater than one or both of silver and copper, and less than glass. Thus the wand 166 can cause the sintered particles 62 at each of the first and second surfaces 22 and 24 to change its shape without compromising the integrity of the substrate. In particular, the wand 166 can change the shape of the overfilled portion of the sintered particles at each of the first and second surfaces so as to seal the openings to the via at one or more interfaces between the electrically conductive material and the substrate 20. For instance, the interfaces can be disposed at the first and second surfaces 22 and 24, respectively, of the substrate 20. In one example, the wand 166 can be made of nickel. It is recognized that the sintered particles 62 at the first and surfaces 22 and 24 can be defined by the final fill as described above. Thus, it can be said that the final fill defines end caps 161 of the via 34. Further, the end caps can hermetically seal the via. The end caps 161 can be surface finished as described above.

The wand 166 can be pressed into the final fill and moved across the final fill so as to cause a plurality of the interstices at the first and second ends of the via to plug with electrically conductive material. The ductility of silver or copper final fill can be particularly suitable for this purpose. Further, the final fill can be pressed over the one or more interfaces with the opening to the hole 26 at each of the first and second surfaces 22 and 24 of the substrate 20. In one example, the sealing step 54 can be performed in a vacuum, such that both the substrate 20 and the wand 166 can be disposed in a vacuum environment during surface finishing of the electrically conductive material. It should be appreciated that the step of surface finishing the electrically conductive material can further level the electrically conductive material. Alternatively or additionally, the sealing step 54 can include the step of applying a vacuum deposition of electrically conductive material into the electrically conductive material at the ends of the via so as to one or both of 1) plug a plurality of the interstices, and 2) fill the openings at the interfaces between the electrically conductive material and the substrate 20. Alternatively or additionally, the sealing step 54 can include vacuum melting of the electrically conductive material so as to one or both of 1) plug a plurality of the interstices, and 2) fill the openings at the interfaces between the electrically conductive material and the substrate 20.

The sealing step 54 can produce a hermetic via having a hermeticity less than approximately $10^{-7}$. For instance, the hermeticity can be less than approximately $10^{-8}$. For instance, the hermeticity can be less than approximately 10'. For instance, the hermeticity can be less than approximately $10^{-10}$. For instance, the hermeticity can be less than approximately $10^{-11}$.

However, it is recognized that the pressing step 53 and subsequent steps can replace the sealing step 54. Thus, the method 40 can include the pressing step 53 and omit the sealing step 54. Alternatively, the method 40 can include the sealing step 54 and omit the pressing step 53. Alternatively still, it is envisioned that the method can include both the sealing step 54 and the pressing step 53. The pressing step 53 can be performed prior to the sealing step 54. Alternatively, the pressing step 53 can be performed after the sealing step 54. As illustrated at FIGS. 16A-16B, is appreciated that the sealing step 54 can seal the ends of the vias 34 at the first and second sides of the substrate that define the first and second surfaces 22 and 24, respectively. Thus, the vias 34 can be hermetic. Accordingly, the electrically conductive material of the sintered particles 62, and thus also of the via 34, can be substantially nonporous at each of the first surface 22 and the second surface 24. In particular a wand can smear the particles along the outer surfaces of the glass. Alternatively, as described above, the sealing step 54 can be omitted from the method 40.

In some examples, the sealing step 54 can include, alone or in combination with one or both of the pressing step 53 and the driving the wand across the final fill as described above, the step of selectively laser sintering the one or both of the outer ends of the final fill to define dense end caps that are substantially nonporous and further seal the via 34. Thus, at least one or both of the outer ends of the final fill can define a substantially nonporous laser-melted end cap at its outer end. In particular, after the step 52 (see FIG. 3), a laser light can be directed selectively at the at least one or both ends of the final fill sufficient to cause the final fill to melt and define the dense end cap. The step of directing the laser light can be performed at a controlled pulse time and intensity of the laser so as to melt the outer ends of the final fill, thereby defining the dense end cap. As described above, the final fill can be filled beyond the hole, such that an overfilled portion of the final fill extends beyond either or both of the first and second outer surfaces 22 and 24 of the substrate (see, e.g., FIGS. 12B-12C). The laser light can be directed at the overfilled portion of the final fill. The laser can be a green laser in some examples. The dense end cap can define a barrier to either or both of gas and liquid with respect to penetration into the hole. As described in more detail below, the dense end cap can be at least partially defined by sintered flakes or flake particles 225 (see FIG. 25)

In other examples, instead of surface finishing with a wand, a polishing or lapping method can be used to surface finish the particles. In particular, the particles can be overfilled and sintered in the manner described above, and subjected to hard press or isostatic press before or after sintering as desired. The overfilled particles can be polished using a polishing substrate that can be constructed as desired, and made of CeO2 in some examples.

Alternatively, or additionally, an electrically conductive conformal coating can be applied to the ends of the vias after the sintering step 52. In this regard, the conformal coating can be applied after the pressing step 53. Alternatively, the conformal coating can be applied prior to performing the pressing step 53. Alternatively still, the conformal coating can be applied when the method 40 does not include the pressing step 53. For instance, the conformal coating can be applied to one or both of the outer surfaces 22 and 24 of the substrate, and to the via that can be substantially planar with the surfaces 22 and 24 of the substrate 20. The conformal coating can be applied to the ends of the vias using any suitable deposition technique as desired. In one example, the conformal coating can be applied to the particles 62 of the final fill at the ends of the vias, if a final filling step was performed. Alternatively, the conformal coating can be applied to the particles 62 of the bulk fill at the ends of the vias. In one example, the conformal coating can be electroplated to the particles 62. Alternatively, the conformal coating can be deposited through variations of such techniques as evaporation, physical vapor deposition (PVD), or Chemical Vapor Deposition (CVD) such as atomic layer deposition (ALD). Alternatively still, the conformal coating can be applied in an electroless plating step.

It is recognized that the conformal coating can occupy, and in some instances fill, the interstices 66 that are defined between adjacent ones of the particles as described above with respect to FIGS. 7A-7C. In some examples, the final fill can include palladium. The palladium can be present in any suitable amount, such as from approximately 0.5% to approximately 30% of the final fill by weight. For instance, the palladium can be present in an amount within a range from approximately 0.5% to approximately 1% final fill by weight. Alternatively, the palladium can be present in an amount within a range from approximately 10% to approximately 30% final fill by weight. For instance, in a bimodal distribution of the second particles 62b, the second bimodal particles can be defined by palladium as described above. Alternatively, the second bimodal particles can be at least partially or entirely bismuth. Alternatively, the second bimodal particles can be at least partially or entirely aluminum. Alternatively, the second bimodal particles can be at least partially or entirely tin. Alternatively, the second bimodal particles can be at least partially or entirely copper.

Alternatively, or additionally still, after the final compaction step, any suitable metal can be deposited into the interstices of the particles 62, and in particular the particles 62b of the final fill. It is recognized that it may also be desirable to deposit metal into the interstices defined by the first particles 62a of the first fill. For instance, in one example, an electroplatable metal can be electroplated into the interstices of the silver particles 62 disposed in the hole. Thus, the electroplatable metal can at least partially or substantially fill the interstices. The electroplating step can be performed prior to the sintering step 52 or after the sintering step 54. The electroplatable metal can be any one or more up to all of aluminum, copper, titanium, silver, or any suitable alternative metal or alloy thereof as desired.

In another example, a metal can be deposited into the interstices using any suitable process, such as chemical vapor deposition. In particular, the process can be a metal organic chemical vapor deposition. For instance, the process can be an atomic layer deposition process. The deposition can take place under vacuum. The chemical vapor deposited metal can be at least one of indium, aluminum, bismuth, copper, titanium, silver, or any suitable alternative metal as desired. The metal deposited in the interstices decreases the porosity of the fill. Thus, when the metal is deposited in the interstices of the bulk fill, the porosity of the bulk fill decreases. Similarly, when the metal is deposited in the interstices of the final fill, the metal disposed in the interstices can decrease the porosity of the end caps defined by the final fill. The chemical vapor deposition can take place before the particles of the bulk and final fills are sintered. Alternatively, the chemical vapor deposition can take place after the particles of the bulk and final fills are sintered, but prior to surface finishing the end caps in the manner described above.

In still another example, a metal can be sputtered onto one or both of the bulk fill and the final fill. For instance, the metal can be sputtered onto the bulk fill prior to introducing the final fill particles 62b into the hole. The metal can be sputtered before the bulk fill has been compacted. Alternatively, the metal can be sputtered onto the bulk fill after the bulk fill has been compacted but before the particles have been sintered. Alternatively, the metal can be sputtered onto the bulk fill after the particles have been sintered. For instance, in some examples the bulk fill can be sintered prior to filling and subsequently sintering the final fill. In this regard, it is recognized that the bulk fill and the sputtered metal can be heated to elevated temperatures during downstream processes, such as application of the redistribution layer, that cause the sputtered material to melt. The melted sputtered material can then travel into the interstices of the bulk fill. The metal can be aluminum, copper, titanium, silver, indium, aluminum, bismuth, tin, or any suitable alternative metal or alloy thereof as desired Alternatively or additionally, the metal can be sputtered onto the final fill. For instance, the metal can be sputtered onto the final fill. The metal can be sputtered onto the final fill before the final fill has been compacted. Alternatively, the metal can be sputtered onto the final fill after the final fill has been compacted but before the particles have been sintered. Thus, the sintering temperature can cause the sputtered metal to melt and travel into the interstices. Alternatively, the metal can be sputtered onto the final fill after the particles have been sintered. Further, the metal can be sputtered onto the final fill before the final fill has been surface finished, such that the sputtered metal can travel into the interstices, for instance when the redistribution layer is applied. Alternatively, the metal can be sputtered onto the final fill before the final fill has been surface finished. While it is recognized that the resulting surface finished final fill may lack the porosity for the sputtered metal to travel into the interstices, it is recognized that should porosity develop in the final fill, and in particular the end caps, during the application of the redistribution layer, the sputtered metal can melt and flow into the pores, thereby decreasing the porosity of the final fill including the end caps.

Thus, conformal coating that is deposited into the interstices can further seal the first and second surfaces 22 and 24 of the substrate 20. The sealing step can prevent one or both of gaseous and liquid contaminants from entering the hole and traveling into the interstices between adjacent particles. Alternatively or additionally, the sealing step can prevent one or both of gaseous and liquid contaminants from entering into pores of the electrically conductive material.

Figure 25:
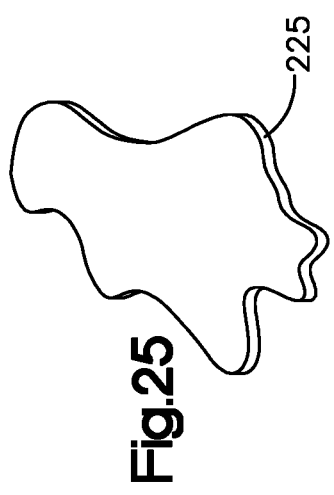
FIG. 25 is a perspective view of a flake particle among a plurality of flake particles deposited at one or both outer ends of the final fill.

Referring now to FIG. 25, the electrically conductive fill, and in particular the final fill, can include a plurality of flakes 25. In particular, the flakes 25 can be deposited onto the final fill. For instance, the flakes 25 can be deposited onto the particles 62b of the final fill. In particular, the flakes 25 can be deposited onto either or both of the opposed ends of the final fill. As will be appreciated below, the flakes can be hard pressed and sintered so as to define a substantially nonporous layer that provides a barrier with respect to ingress of either or both of liquid and gas into the hole 26.

The flakes 25 can be irregularly shaped, and can be sized and shaped differently from each other. The flakes 25 can have an average specific surface area within a range from approximately 0.3 meter squared per gram up to approximately 1.5 meter squared per gram. For instance, the specific surface area can range from approximately 0.3 meter squared per gram up to approximately 1 meter squared per gram. In one example, the specific surface area can be approximately 0.76 meter squared per gram. It is recognized, of course, that the flakes 25 can have any suitable specific surface area as desired. Further, a majority of the flakes can have an average aspect ratio within a range from approximately 2:1 to approximately 10:1. In one example, the flakes can be ball milled. Alternatively, the flakes are attritor milled. Alternatively still, the flake particles can be planetary milled. Alternatively still, the flakes can be cryo-milled. In this regard, it should be appreciated that the flakes can be fabricated in any suitable manner as desired. The flakes 25 can be the same metal as the final fill. Alternatively, the flakes 25 can be or a different metal than the final fill. Thus, the flakes can be copper, silver, gold, aluminum, silver coated copper, aluminum, or the like.

When the flakes 25 are pressed, for instance using either or both of the hard press and the isostatic press described herein, the flakes can fracture into flake particles and become packed at either or both outer ends of the final fill so as to define a layer disposed at an either or both outer ends of the final fill. The flake particles can, for instance, have a density from approximately 80 percent to approximately 98 percent. The flake particles can be sintered so as to define a dense substantially nonporous coating that extends along the outer ends of the final fill. For instance, the flakes 25 can be applied to the final fill before the sintering step 52 described above. Alternatively, the flakes 25 can be applied after the sintering step 52. The flakes 52 can thus be sintered during the process of downstream operations, such as application of the redistribution layer. Alternatively, the flakes can be sintered using laser sintering described herein.

Figure 17:
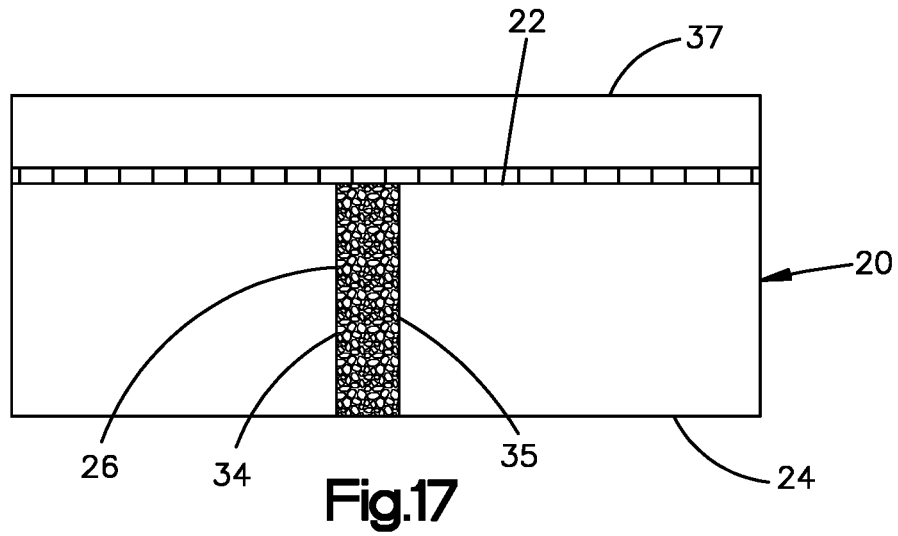
FIG. 17 is a schematic view of the substrate of FIG. 16A showing an electrically conductive redistribution layer applied to the substrate in accordance with one example.
Figure 18B:
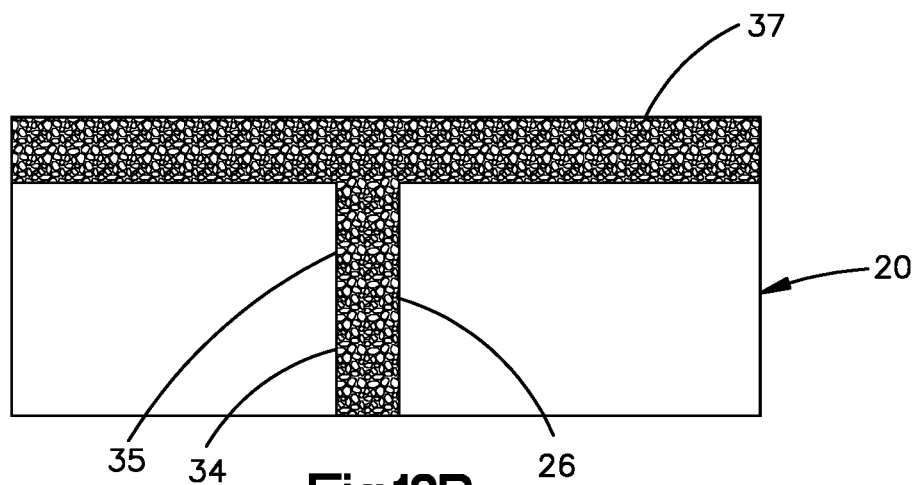
FIG. 18B is a schematic view of the substrate of FIG. 18A showing an electrically conductive redistribution layer applied to the substrate in the trench.
Figure 19E:
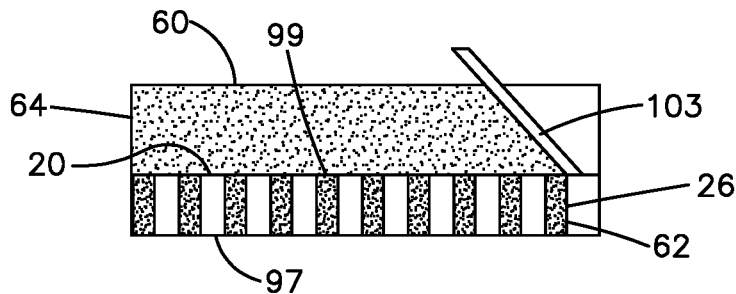
FIG. 19E is a schematic side view of the bucket illustrated in FIG. 19D, showing removal of suspension from an outer surface of the substrate.

Finally, a redistribution layer (RDL) can be applied to the substrate 20 as desired. For instance, referring now to FIGS. 17-18B, the redistribution layer 37 can be applied to one or both of the first and second surfaces 22 and 24 of the substrate 20 so as to be in electrical communication with the via 34, and thus with the electrically conductive material in the via. For instance, a sputter layer can be applied, and electrically conductive metal plating can be applied over the sputter layer in the usual manner. As illustrated in FIG. 18A, alternatively a trench 170 can be formed a respective at least one of the first and second surfaces 22 and 24. It should be appreciated that the trench 170 can be open to the hole 26 and via. Accordingly, the methods such as vacuum, centrifugal force, and electrostatic force, for causing the particles to enter the hole can also be used to cause particles to enter the trench. The particles can be dried, packed, and sintered as described above to define the redistribution layer 37.

It should be appreciated that the redistribution layer 37 can be constructed in accordance with any suitable alternative embodiment. Referring now to FIG. 18C, the redistribution layer 37 can be disposed on at least one of the first surface 22 of the substrate 20 and the second surface 24 of the substrate 26. Thus, while the redistribution layer 37 is described as extending along the first surface 22 of the substrate 20, it should be appreciated that the description applies with equal force and effect to the redistribution layer that extends along the second surface 24 of the substrate 20.

In one example, the redistribution layer 37 can include an electrically conductive conformal coating 420 that is deposited onto the first surface 22, and thus is in electrical communication with the via 34. For instance, the coating 420 can be vapor deposited onto the first surface 22. In one example, the coating 420 can include a first layer 422 that bonds to the substrate 20. If the electrically conductive coating 210 described above with respect to FIGS. 21A-21B is deposited on the first surface 22 of the substrate 20, the electrically conductive coating 420, and in particular the first layer 422, can extend over, and be deposited onto, the coating 210. The first layer 422 can be referred to as an adhesion layer. The first layer 422 can be defined by any suitable first metal. For instance, the first metal can be titanium, tantalum, or chrome, palladium, aluminum, or an alloy of titanium, or tungsten, silver, or palladium. The first layer 422 can be vapor deposited onto the first surface 22. The vapor deposition can be a physical vapor deposition (PVD). Thus, the first layer 422 can be applied to the first surface 22 via any one of ionized physical vapor deposition (iPVD), magnetron sputtering, DC sputtering, and evaporation deposition. The first layer 422 can have any suitable thickness as desired. For instance, the thickness can range from approximately 1 nanometer (nm) to approximately 100 nm. In particular, the thickness of the first layer 422 can range from approximately 1 nanometer (nm) to approximately 50 nm. In one example, the thickness can range from approximately 5 nm to approximately 10 nm.

The coating 420 can further include a second layer 424 that bonds to the first layer 422, and extends away from the substrate 20. The first layer 424 can be defined by any suitable second metal. For instance, the second layer 424 can be defined by a second metal. The second metal can be silver, copper, or alloys thereof. The second layer 424 can be vapor deposited onto the first layer 422. The vapor deposition can be a physical vapor deposition (PVD). Thus, the second layer 424 can be applied to the first layer 422 via any one of ionized physical vapor deposition (iPVD), magnetron sputtering, DC sputtering, and evaporation deposition. The second layer 424 can have any suitable thickness as desired. In one example, the thickness of the second layer 424 can be greater than the thickness of the first layer 422. For instance, the thickness of the second layer 424 can range from approximately 0.5 micron to approximately 3 microns. The second layer 424 can thus be thicker than the first layer 422.

The coating 420 can be patterned as desired. For instance, a photoresist can be applied to the outer surface of the second layer 424 to reveal exposed portions of the second layer 424. Next, an etching process can be applied to the second layer 424 that removes the exposed portions of the second layer 424 and aligned portions of the underlying first layer 422 (see FIG. 18D). The etching process can be a wet etching process, or any suitable alternative etching process as desired such as a dry etching process.

Referring now to FIG. 18D, an electrically conductive third layer 426 can be electroplated or electrochemically deposited onto the second layer. The second layer 424 and the third layer 426 can thus be defined by a common metal. The common metal can be copper in one example. In another example, the common metal can be silver. In still another example, the common metal can be aluminum. The third layer 426 can have any suitable thickness as desired. For instance, the third layer 426 can be thicker than the first layer 422. For instance, the thickness of the third layer 426 can range from approximately 2 microns to approximately 10 microns.

Alternatively, referring to FIG. 18E, the redistribution layer 37 can include a third layer 428 that is deposited onto the second layer 424. For instance, the third layer 428 can be vapor deposited onto the second layer 424. The vapor deposition can be a physical vapor deposition (PVD). Thus, the third layer 428 can be applied to the second layer 424 via any one of ionized physical vapor deposition (iPVD), magnetron sputtering, DC sputtering, and evaporation deposition. The third layer 428 can be configured as an antireflective metallic layer that is disposed on the second layer 424 and designed to assist with patterning the second layer 424 (and the underlying first layer 422). The third layer can be made of any one of titanium, tantalum, chrome, palladium, aluminum, and an alloys of titanium, tungsten, silver, and palladium. The third layer 428 can have any suitable thickness as desired. For instance, the thickness can range from approximately 5 nm to approximately 100 nm.

The third layer 428 can be patterned as desired. For instance, a photoresist can be applied to the outer surface of the third layer 428 to reveal exposed portions of the third layer 428. Next, an etching process can be applied to the third layer 428 that removes the exposed portions of the second layer 428 and aligned portions of the underlying second first layer 424 and first layer 422. Thus, the second layer 428 and the first layer 424 can be similarly patterned. The etching process can be a wet etching process, or any suitable alternative etching process as desired such as a dry etching process. Next, a metallic fourth layer 430 can be deposited onto the patterned third layer 428. For instance, the fourth layer can be electrochemically deposited onto the third layer 428. The fourth layer 430 can be copper, silver, or aluminum, or the like. For instance, the fourth layer 430 can be the same material as the second layer 424. The fourth layer 430 can have any suitable thickness as desired. For instance, the fourth layer can be thicker than the second layer. In particular, the fourth layer 430 can have a thickness within a range from approximately 2 microns to approximately 10 microns.

Alternatively still, after the third layer 428 has been patterned, the remaining portion of the third layer 428 can be removed. In particular, the remaining portion of the third layer 428 can be selectively etched without removing the second layer 424. Next, a metallic layer can be deposited directly onto the second layer 424. For instance, the metallic layer can be electrochemically deposited onto the second layer 424. The metallic layer can be one of copper, silver, aluminum, or any suitable alternative metal. Thus, the metallic layer can be the same metal as the second layer 424. The metallic layer can have any suitable thickness as desired. For instance, the metallic layer can have a thickness within a range from approximately 2 microns to approximately 10 microns.

Referring again to FIGS. 1A-4, the resulting via 34 defines the electrically conductive material of the particles 62, which can be a metal, and voids defined by the interstices between adjacent particles in the solid material, which can also be referred to as gaseous pores, that are defined by the interstices described above that have not been filled during method 40. The resulting via can further define the conformal coating if applied as described above. The electrically conductive material of the particles 62 can define a scaffold matrix designed to have internal gaseous voids or pores that are arranged along a majority of a length of the hole substantially from the first surface 22 substantially to the second surface 24. The sintered electrically conductive material defines an electrically conductive path substantially from the first surface substantially to the second surface. The pores can define at least 25% of a total volume of the via up to 75% of the via in certain examples. However, it is appreciated that the pores can define less than 25% of the total volume of the via in other examples. Further, the pores can be substantially homogeneously arranged along the majority of the length of the via. The resulting via can define non-linear electrically conductive paths substantially from the first surface 22 substantially to the second surface 24. The resulting electrically conductive web matrix defined by the sintered particles can define at least one airflow path that extends from a first terminal end of the web matrix to the second terminal end of the web matrix. The first and second terminal ends can be defined by the nonporous end caps.

Thus, the web matrix can include an electrically conductive material including sintered and surface finished particles that define a continuous electrically conducive interlinked network along a majority of a length of the hole 26 substantially from the first surface 22 substantially to the second surface 24, wherein the electrically conductive material is not fused with the substrate in the hole 26, and wherein the electrically conductive material defines an electrically conductive path along an entirety of the length of the via.

The electrically conductive fill 35 of the via 34 can be defined by the matrix of a plurality of electrically conductive particles that are packed and subsequently sintered so as to bond adjacent ones of the particles to each other. It will be appreciated from the description below that the electrically conductive path can define any shape as desired. It is envisioned that at least a portion of the electrically conductive path is nonlinear.

It can be desirable to fill the pores with a non-gaseous material to limit or eliminate gas that can expand during subsequent processes, such as application of a redistribution layer to the substrate 20. In one example, the electrically conductive fill can include silver or copper particles that can be mixed with other electrically conductive materials to produce a distribution of particles whereby the electrically conductive other electrically conductive materials can occupy some of the interstices defined by the silver or copper particles. The other electrically conductive materials can include one or more of electrically conductive polymers, electrically conductive metals, electrically conductive ceramics, electrically conductive compounds, or the like, such as graphene, electrically conductive carbides, and intermetallic composites. Alternatively or additionally, supercritical fluids have extremely low surface tension, and can be used to deposit metal. It is envisioned that they can at least partially fill the interstices in the vias after the sintering step. Supercritical fluid carries metal with low surface tension so metal can enter tight spaces. Accordingly, the metal can be deposited in the holes 26. Another option is to the supercritical deposition of nanoparticles in the hole, thereby occupying at least a portion of the interstices.

In one example, a metal can be electroplated into the interstices of the final fill. The metal can be at least one or more of tungsten, copper, titanium, aluminum silver, and alloys thereof. Alternatively or additionally, a metal can be deposited into the interstices (see FIGS. 7A-7C) of the final fill. The metal can be at least one or more of tungsten, copper, titanium, silver, and alloys thereof. In one example, the metal can be deposited using a chemical vapor deposition process. For instance, the chemical vapor deposition process can be a metal organic chemical vapor deposition process, a plasma-enhanced chemical vapor deposition process, or an atomic layer deposition process. The deposition can take place under vacuum. The deposition can be performed after the final fill has been packed. Further, the deposition can be performed prior to sintering the fill. Alternatively, the deposition can be performed after sintering.

It is recognized that methods for cleaning the substrate 20 are provided as desired. For instance, residual suspension can be cleaned off, or removed from, the first and second surfaces 22 and 24 as desired, including before the compacting step, before the sintering step, and before the surface finishing step, and after the surface finishing step. The residual suspension can be removed, for instance, by driving a wand along one or both surfaces 22 and 24 of the substrate 20 using any suitable wand in the manner describe above. The wand can have a hardness greater than the residual suspension but less than that of the substrate 20. For instance, the wand can be a Teflon wand or a rubber wand. Alternatively or additionally, an alcohol such as IPA alone or in combination with a soft semi-abrasive material can be placed on one or both of the first and second surfaces 22 and 24, and the wand can be driven along the surfaces 22 and 24 in the manner described above to remove residual powder.

Figure 28:
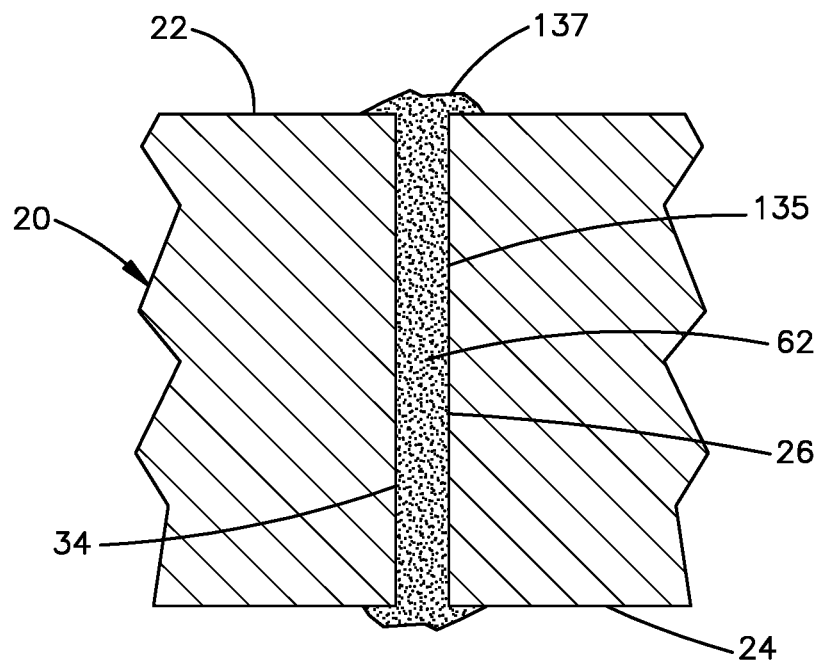
FIG. 28 is a schematic sectional view of a metallized via including a hole filled with an electrically conductive material, and a polymer that at least partially fills one or more pores of the electrically conductive material.

In another example, referring to FIG. 28, and as described above, the electrically conductive via 34 can include the hole 26 that extends at least into or through the substrate 20, and a sintered electrically conductive material 135 that establishes an electrical path from the first surface 22 of the substrate 20 to the second surface 24 of the substrate 20. The electrically conductive material 135 can be defined by the sintered electrically conductive fill 35 of electrically conductive particles 62 as described herein. The sintered electrically conductive fill 35 can at least partially define at least one gaseous pore, such as a plurality of pores. The pores can be arranged between the first and second surfaces 22 and 24 of the substrate 20. The at least one pore can be at least partially defined by the electrically conductive particles 62 of the electrically conductive fill 35. For instance, the pores can be defined by the interstices that are, in turn, defined by the electrically conductive particles 62 as described above. Alternatively or additionally, one or more pores can be defined between the electrically conductive particles 62 of the electrically conductive fill 35 and the internal surface of the substrate 20 that defines the hole 26. If the electrically conductive coating 210 is applied to the internal surface of the substrate 20 as described above with reference to FIG. 27, then one or more of the pores can be defined between the coating 210 and the electrically conductive particles 62 of the electrically conductive fill 35.

In other examples, the electrically conductive material 135 can be defined by an electrically conductive paste that contains electrically conductive particles. One example of such a thick film lead-free paste is described in PCT Publication No. WO 2018/094162 A1, the disclosure of which is hereby incorporated by reference as if set forth in its entirety herein. It is recognized that some electrically pastes can become porous after sintering. The sintered electrically conductive paste can at least partially define at least one gaseous pore, such as a plurality of pores. For instance, shrinkage of the pastes during sintering can create pores that are disposed between the internal surface of the substrate 20 and the sintered paste. If a coating is applied to the internal surface of the substrate 20, then the pores can be defined between the coating and the sintered paste. In still other examples, pores can be defined by the sintered paste itself. The at least one pore defined by the paste can be arranged between the first and second surfaces 22 and 24 of the substrate 20.

It can be desirable to fill the pores with a non-gaseous material so as to remove gas, that would other occupy the pores, from the via. Removal of the gas limits or prevents expansion of gas inside the via during subsequent processing, such as application of a redistribution layer which occurs at elevated temperatures. The non-gaseous material can be a flowable viscous polymer 137 that hardens when cured. The polymer 137 can be an electrically conductive polymer. For instance, the polymer can include a plurality of suspended metallic particles. The metallic particles can be silver, copper, gold, or any suitable electrically conductive metal. Alternatively, the polymer can be an electrically nonconductive polymer, recognizing that the electrically conductive fill 35 can establish an electrically conductive path from the first surface 22 of the substrate 20 to the second surface 24 whether the polymer is electrically conductive of nonconductive. When the resulting electrically conductive via 34 includes the coating 210, the coating 210 and the polymer 137 can combine to define a barrier to one or both of gas and liquid with respect to the penetration of one of gas and liquid, respectively, into the via 34.

When the electrically conductive material 135 is defined by the electrically conductive particles 62 of the fill 35, the fill 35 can include a bulk fill and a final fill that extends from the bulk fill to either or both of the first and second surfaces 22 and 24 as described above. The pores of the fill 35 can be networked so as to establish a path from the first end of the via to the second end of the via. Similarly, when the electrically conductive material 135 is a paste, the pores of the paste can be networked so as to establish a path from the first end of the via to the second end of the via. In such examples, the polymer can be introduced into the hole 26 under a pressure differential. For instance, the polymer can be applied to one of the first and second surfaces 22 and 24 of the substrate 20, including the first and second ends of the via, and a negative pressure, or vacuum, can be applied to the other of the first and second surfaces that draws the polymer into the hole 26 through the pores. In other examples, it is recognized that the pores might not establish a path from the first end of the via to the second end of the via. Therefore, a vacuum would be insufficient to draw the polymer into the hole 26. In such examples, the polymer can be applied to either or both of the first and second surfaces 22 and 24, including the first and second ends of the via, and pressed into the hole 26. For instance, forces from an isostatic press or hard press can cause the polymer to be introduced into the hole. The polymer flows into the pores as it is introduced into the hole.

In some examples, the polymer 137 can be introduced into the hole 26 after both the bulk fill and the final fill have been introduced into the hole and sintered. In other examples, the polymer 137 can be introduced into the hole 26 after the bulk fill has been introduced into the hole 26 and before the final fill is introduced into the hole. In this regard, the bulk fill can be sintered prior to introducing the polymer 137 into the hole 26. Next, the polymer 137 can be cured. Because the polymer reduces or substantially eliminates the porosity of the bulk fill, a vacuum may be insufficient to draw suspension including the final fill into the hole 26. Accordingly, it may be desirable to introduce the final fill into the hole 26 under centrifugal or electrostatic forces in the manner described above. The final fill can then be sintered in the manner described above. The final fill can be planarized at the first and second surfaces 22 and 24 before and/or after the final fill is sintered as described above. If desired, the polymer can be introduced into pores of the final fill under an isostatic or hard press as described above. Alternatively, metal can be introduced into the pores of the final fill in any suitable manned described above. For example, the metal can be electroplated onto the final fill so as to occupy the at least one pore that is at least partially defined by the final fill. In this regard, the electrically conductive material 135 can refer to the bulk fill but not the final fill in some examples.

With continuing reference to FIG. 28, the polymer 137 can be introduced into the hole 26 either before the electrically conductive material 135 is planarized at either or both of the first and second surfaces 22 and 24, or after the electrically conductive material 135 is planarized at either or both of the first or second surfaces 22 and 24. In the examples whereby the electrically conductive material 135 is planarized after the electrically conductive material 135 has been sintered, planarization can substantially eliminate the pores at the first and second outer surfaces 22 and 24, thereby producing a hermetic via as described above. In these examples, the polymer 137 is introduced into the hole 26 prior to planarization. As shown in FIG. 28, the electrically conductive material 135 has been planarized at the first and second surfaces 22 and 24 prior to sintering the electrically conductive material.

After the polymer 137 has been introduced into the hole 26, the polymer 137 can be cured at any suitable temperature so as to harden the polymer 137. In some examples, the polymer 137 can be cured at approximately 300 degrees Celsius. Alternatively, the polymer can be cured at temperatures greater than or less than approximately 300 degrees Celsius. In some examples, the polymer 137 can be an adhesive. The polymer 137 can be a resin or can assume any suitable alternative form as desired. In some examples, the polymer 137 can be a thermoset polymer. In some examples, the polymer 137 can be an epoxy. In other examples, the polymer 137 can be a thermoplastic. The polymer 137 can be a silicone in some examples. In other examples, the polymer 137 can be an ester. In still other examples, the polymer 137 can be a polyimide. In one specific example, the polymer 137 can be an Ablebond® JM7000 die attach adhesive commercially available from Ablestik Laboratories, having a place of business in Rancho Dominguez, California, USA.

Once the polymer is cured, it is appreciated that residual polymer 137 can be disposed on either or both of the first and second surfaces 22 and 24. Thus, the residual polymer 137 can cover the electrically conductive material 135 at the first and second ends of the via. It can therefore be desirable to remove the residual polymer 137 from either or both of the first and second surfaces 22 and 24, thereby exposing the electrically conductive material 135 at either or both of the first and second ends of the via 34. In some examples, the residual suspension or residual polymer 137 can be removed by performing a chemical mechanical polishing (CMP) step to either or both of the first and second surfaces. For instance, as illustrated in FIG. 28, after the polymer 137 has been introduced into the hole 26 of the substrate 20 and cured, a quantity of the polymer 137 can be disposed on the electrically conductive material 135. As described above, the electrically conductive material 135 can be defined by the electrically conductive fill 35 described above. Alternatively, as will be described in more detail below, the electrically conductive material 135 can be defined by a thick film paste. The chemical mechanical polishing step can remove the residual polymer 137 so as to expose the underlying electrically conductive material 135 at each of the first and second ends of the substrate 20. Any suitable slurry can be chosen for the selective CMP removal of the polymer 137.

Because the polymer 137 occupies at least a portion up to all of at least one of the pores up to all of the pores that are at least partially defined by the electrically conductive material 135, the resulting via 34 can be hermetic. Alternatively or additionally, planarizing the electrically conductive material 135 at the first and second ends of the via 34 can also render the resulting via 34 hermetic. Thus, the combination of introducing the polymer into the pores and planarizing the electrically conductive material 135 can produce a via that is hermetic before and after subsequent processing, such as RDL processing.

Figure 26:
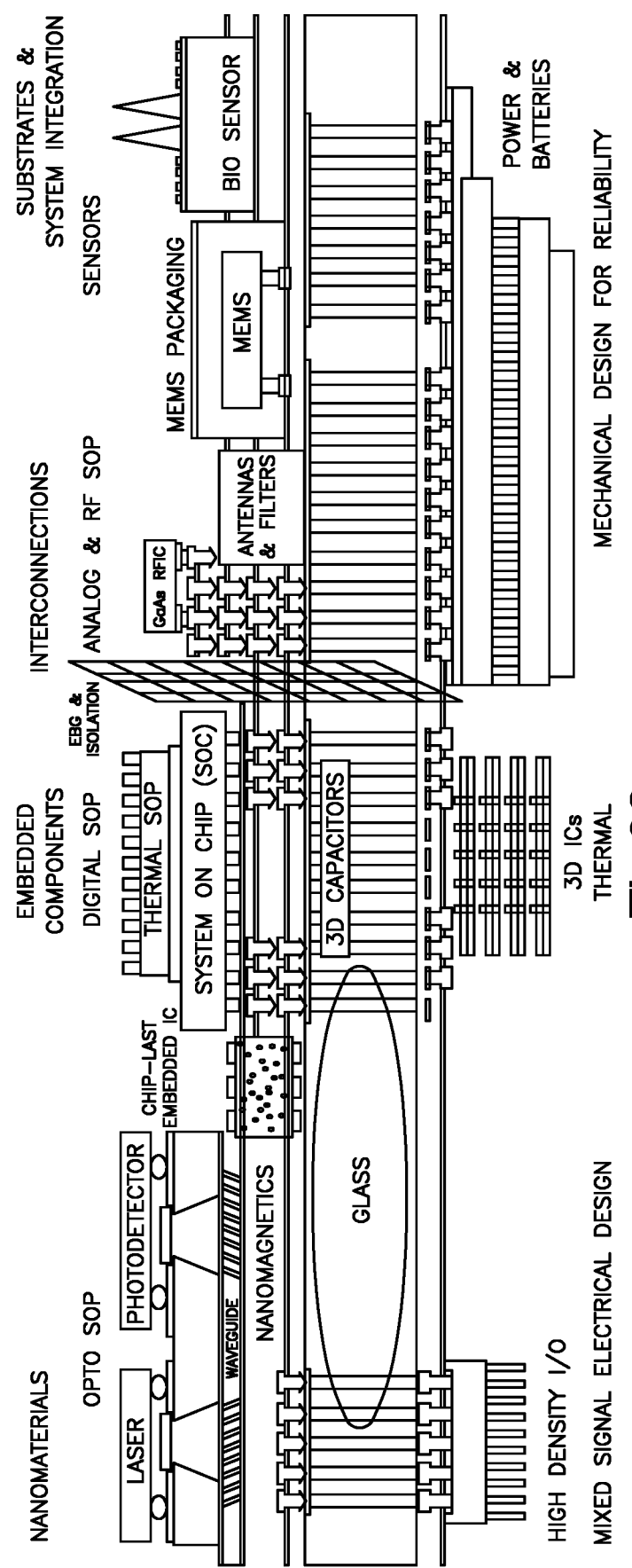
FIG. 26 is a schematic overview of an assembly of components configured to be mounted to an interposer of the type described herein.

FIG. 26 shows an overview of an exemplary assembly 500 of components discussed above and throughout, according to one aspect of the system and method disclosed herein. In this example, multiple devices can be mounted onto the interposer 21, and at the bottom are additional devices. The interposer 21 can have several sections of through-glass or through-silicon vias of the type described above. Additional interposer or other types of layers are shown in green as part of the assembly structure of the devices. These layers may be used for additional interconnections. Some interconnections may be made on either the top or the bottom of the interposer 21. In one example, an application specific integrated circuit can be mounted to the substrate 20 so as to at least partially define a die package. In another example, a silicon photonics ship can be mounted onto the substrate so as to be in optical communication with the substrate 20. In yet another example, a transceiver can be mounted onto the glass substrate so as to be in electrical communication with the electrically conductive material.

It should be appreciated that the illustrations and discussions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should be further appreciated that the various alternative embodiments described above with respect to one illustrated embodiment can apply to all embodiments as described herein, unless otherwise indicated.

The invention claimed is:

1. An electrical component comprising:
   a substrate defining a first surface and a second surface opposite the first surface, and an internal surface that defines a hole that extends from the first surface to the second surface; and
   an electrically conductive coating that extends along the internal surface of the substrate, the coating including a metallic adhesion layer deposited onto the internal surface, and a second metallic layer that bonds to the adhesion layer; and
   a hardened electrically nonconductive polymer disposed in the hole.

2. The electrical component of claim 1, wherein the substrate is a glass substrate.

3. The electrical component of claim 1, further comprising sintered metallic particles disposed in the hole.

4. The electrical component of claim 3, wherein a majority of the particles are substantially non-densification sintered.

5. The electrical component of claim 3, wherein the particles are forced into the hole under a force that is defined by one of a pressure differential, a centrifugal force, and an electrostatic force.

6. The electrical component of claim 1, further comprising a plurality of flake particles disposed in the hole.

7. The electrical component of claim 1, wherein the electrically conductive coating bonds an electrically conductive fill to the internal surface.

8. The electrical component of claim 7, wherein the electrically conductive coating bonds a final fill to the internal surface.

9. The electrical component of claim 8, the second metallic layer that bonds to both the adhesion layer and the final fill.

10. The electrical component of claim 1, wherein the second metallic layer is a transition metal.

11. The electrical component of claim 10, wherein the second metallic layer is a silver miscible metal.

12. The electrical component of claim 1, wherein the coating is applied to the internal surface via a vapor deposition process.

13. The electrical component of claim 12, wherein the vapor deposition is a physical vapor deposition (PVD).

14. The electrical component of claim 1, wherein the first and second surfaces of the substrate are opposite each other along a direction, and the substrate defines a trench having a base that defines a first portion of the first surface that is offset from a second portion of the first surface along the direction toward the second surface.

15. An electrical component comprising:
a glass or sapphire substrate defining a first surface and a second surface opposite the first surface, and an internal surface that defines a hole that extends from the first surface to the second surface;
a transition metal coated onto each of the internal surface of the substrate, the first surface, and the second surface; and
an electrically conductive fill including electrically conductive metal particles that extend in the hole substantially from the first surface substantially to the second surface so as to define an electrically conductive via, whereby the electrically conductive fill defines an electrically conductive path substantially from the first surface substantially to the second surface,
wherein the transition metal bonds to each of the internal surface, the first surface, and the second surface.

16. The electrical component of claim 15, wherein the transition metal is coated onto the internal surface and each of the first and second surfaces prior to introducing the electrically conductive fill into the hole.

17. The electrical component of claim 15, wherein the transition metal comprises titanium and tungsten.

18. The electrical component of claim 17, wherein the transition metal comprises a titanium-tungsten alloy.

19. The electrical component of claim 18, further comprising a redistribution layer that includes a copper layer deposited on the transition metal.

20. The electrical component of claim 15, further comprising a redistribution layer that includes a copper layer deposited on the transition metal.

21. The electrical component of claim 15, further comprising nonporous end caps that hermetically seal the hole.

22. The electrical component of claim 1, further comprising nonporous end caps that hermetically seal the hole.

* * * * *